United States Patent
Zhang et al.

(10) Patent No.: US 10,396,036 B2
(45) Date of Patent: Aug. 27, 2019

(54) RLINK-GROUND SHIELDING ATTACHMENT STRUCTURES AND SHADOW VOIDING FOR DATA SIGNAL CONTACTS OF PACKAGE DEVICES; VERTICAL GROUND SHIELDING STRUCTURES AND SHIELD FENCING OF VERTICAL DATA SIGNAL INTERCONNECTS OF PACKAGE DEVICES; AND GROUND SHIELDING FOR ELECTRO OPTICAL MODULE CONNECTOR DATA SIGNAL CONTACTS AND CONTACT PINS OF PACKAGE DEVICES

(71) Applicant: Intel Corporation, Santa Clara, CA (US)

(72) Inventors: Yu Amos Zhang, Santa Clara, CA (US); Zhiguo Qian, Chandler, AZ (US); Kemal Aygun, Chandler, AZ (US); Yidnekachew S. Mekonnen, Chandler, AZ (US); Gregorio R. Murtagian, Phoenix, AZ (US); Sanka Ganesan, Chandler, AZ (US); Eduard Roytman, Newton Centre, MA (US); Jeff C. Morriss, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/774,257

(22) PCT Filed: Dec. 26, 2015

(86) PCT No.: PCT/US2015/000388
§ 371 (c)(1),
(2) Date: May 7, 2018

(87) PCT Pub. No.: WO2017/111830
PCT Pub. Date: Jun. 29, 2017

(65) Prior Publication Data
US 2018/0331043 A1    Nov. 15, 2018

(51) Int. Cl.
*H01L 23/48* (2006.01)
*H01L 23/538* (2006.01)
(Continued)

(52) U.S. Cl.
CPC .......... *H01L 23/5384* (2013.01); *H01L 23/48* (2013.01); *H01L 23/49827* (2013.01);
(Continued)

(58) Field of Classification Search
CPC .......... H01L 23/5384; H01L 23/49827; H01L 23/66; H01L 23/552; H01L 23/48;
(Continued)

(56) References Cited

U.S. PATENT DOCUMENTS 7,038,319 B2   5/2006  Buffet et al.
2008/0248693 A1  10/2008  Winings et al.
(Continued)

FOREIGN PATENT DOCUMENTS

JP    2005-072581    3/2005

OTHER PUBLICATIONS

International Preliminary Report on Patentablity for International Patent Application No. PCT/US2015/000388, dated Jul. 5, 2018, 8 pages.
(Continued)

*Primary Examiner* — Kyoung Lee
(74) *Attorney, Agent, or Firm* — Schwabe, Williamson & Wyatt, P.C.

(57) ABSTRACT

A vertically ground isolated package device can include (1) ground shielding attachment structures and shadow voiding for data signal contacts; (2) vertical ground shielding struc-
(Continued)

tures and shield fencing of vertical data signal interconnects; and (3) ground shielding for an electro-optical module connector of the package device. These reduce cross talk between data signal contacts, attachment structures and vertical "signal" interconnects of the package device. The ground shielding attachment structures may include patterns of solder bumps and/or surface contacts. The shadow voiding may be surrounding voids in ground planes that are larger than the data signal solder bumps. The vertical ground shielding structures may include patterns of ground shield interconnects between the vertical data signal interconnects: The shield fencing may include patterns of ground plated through holes (PTH) and micro-vias (uVia). The ground shielding for the electro-optical module may include patterns of ground isolation shielding attachments and contacts.

20 Claims, 16 Drawing Sheets

(51) Int. Cl.
*H01L 23/552* (2006.01)
*H01L 23/66* (2006.01)
*H01L 23/498* (2006.01)
*H01L 23/50* (2006.01)
*H01L 25/065* (2006.01)

(52) U.S. Cl.
CPC ............ *H01L 23/552* (2013.01); *H01L 23/66* (2013.01); *H01L 23/49838* (2013.01); *H01L 23/50* (2013.01); *H01L 25/0655* (2013.01); *H01L 2224/131* (2013.01); *H01L 2224/16227* (2013.01); *H01L 2924/14* (2013.01); *H01L 2924/1432* (2013.01); *H01L 2924/1433* (2013.01); *H01L 2924/15192* (2013.01); *H01L 2924/15311* (2013.01); *H01L 2924/3025* (2013.01)

(58) Field of Classification Search
CPC ............. H01L 23/50; H01L 2924/3025; H01L 2924/1433; H01L 2924/1432; H01L 2924/14; H01L 2224/16227; H01L 2224/131; H01L 25/0655; H01L 23/49838; H01L 2924/15192; H01L 2924/15311
See application file for complete search history.

(56) References Cited

U.S. PATENT DOCUMENTS

| | | |
|---|---|---|
| 2011/0193233 A1 | 8/2011 | Jiang et al. |
| 2013/0087918 A1 | 4/2013 | Weekly et al. |
| 2015/0145132 A1* | 5/2015 | Ramakrishnan ........ H01L 23/50 257/738 |

OTHER PUBLICATIONS

International Search Report and Written Opinion for International Patent Application No. PCT/US2015/000388 dated Aug. 31, 2016, 13 pgs.

* cited by examiner

RLINK-GROUND SHIELDING ATTACHMENT STRUCTURES AND SHADOW VOIDING FOR DATA SIGNAL CONTACTS OF PACKAGE DEVICES; VERTICAL GROUND SHIELDING STRUCTURES AND SHIELD FENCING OF VERTICAL DATA SIGNAL INTERCONNECTS OF PACKAGE DEVICES; AND GROUND SHIELDING FOR ELECTRO OPTICAL MODULE CONNECTOR DATA SIGNAL CONTACTS AND CONTACT PINS OF PACKAGE DEVICES

CROSS-REFERENCE TO RELATED APPLICATION

This patent application is a U.S. National Phase Application under 35 U.S.C. § 371 of International Application No. PCT/US2015/000388, filed Dec. 26, 2015, entitled "RLINK-GROUND SHIELDING ATTACHMENT STRUCTURES AND SHADOW VOIDING FOR DATA SIGNAL CONTACTS OF PACKAGE DEVICES; VERTICAL GROUND SHIELDING STRUCTURES AND SHIELD FENCING OF VERTICAL DATA SIGNAL INTERCONNECTS OF PACKAGE DEVICES; AND GROUND SHIELDING FOR ELECTRO OPTICAL MODULE CONNECTOR DATA SIGNAL CONTACTS AND CONTACT PINS OF PACKAGE DEVICES," which designates the United States of America, the entire disclosure of which is hereby incorporated by reference in its entirety and for all purposes.

BACKGROUND

Field

Embodiments of the invention are related in general, to semiconductor device packaging and, in particular, to substrate packages and printed circuit board (PCB) substrates upon which an integrated circuit (IC) chip may be attached, and methods for their manufacture. Such a substrate package device may have vertical data signal transmission interconnects extending through vertical levels of a package device.

Description of Related Art

Integrated circuit (IC) chips (e.g., "chips", "dies", "ICs" or "IC chips"), such as microprocessors, coprocessors, graphics processors and other microelectronic devices often use semiconductor package devices ("packages") to physically and/or electronically attach the IC chip to a circuit board, such as a motherboard (or motherboard interface). The IC chip (e.g., "die") is typically mounted within a microelectronic substrate package or package device that, among other functions, enables electrical connections between the die and a socket, a motherboard, or another next-level component. Some examples of such package devices are substrate packages, interposers, and printed circuit board (PCB) substrates upon which integrated circuit (IC) chips or other package devices may be attached.

There is a need in the field for an inexpensive and high throughput process for manufacturing such package devices. In addition, the process could result in a high package device yield and a package device of high mechanical stability. Also needed in the field, is a package device having better components for providing stable and clean power, ground, and high frequency transmit and receive data signals between its top surface and other components of or attached to the package device, such as from between different vertical locations of vertical data signal transmission interconnects extending through vertical levels of a package device.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1A:
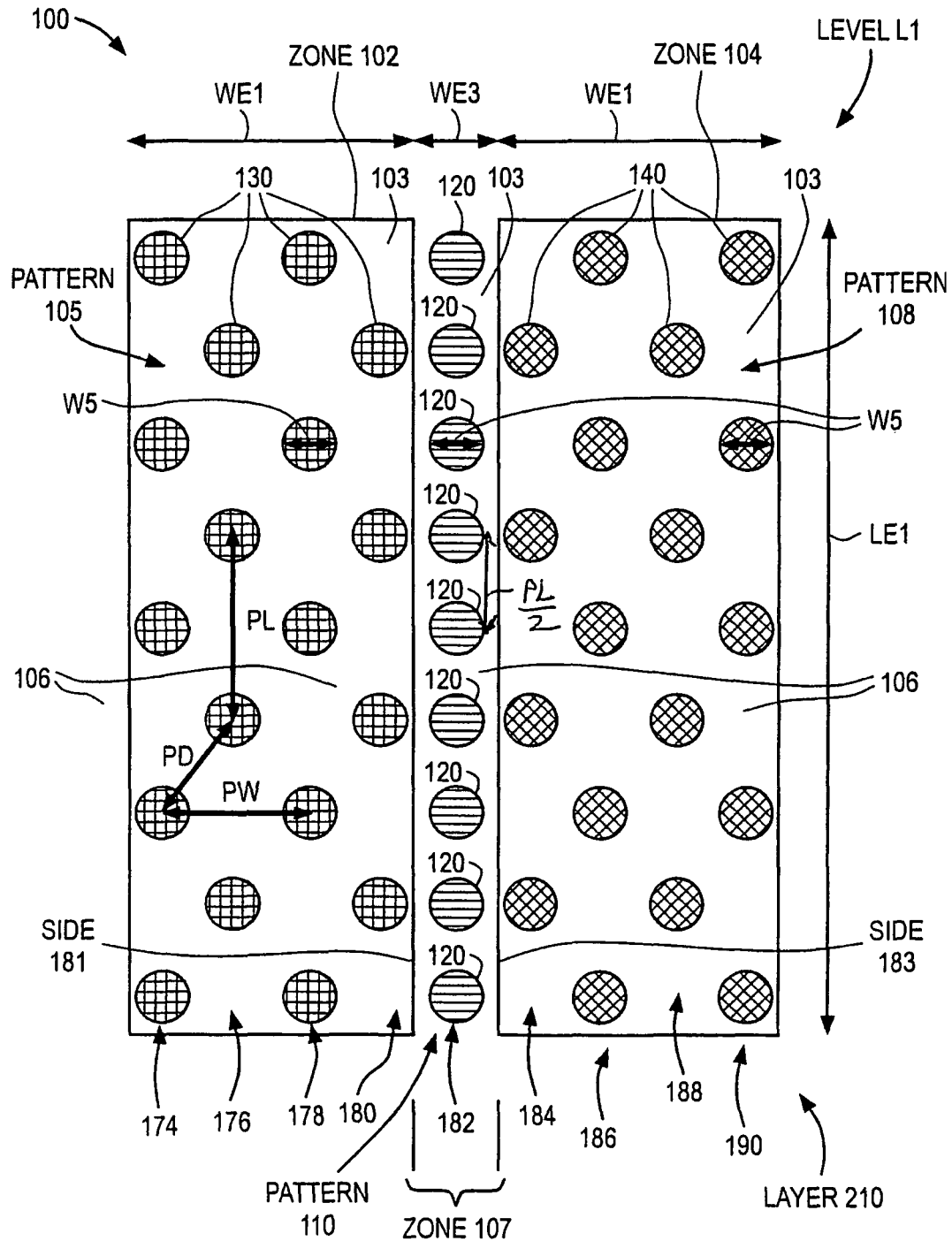
FIG. 1A is a schematic top perspective view of a semiconductor package device upon which at least one integrated circuit (IC) chip (e.g., "die") or other package device may be attached.

Several embodiments of the invention with reference to the appended drawings are now explained. Whenever the shapes, relative positions and other aspects of the parts described in the embodiments are not clearly defined, the scope of embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

As integrated circuit (IC) chip or die sizes shrink and interconnect densities increase, physical and electrical connections require better components for providing stable and clean high frequency transmit and receive data signals between different vertical locations of, or a vertical length of, vertical data signal transmission interconnects extending through vertical levels of one package device or two physically attached package devices upon which the IC chip is mounted or is communicating the data signals. Some examples of such package devices are one (or two physically attached) of the following: substrate packages, interposers (e.g., silicon interposers), silicon bridges, organic interposers (e.g., or technology thereof), and printed circuit board (PCB) substrates upon or onto which integrated circuit (IC) chips or other package devices may be attached.

In some cases, an IC chip may be mounted within a package device, such as for "flip chip" bonding or packaging. In some cases, the IC chip may be mounted on one package device, which is also physically and electronically connected to another package device or IC chip, so that the package device can provide data signal transfer between IC chip and other package device, or between the two IC chips. In many cases, any of the package devices must route hundreds or even thousands of high-frequency data signals between the IC chip(s) and/or other package devices.

According to some embodiments, it is possible for a vertically ground isolated package device to provide higher frequency and more accurate data signal transfer between an IC chip mounted on a top interconnect level of the package device and (1) lower levels of the package device, (2) a next-level component of the package device, and/or (3) a next-level component or another package device mounted to the bottom of the package device, by including vertical ground isolation structures (e.g., of conductor material) for vertical data signal interconnects of package devices that reduce (e.g., improves or mitigates) vertical data signal interconnect crosstalk, signal type cluster-to-cluster crosstalk and in-cluster signal type crosstalk. Such a package may be described as a "vertically ground isolated package device" (e.g., devices, systems and processes for forming).

In some embodiments, the vertical ground isolation structures may include ground shielding attachment structures for different types of data signal surface contacts of the top interconnect level of vertical data signal interconnects of package devices. The ground shielding attachment structures may include solid conductive material ground isolation shielding attachments such as solder balls or ball grid arrays (BGA) and/or solid conductive material ground isolation shielding surface contacts for the isolation attachments. The ground shielding attachment structures may be located or disposed beside and between the different types of data signal surface contacts that are spread over an area of the top interconnect level of a package device. The different types of data signal surface contacts may include "upper" transmit and receive data signal contacts of a die-bump field (e.g., zone or cluster) or a first level die bump design for soldering to another device; and the ground shielding attachment structures may reduce signal type cluster-to-cluster crosstalk by being between and electrically shielding separate fields of the upper transmit and receive data signal contacts. In some cases, there may be additional lower levels of the package (below the first level) with additional vertical ground isolation structures as described herein (e.g., see FIGS. 5A-9).

In some cases, the top interconnect level may be an upper (e.g., top or first) interconnect layer with upper (e.g., top or first) level ground contacts, upper level (e.g., top or first) data signal contacts formed over and connected to via contacts or traces of a lower layer of the same interconnect level.

In some cases, the ground shielding attachment structures may provide a better component for the physical and electrical connections between an IC chip or other package device which is mounted upon or to the vertically ground isolated package device. In some cases, it may increase in the stability and cleanliness of ground, and high frequency transmit and receive data signals transmitted between the data signal contacts on the top surfaces of the package and other components of or attached to the package that are electrically connected to the data signal contacts on the top surface through via contacts to lower level contacts or traces of the package.

In some cases, the data signal contacts, via contacts, and lower level contacts are part of the vertical data signal interconnects of the package device. In some cases, the ground shielding attachment structures may increase the usable frequency of transmit and receive data signals transmitted between the data signal contacts on the top surfaces of the package and other components of or attached to the package, as compared to a package not having the structures. Such an increased frequency may include data signals having a speed of between 7 and 25 gigatransfers per second (GT/s). In some cases, GT/s may refer to a number of operations (e.g., transmission of digital data such as the data signal herein) transferring data that occur in each second in some given data transfer channel such as a channel provided by zone 102 or 104; or may refer to a sample rate, i.e. the number of data samples captured per second, each sample normally occurring at the clock edge. 1 GT/s is $10^9$ or one billion transfers per second.

In some cases, the ground shielding attachment structures improve (e.g., reduce) crosstalk (e.g., as compared to the same package but without any of the structures) from very low frequency transfer such as from a speed of 50 megatransfers per second (MT/s) to greater than 40 GT/s (or up to between 40 and 50 GT/s).

FIG. 1A is a schematic top perspective view of a semiconductor package device upon which at least one integrated circuit (IC) chip (e.g., "die") or other package device may be attached. FIG. 1A shows package device 100 having a first interconnect level L1 (with the number "1", not the letter "l") with upper layer 210 having one row of upper (e.g., top or first) layer ground isolation contacts 120, having upper layer receive data signal contacts 130 and having upper layer transmit data signal contacts 140 surrounded by dielectric layer 103 such as an electrically non-conductive or insulating material. Level L1 (or upper layer 210) may be considered to "top" layer such as a top, topmost or exposed layer (e.g., a final build-up (BU) layer, BGA, LGA, or die-backend-like layer) to which an IC chip (e.g., such as microprocessor, coprocessor, graphics processor, memory chip, modem chip, fabric controller chip, network interface chip, switch chip, accelerator chip, field programmable gate array (FPGA) chip, application-specific integrated circuit (ASIC) chip device, communication output signal chip device, or other microelectronic chip devices), a socket, an interposer, a motherboard, another package device or another next-level component will be mounted or directly attached.

In some cases, device 100 may represent a substrate package, an interposer, a printed circuit board (PCB), a PCB an interposer, a "package", a package device, a socket, an interposer, a motherboard, or another substrate upon which integrated circuit (IC) chips or other package devices may be attached (e.g., such as microprocessor, coprocessor, graphics processor, memory chip, modem chip, fabric controller chip, network, interface chip, switch chip, accelerator chip, field programmable gate array (FPGA) chip, application-specific integrated circuit (ASIC) chip device, communication output signal chip device, or other microelectronic chip devices).

FIG. 1A shows package device 100 having top surface 106, such as a surface of dielectric 103, upon or in which are formed (e.g., disposed) one row of grounding contacts 120, receive signal contacts 130 and transmit contacts 140. Ground contacts 120 are shown in locations along length LE1 in fifth row 182 of zone 107.

Receive signal contacts 130 are shown having pattern 105 in zone 102. Zone 102 has width WE1 and length LE1. Pattern 105 may include having receive signal contacts 130 in first row 174, second row 176, third row 178, and fourth row 180 that are horizontally equidistant from each other in zone 102. Pattern 105 may include having the receive signal contacts 130 in rows 176 and 180 lengthwise offset (e.g., along LE1) below those of rows 174 and 178 by one half pitch length PL. In some cases, pattern 105 may include having contacts 130 in rows 176 and 180 lengthwise offset (e.g., along LE1) to be lengthwise between those of rows 174 and 178 along pitch length PL.

In some cases, zone 102 may be described as a receive or "RX" signal cluster formed in a 4-row deep die-bump pattern 105. In some cases, zone 102 and pattern 105 includes only contacts 130, but no other contacts (e.g., none of contacts 120 or 140). Zone 102 and pattern 105 is shown having 18 vertical data signal interconnect stacks, each with exposed data signal upper contact 130 that may be formed over or onto a data signal via contact of level L1. It can be appreciated that there may be more or fewer of stacks and contacts 130. In some cases there may be 20 stacks and contacts 130 in zone 102. In some cases 8, 10, 12, 16, 32 or 64.

Transmit signal contacts 140 are shown having pattern 108 in zone 104. Zone 104 has width WE1 and length LE1. Pattern 108 may include having transmit signal contacts 140 in sixth row 184, seventh row 186, eighth row 188, and ninth row 190 that are horizontally equidistant from each other in zone 104. Pattern 108 may include having the transmit signal contacts 140 in rows 186 and 190 lengthwise offset (e.g., along LE1) below those of rows 184 and 188 by one half pitch length PL. In some cases, pattern 108 may include having contacts 140 in rows 186 and 190 lengthwise offset (e.g., along LE1) to be lengthwise between those of rows 184 and 188 along pitch length PL.

In some cases, zone 104 may be described as a receive or "TX" signal cluster formed in a 4-row deep die-bump pattern 108. In some cases, zone 104 and pattern 108 includes only contacts 140, but no other contacts (e.g., none of contacts 120 or 130). Zone 104 and pattern 108 is shown having 18 vertical data signal interconnect stacks, each with exposed data signal upper contact 140 that may be formed over or onto a data signal via contact of level L1. It can be appreciated that there may be more or fewer of stacks and contacts 140 in zone 104 and pattern 108. In some cases there may be 20 stacks and contacts 140. In some cases 8, 10, 12, 16, 32 or 64.

Ground signal contacts 120 are shown having pattern 110 in zone 107. Zone 107 has width WE3 and length LE1. Pattern 110 may include having ground signal contacts 120 in fifth row 182 in zone 107. In some cases, zone 107 may be described as a ground signal cluster formed in a 1-row deep die-bump pattern 110. In some cases, zone 107 and pattern 110 (or zone 109 and pattern 111 of FIGS. 1B and 2B) includes only contacts 120, but no other contacts (e.g., none of contacts 130 or 140). Pattern 110 may include having one of contacts 120 (one of row 182) located directly between (e.g., side by side, horizontally adjacent, or widthwise adjacent with respect to width WE3 of FIGS. 1A-2A) each of contacts 130 and a widthwise adjacent one of contacts 140 (e.g., side by side, or widthwise adjacent with respect to width WE3 of FIGS. 1A-2A). Zone 107 and pattern 110 may have 9 vertical ground isolation interconnect stacks, each with an ground isolation upper contact 120 that may be formed over or onto a ground isolation via contact of level L1. It can be appreciated that there may be more or fewer than 9 of stacks and contacts 120 in zone 107 and pattern 110. In some cases there may be 10 stacks and contacts 120. In some cases 4, 5, 6, 8, 16 or 32.

Zone 102 may be described as a four row wide zone of receive contacts, such as forming pattern 105. Zone 104 may be described as a four row wide zone of transmit contacts, such as forming pattern 108. Row 182 may be described as a one row wide ground isolation zone 107 located or formed between zone 102 and zone 104, such as forming pattern 110. Zone 107 may have side 181 widthwise adjacent to (e.g., along width WE3) or facing zone 102 and opposite side 183 (e.g., opposite from side 181) widthwise adjacent to (e.g., along width WE3) or facing zone 104. It can be appreciated that although zone 102 and 104 are shown with the same width and length, they may have different widths and/or lengths.

Figure 2A:
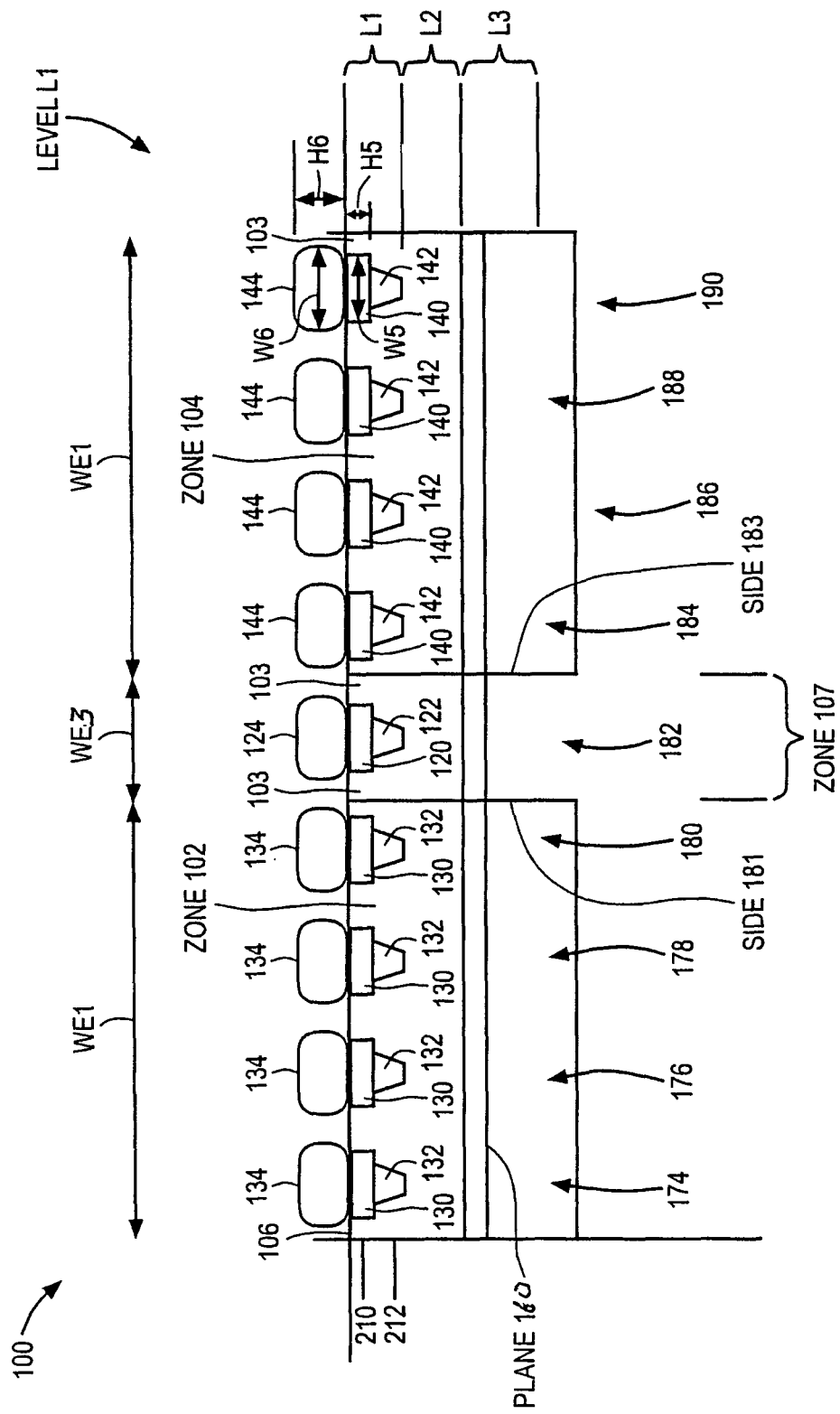
FIG. 2A is a schematic cross-sectional side view of the package of FIG. 1A showing solder bumps formed on zones of upper layer ground isolation contacts and data signal contacts.

FIG. 2A is a schematic cross-sectional side view of the package of FIG. 1A showing solder bumps formed on upper (e.g., top or first) layer ground isolation contacts 120 of zone 107, upper layer receive data signal contacts 130 and upper layer transmit data signal contacts 140. In level L1 (and similarly for some other levels) device 100 has contacts 130 of zone 102 formed onto or physically attached to a top surface of via contacts 132, ground isolation contacts 120 of zone 107 formed onto or physically attached to a top surface of via contacts 122, and contacts 140 of zone 104 formed onto or physically attached to a top surface of via contacts 142.

FIG. 2A shows top or topmost (e.g., first level) interconnect level L1 (having top layer 210 and bottom layer 212) of package device 100 formed over second level interconnect level L2, which is formed over third interconnect level L3, which is formed over other interconnect levels of the device. Device 100 layer 210 has dielectric 103, ground isolation contacts 120 of zone 107, contacts 130 of zone 102 and contacts 140 of zone 104.

Some embodiments of device 100 (e.g., FIG. 2A) have solder bumps 134 formed onto or physically attached to a top surface of contacts 130, solder bump 124 formed onto or physically attached to a top surface of contacts 120, and solder bumps 144 formed onto or physically attached to a top surface of contacts 140 of layer 210. Some embodiments of device 100 may not have (e.g., not yet have) solder bumps 134 formed onto or physically attached to a top surface of contacts 130, solder bump 124 formed onto or physically attached to a top surface of contacts 120, or solder bumps 144 formed onto or physically attached to a top surface of contacts 140 of layer 210.

The exact size of WE1, WE3, WE4 and LE1 may depend on number of contacts employed within each zone (e.g., number of contacts 130 in zone 102, the number of contact 140 in zone 104 and number of contacts employed within zone 107 (or 109)) (e.g., see FIGS. 1A-B and 3A-B). In some cases, the size of WE1, WE3, WE4 and LE1 may also depend on the number of zones 102, 104, and 107 (or 109) on a package device. In some cases, the number of zones 102, 104, and 107 (or 109) will be where each of those zones is part of a "unicel" or "unit cell" communication area (e.g., including zones 102, 104 and 107 (or 109) and there are between 2-20 such unicel areas on the surface of the package (and thus between 2-20 of each of zones 102, 104 and 107 (or 109)).

In come cases, the size of WE1, WE3, WE4 and LE1 may also depend on the technology capability of forming the contacts and package. In some cases, in general, the size of WE1 and LE1 can span from around a hundred to a couple of hundred micrometers (xE-6 meter—"um" or "microns"). In some cases, LE1 is between 80 and 250 um. In some cases it is between 50 and 300 um. In some cases, WE1 is between 70 and 150 um. In some cases it is between 40 and 200 um. In some cases, in general, the size of WE3 can span from around tens of microns to more than a hundred um. In some cases, WE3 is between 15 and 30 um. In some cases it is between 8 and 40 um. In some cases, the size of WE1, WE3, WE4 and LE1 can be scaled with or depend on the manufacturing or processing pitch (e.g., of the contacts).

Contacts 120, 130 and 140 that may be formed along, or under top surface 106. Contacts 120, 130 and 140 may have height H5 (e.g., a thickness extending into the page) and width W5 (e.g., see FIGS. 2A-B). In some cases height H5 may be approximately 15 micrometers (15×E-6 meter—"um") and width W5 is between 75 and 85 um. In some cases, height H5 is between 10 and 20 micrometers (um). In some cases, it is between 5 and 30 micrometers. In some cases, width W5 is between 70 and 90 micrometers (um). In some cases, it is between 60 and 110 micrometers. It can be appreciated that height H5 may be an appropriate height of a conductive material contacts formed on a top layer of or within a package device, that is less than or greater than those mentioned above.

In some cases, upper contacts 120, 130 and 140 are formed (e.g., disposed) having top surfaces that are part of or horizontally planar with surface 106, such as by being formed with or as part of layer 210 having conductor (1) that includes upper contacts 120, 130 and 140 of level L1; and (2) between which dielectric 103 of layer 210 exists (having top surface 106). In some cases, upper contacts 120, 130 and 140 are formed (e.g., disposed) above top surface 106, such as where the layer of conductor is formed on or over a layer of dielectric or other material. In some cases, upper contacts 120, 130 and 140 are is formed (e.g., disposed) under top surface 106, such as when a further layer of dielectric, solder resist, or other material is formed on level L1, over upper contacts 120, 130 and 140.

Figure 1B:
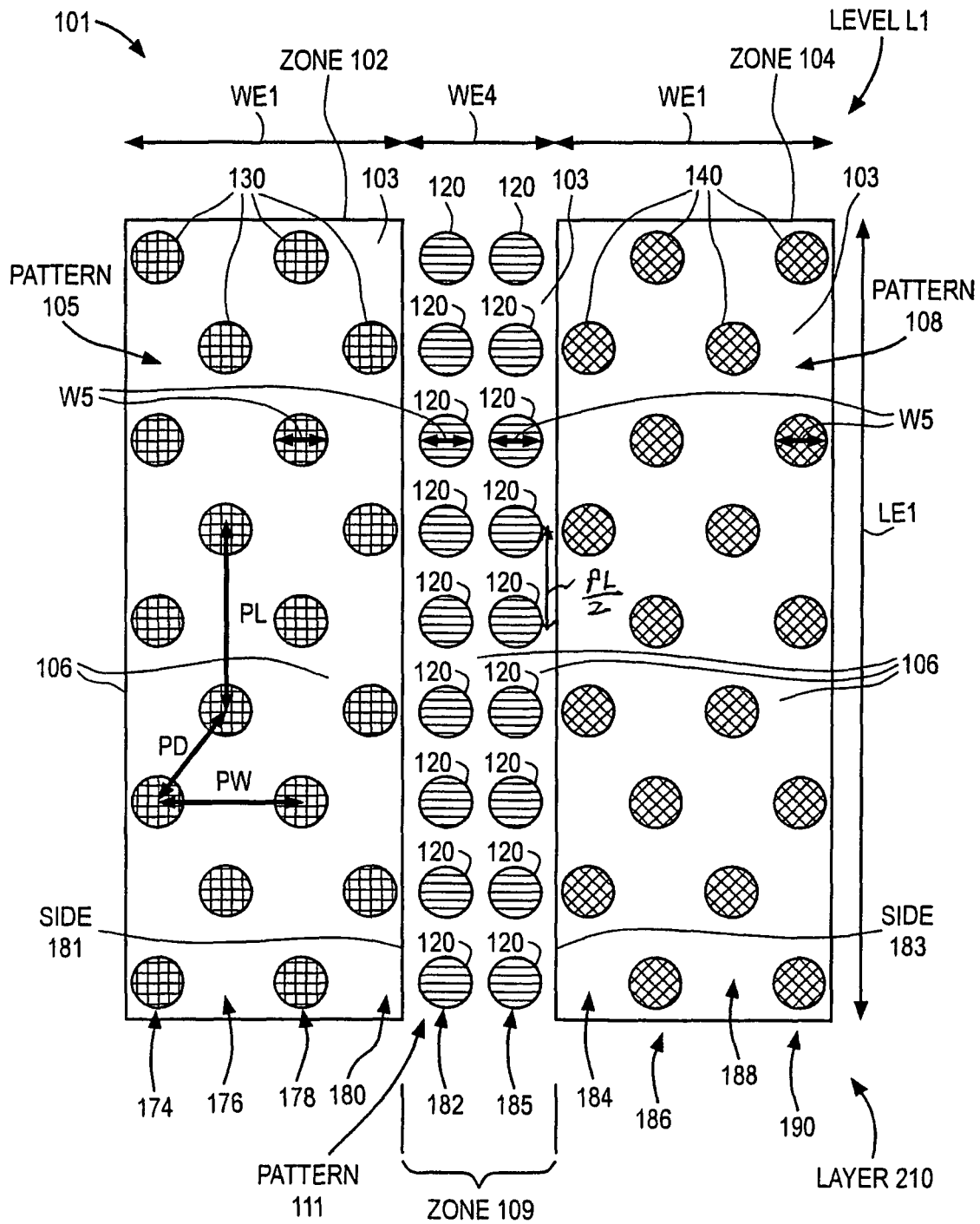
FIG. 1B is a schematic top perspective view of a semiconductor package device upon which at least one integrated circuit (IC) chip (e.g., "die") or other package device may be attached.

FIG. 1B is a schematic top perspective view of a semiconductor package device upon which at least one integrated circuit (IC) chip (e.g., "die") or other package device may be attached. FIG. 1B shows package device 101 having a first interconnect level L1 with upper layer 210 having two rows of upper (e.g., top or first) layer ground isolation contacts 120, having upper layer receive data signal contacts 130 and having upper layer transmit data signal contacts 140.

Ground signal contacts 120 are shown having pattern 111 in zone 109. Zone 109 has width WE4 and length LE1. Width WE4 may be twice as wide as width WE3. In some cases, zone 109 may be described as a ground signal cluster formed in a 2-row deep die-bump pattern 111. In some cases, zone 109 and pattern 111 includes only contacts 120, but no other contacts (e.g., none of contacts 130 or 140). Pattern 111 may include having two of contacts 120 (one of each of rows 182 and 185) located directly between (e.g., side by side, horizontally adjacent, or widthwise adjacent with respect to width WE4) each of contacts 130 and a widthwise adjacent one of contacts 140 (e.g., side by side, or widthwise adjacent with respect to width WE4 of FIGS. 1B-2B). Zone 109 and pattern 111 may have 18 vertical ground isolation interconnect stacks, each with an ground isolation upper contact 120 that may be formed over or onto a ground isolation via contact of level L1. It can be appreciated that there may be more or fewer than 18 of stacks and contacts 120 in zone 109 and pattern 111. In some cases there may be 20 stacks and contacts 120. In some cases 8, 10, 12, 16, 32 or 64.

More specifically, FIG. 1B shows package device 101 having top surface 106, such as a surface of dielectric, upon or in which are formed (e.g., disposed) two rows of grounding contacts 120 in locations along length LE1 in fifth and fifth' rows 182 and 185 of zone 109. Two of contacts 120 (one of each of rows 182 and 185) are located directly between (e.g., side by side; horizontally adjacent; or width adjacent with respect to width WE1 or WE4 of top view of FIG. 1B) each of contacts 130 and a horizontally adjacent one of contacts 140 (e.g., side by side; horizontally adjacent; or width adjacent with respect to width WE1 or WE4 of top view of FIG. 1B).

In FIG. 1B, level L1; contacts 120, 130, and 140; dielectric 103; rows 174-190, surface 106; width WE1 and length LE1 of device 101 may be similar to those of device 100 except there are two rows (rows 182 and 185) of contacts 120 and 122 in zone 109 having width WE4 instead of one row 182 of contacts 120 in zone 107 having width WE3.

Rows 182 and 185 may be described as a two row wide ground isolation zone 109 located or formed between zone 102 and zone 104, such as forming pattern 111. Zone 109 may have side 181 widthwise adjacent to (e.g., along width WE4) or facing zone 102 and opposite side 183 (e.g., opposite from side 181) widthwise adjacent to (e.g., along width WE4) or facing zone 104.

Figure 2B:
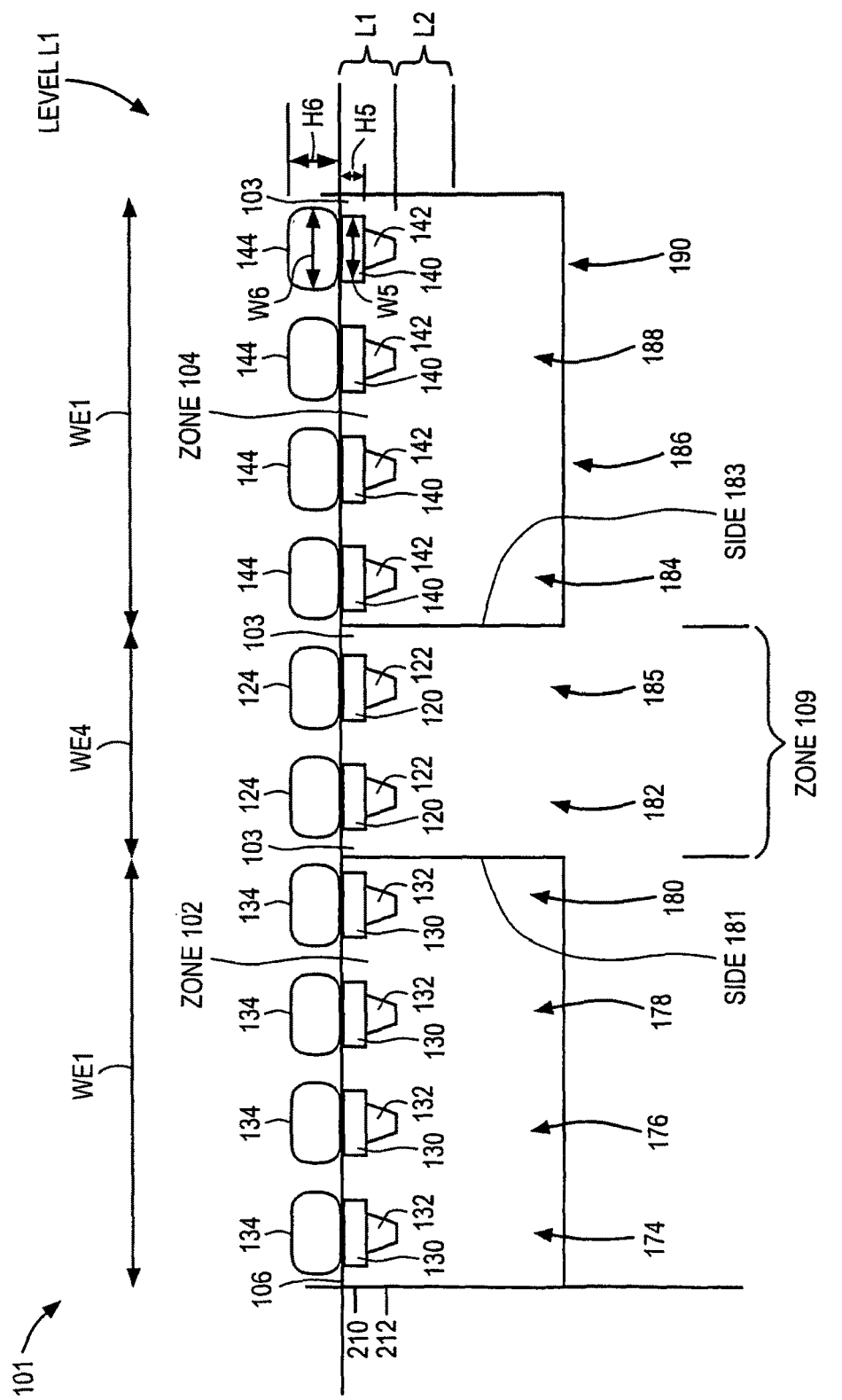
FIG. 2B is a schematic cross-sectional side view of the package of FIG. 1B showing solder bumps formed on zones of upper layer ground isolation contacts and data signal contacts.

FIG. 2B is a schematic cross-sectional side view of the package of FIG. 1B showing solder bumps formed on upper (e.g., top or first) layer ground isolation contacts 120 of zone 109, upper layer receive data signal contacts 130 and upper layer transmit data signal contacts 140. In level L1 (and similarly for some other levels) device 101 has contacts 130 of zone 102 formed onto or physically attached to a top surface of via contacts 132, ground isolation contacts 120 of zone 107 formed onto or physically attached to a top surface of via contacts 122, and contacts 140 of zone 104 formed onto or physically attached to a top surface of via contacts 142.

FIG. 2B shows package device 101 top or topmost (e.g., first level) interconnect level L1 having top layer 210 formed over or onto second level interconnect level L2. Device 101 layer 210 has dielectric 103, ground isolation contacts 120 of zone 109, contacts 130 of zone 102 and contacts 140 of zone 104.

Some embodiments of device 101 (e.g., FIG. 2B) have solder bumps 134 formed onto or physically attached to a top surface of contacts 130, solder bump 124 formed onto or physically attached to a top surface of contacts 120, and solder bumps 144 formed onto or physically attached to a top surface of contacts 140 of layer 210. Some embodiments of device 101 may not have (e.g., not yet have) solder bumps 134 formed onto or physically attached to a top surface of contacts 130, solder bump 124 formed onto or physically attached to a top surface of contacts 120, or solder bumps 144 formed onto or physically attached to a top surface of contacts 140 of layer 210.

In FIG. 2B, level L1; contacts 120, 130, and 140; via contacts 122, 132 and 142; dielectric 103; rows 174-190, surface 106; width WE1, length LE1 and height H5 of device 101 may be similar to those of device 100 except there are two rows (rows 182 and 185) of contacts 120 and 122 in zone 109 having width WE4 instead of one row 182 of contacts 120 in zone 107 having width WE3.

In some cases, each of rows 174-190 (e.g., of FIGS. 1A-2B) may be horizontally (e.g., widthwise) equidistant from each other along the direction of width WE1, and each of the contacts in each row may be vertically (e.g., lengthwise) equidistant from each other along length LE1.

In some cases, contacts 120 are first level L1 ground contacts located beside and between the first level first type of data signal contacts 130 and the first level second type of data signal contacts 140. Contacts 120 may be or include one (e.g., see FIG. 1A) or two (e.g., see FIG. 1B) rows of lengthwise adjacent (e.g., along length LE1), or top to bottom located, solid conductive material ground isolation shielding surface contacts, such as in zone 107 or 109, respectively. Contacts 120 (e.g., in zone 107 or 109) may be between or have side 181 adjacent (e.g., widthwise adjacent) to or facing zone 102 and opposite side 183 (e.g., opposite from side 181) adjacent (e.g., widthwise adjacent) to or facing zone 104.

Figure 3A:
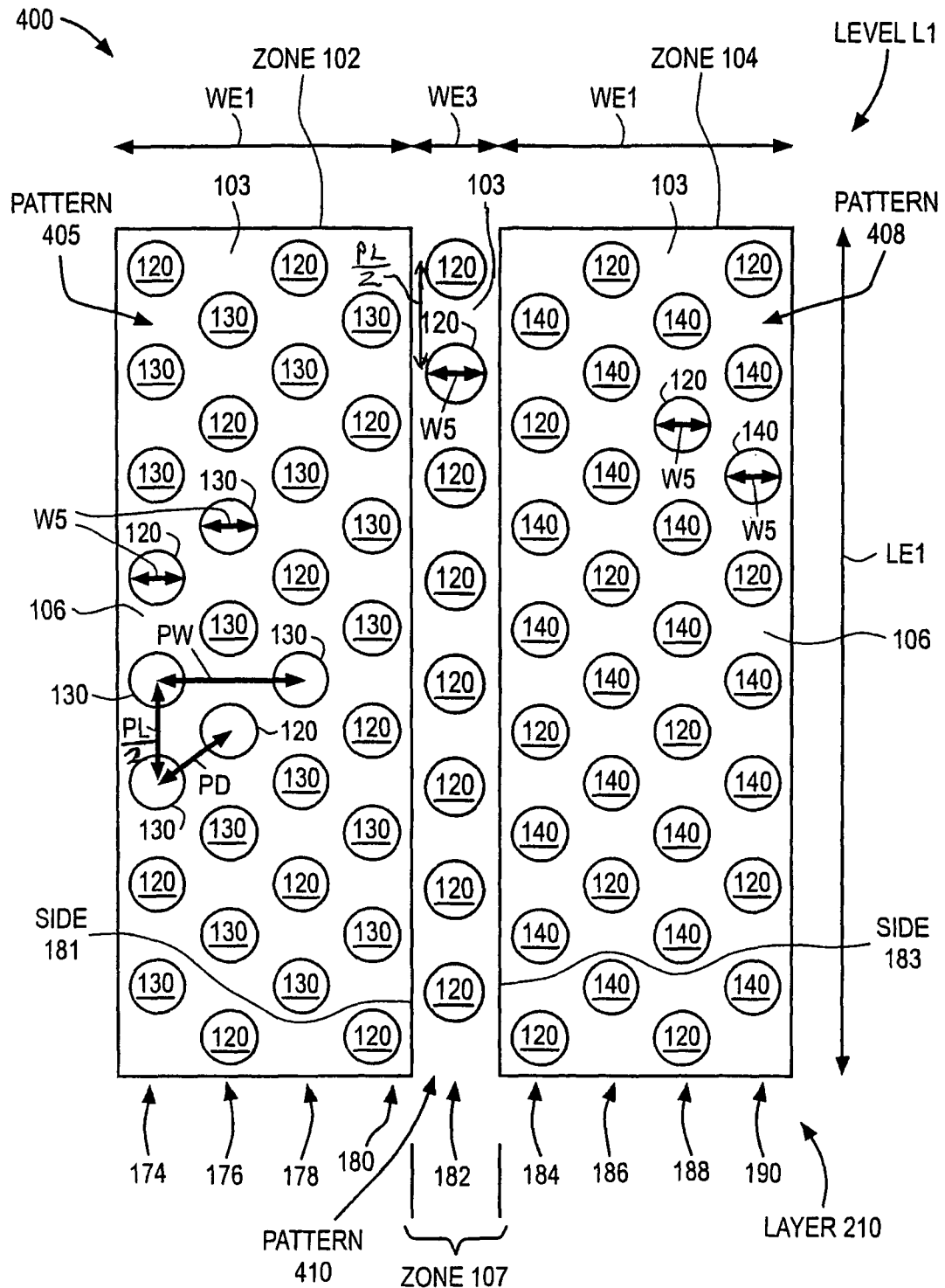
FIG. 3A is a schematic top perspective view of a semiconductor package device upon which at least one integrated circuit (IC) chip (e.g., "die") or other package device may be attached.

FIG. 3A is a schematic top perspective view of a semiconductor package device upon which at least one integrated circuit (IC) chip (e.g., "die") or other package device may be attached. FIG. 3A shows package device 400 having top surface 106, such as a surface of dielectric 103, upon or in which are formed (e.g., disposed) the grounding contacts 120, receive signal contacts 130 and transmit contacts 140. FIG. 3A shows package device 400 having a first interconnect level L1 with upper layer 210 having one row of upper (e.g., top or first) layer ground isolation contacts 120 forming shielding pattern 410 in zone 107, having upper layer receive data signal contacts 130 and additional isolation contacts 120 forming a shielding pattern 405 in zone 102, and having upper layer transmit data signal contacts 140 and additional isolation contacts 120 forming a shielding pattern 408 in zone 104. Due to having contacts 120 in rows of pattern 405, zone 102 (e.g., pattern 405) has contacts 120 and contacts 130 of FIG. 3A-6B with pitch length of PL/2 (e.g., half the pitch length of PL of zone 102 of FIG. 1A-2B). Due to having contacts 120 in rows of pattern 408, zone 104 (e.g., pattern 408) has contacts 120 and contacts 140 of FIG. 3A-6B with pitch length of PL/2 (e.g., half the pitch length of PL of zone 104 of FIG. 1A-2B). Contacts 120, 130 and 140 are surrounded by dielectric layer 103 such as an electrically non-conductive or insulating material.

Receive signal contacts 130 and contacts 120 are shown having pattern 405 in zone 102. Pattern 405 may include having receive signal contacts 130 and contacts 120 in first row 174, second row 176, third row 178, and fourth row 180 in zone 102. Pattern 405 may include having the receive signal contacts 130 and contacts 120 in rows 176 and 180 lengthwise offset (e.g., along LE1) below contacts of rows 174 and 178 by one half pitch length PL/2. In some cases, pattern 405 may include having contacts 130 and contacts 120 in rows 176 and 180 lengthwise offset (e.g., along LE1) to be lengthwise between those of rows 174 and 178 along pitch length PL.

In some cases, shielding pattern 405 includes alternating rows having the following patterns of contacts lengthwise adjacent along length LE1: first rows of contacts 120, 130, 130, 120, 130, 130, 120, 130 (e.g., in alternating rows 174 and 178) alternating with second rows of contacts 130, 120, 130, 130, 120, 130, 130, 120 which are rows that extend downwards from one half pitch length PL below the first rows (e.g., in alternating rows 176 and 180). As shown in FIG. 3A, this sequence may start at row 174 and continue through row 180. In some cases, shielding pattern 405 includes having each of contacts 120 surrounded in a hexagonal shape (with one corner to tip pointing lengthwise upwards along length LE1) by six of contacts 130, or by as many of contacts 130 as there are (e.g., as fit into) zone 102. In some cases, the pattern includes having two signal contacts 130 lengthwise adjacent between each pair of contacts 120. In some cases, the pattern includes two lengthwise adjacent signal contacts 130 having one grounding contact 120 lengthwise above and below a two signal contacts 130; and having two grounding contacts 120 widthwise adjacent to and offset to be between the lengthwise distance between (PL/2) the two signal contacts 130.

In some cases, zone 102 may be described as a receive or "RX" signal cluster having receive contacts 130 and isolation contacts 120 formed in a vertically offset 4-row deep die-bump pattern 405. In some cases, pattern 405 includes only contacts 130 and contacts 120, but no other contacts (e.g., none of contacts 140). Pattern 405 is shown having 20 vertical data signal interconnect stacks and 12 vertical ground isolation signal interconnect stacks, each with exposed data signal upper contact 130 and 120 that may be formed over or onto a data signal via contact and a ground signal vial contact, respectively, of level L1. It can be appreciated that there may be more or fewer of stacks and contacts 130 and 120. In some cases there may be 18 stacks and contacts 130; and 10 stacks and contacts 120 in pattern 405. In some cases there may be 8, 10, 12, 16, 32 or 64 stacks and contacts 130; and 4, 5, 6, 8, 16 or 32 stacks and contacts 120 in pattern 405.

Next, along the direction of width WE3, row 182 includes pattern 410 having contacts 120 along length LE1. Pattern 410 is discussed further below with respect to zones 102 and 104.

Next, along the direction of width WE1, transmit signal contacts 140 and contacts 120 are shown having pattern 408 in zone 104. Pattern 408 may include having transmit signal contacts 140 and contacts 120 in sixth row 184, seventh row 186, eighth row 188, and ninth row 190 in zone 104. Pattern 408 may include having the transmit signal contacts 140 and contacts 120 in rows 186 and 190 lengthwise offset (e.g., along LE1) above contacts of rows 184 and 188 by one half pitch length PL/2. In some cases, pattern 408 may include having contacts 140 and contacts 120 in rows 186 and 190 lengthwise offset (e.g., along LE1) to be lengthwise between those of rows 184 and 188 along pitch length PL.

In some cases shielding pattern 408 includes alternating rows having the following patterns of contacts lengthwise adjacent along length LE1: first row of contacts 140, 120, 140, 140, 120, 140, 140, 120 (e.g., in alternating rows 184 and 188) alternating with second row of contacts 120, 140, 140, 120, 140, 140, 120, 140 which are rows that extend downwards from one half pitch length PL above the first rows (e.g., in alternating rows 186 and 190). As shown in FIG. 3A, this sequence may start at row 184 and continue through row 190. In some cases, shielding pattern 408 includes having each of contacts 120 surrounded in a hexagonal shape (with one corner to tip pointing lengthwise upwards along length LE1) by six of contacts 140, or by as many of contacts 130 as there are (e.g., as fit into) zone 104. In some cases, the pattern includes having two signal contacts 140 lengthwise adjacent between each pair of contacts 120. In some cases, the pattern includes two lengthwise adjacent signal contacts 140 having one grounding contact 120 lengthwise above and below a two signal contacts 140; and having two grounding contacts 120 widthwise adjacent to and offset to be between the lengthwise distance between (PL/2) the two signal contacts 140.

In some cases, zone 104 may be described as a transmit or "TX" signal cluster having transmit contacts 140 and isolation contacts 120 formed in a vertically offset 4-row deep die-bump pattern 408. In some cases, pattern 408 includes only contacts 140 and contacts 120, but no other contacts (e.g., none of contacts 130). Pattern 408 is shown having 20 vertical data signal interconnect stacks and 12 vertical ground isolation signal interconnect stacks, each with exposed data signal upper contact 140 and 120 that may be formed over or onto a data signal via contact and a ground signal vial contact, respectively, of level L1. It can be appreciated that there may be more or fewer of stacks and contacts 140 and 120. In some cases there may be 18 stacks and contacts 140; and 10 stacks and contacts 120 in pattern 408. In some cases there may be 8, 10, 12, 16, 32 or 64 stacks and contacts 140; and 4, 5, 6, 8, 16 or 32 stacks and contacts 120 in pattern 408.

Ground signal contacts 120 are shown having pattern 410 in zone 107. Zone 107 has width WE3 and length LE1. Pattern 410 may include having ground signal contacts 120 in fifth row 182 in zone 107. In some cases, zone 107 may be described as a ground signal cluster formed in a vertically offset 1-row deep die-bump pattern 410. In some cases, pattern 410 (or pattern 411 of FIG. 3B) includes only contacts 120, but no other contacts (e.g., none of contacts 130 or 140).

In some cases, as shown, pattern 410 may include having one of contacts 120 of a first horizontally adjacent row (one of row 182) located horizontally equidistant directly between and lengthwise offset (e.g., along LE1) above, immediately widthwise adjacent contacts of adjacent rows (e.g., of rows 180 and 184) by one half pitch length PL/2. In some cases, as shown, pattern 410 may include having one of contacts 120 (one of row 182) located horizontally equidistant directly between and lengthwise located horizontally adjacent (e.g., side by side, or widthwise adjacent with respect to width WE3 of FIG. 3A) every second widthwise adjacent pair of (e.g., every other) of contacts (e.g., side by side, or widthwise adjacent with respect to width WE3 of FIG. 3A) of zones 102 and 104 (e.g., of rows 178 and 186). Pattern 410 may have 8 vertical ground isolation interconnect stacks, each with an ground isolation upper contact 120 that may be formed over or onto a ground isolation via contact of level L1. It can be appreciated that there may be more or fewer than 8 of stacks and contacts 120 in pattern 410. In some cases there may be 7 stacks and contacts 120. In some cases 4, 5, 6, 8, 16 or 32.

Pattern 405 may be described as a vertically offset four row wide zone of receive contacts and isolation contacts. Pattern 408 may be described as a vertically offset four row wide zone of transmit contacts and isolation contacts. Pattern 410 may be described as a vertically offset one row wide ground isolation zone 107 located or formed between zone 102 and zone 104. Pattern 410 may have side 181 widthwise adjacent to (e.g., along width WE3) or facing zone 102 and opposite side 183 (e.g., opposite from side 181) widthwise adjacent to (e.g., along width WE3) or facing zone 104. It can be appreciated that although patterns 405 and 408 are shown with the same width and length, they may have different widths and/or lengths.

In some cases, each of rows 174-190 may be horizontally (e.g., widthwise) equidistant from each other along the direction of width WE1, and each of the contacts in each row may be vertically (e.g., lengthwise) equidistant from each other along length LE1.

In some cases, instead of pattern 410, device 400 may have a double wide pattern of contacts 120 such as described for zone 109 of FIGS. 1B and 2B. In this case, the pattern may include having two of contacts 120 (such as shown for zone 109 of FIGS. 1B and 2B) located directly between (e.g., side by side, horizontally adjacent, or widthwise adjacent with respect to width WE4 of FIG. 3A) each of contacts 130 and a widthwise adjacent one of contacts 140 (e.g., side by side, or widthwise adjacent with respect to width WE3 of FIG. 3A). This pattern may have 16 vertical ground isolation interconnect stacks, each with an ground isolation upper contact 120 that may be formed over or onto a ground isolation via contact of level L1. It can be appreciated that there may be more or fewer than 16 of stacks and contacts 120 in the pattern. In some cases there may be 18 stacks and contacts 120. In some cases 8, 10, 12, 16, 32 or 64.

Figure 3B:
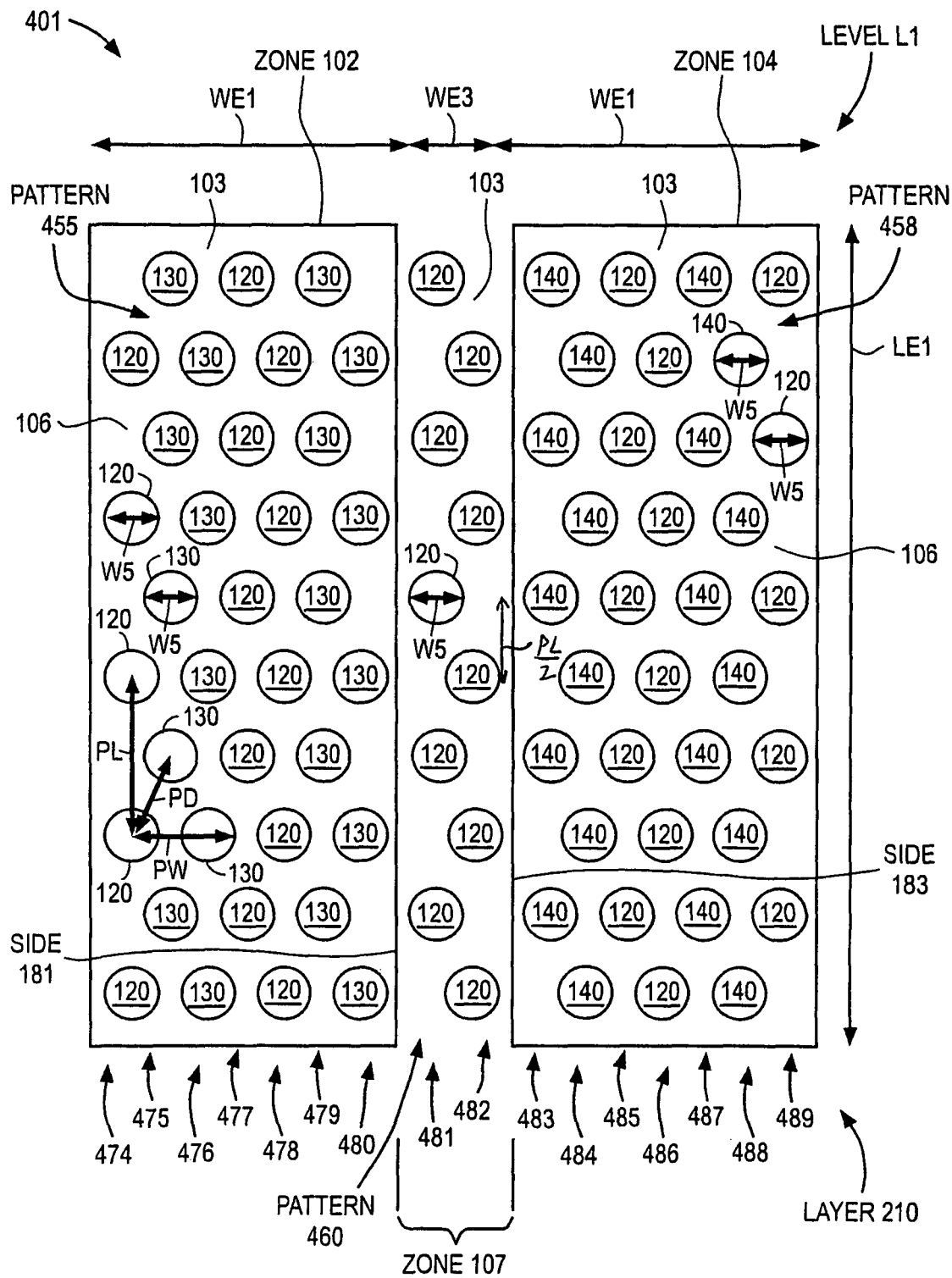
FIG. 3B is a schematic top perspective view of a semiconductor package device upon which at least one integrated circuit (IC) chip (e.g., "die") or other package device may be attached.

FIG. 3B is a schematic top perspective view of a semiconductor package device upon which at least one integrated circuit (IC) chip (e.g., "die") or other package device may be attached. FIG. 3B shows package device 401 having top surface 106, such as a surface of dielectric 103, upon or in which are formed (e.g., disposed) the grounding contacts 120, receive signal contacts 130 and transmit contacts 140. FIG. 3B shows package device 401 having a first interconnect level L1 with upper layer 210 having one row of upper (e.g., top or first) layer ground isolation contacts 120 forming shielding pattern 460 in zone 107, having upper layer receive data signal contacts 130 and additional isolation contacts 120 forming a shielding pattern 455 in zone 102, and having upper layer transmit data signal contacts 140 and additional isolation contacts 120 forming a shielding pattern 458 in zone 104. Contacts 120, 130 and 140 are surrounded by dielectric layer 103 such as an electrically non-conductive or insulating material.

Receive signal contacts 130 and contacts 120 are shown having pattern 455 in zone 102. Pattern 455 may include having receive signal contacts 130 or ground contacts 120 in first row 474, second row 475, third row 476, fourth row 477, fifth row 478, sixth row 479, and seventh row 480 in zone 102. Pattern 455 may include having ground contacts 120 (e.g., only contacts 120, but no other contacts (e.g., none of contacts 130 or 140)) in first row 474, fourth row 477, and fifth row 478; and having receive signal contacts 130 (e.g., only contacts 130, but no other contacts (e.g., none of contacts 120 or 140)) in second row 475, third row 476, sixth row 479, and seventh row 480. Pattern 455 may include having the receive signal contacts 130 or contacts 120 in rows 475, 477 and 479 lengthwise offset (e.g., along LE1) above contacts of rows 474, 476, 478 and 480 by one half pitch length PL. In some cases, pattern 455 may include having contacts 130 or contacts 120 in rows 475, 477 and 479 lengthwise offset (e.g., along LE1) to be lengthwise between those of rows 474, 476, 478 and 480 along pitch length PL.

In some cases, zone 102 may be described as a receive or "RX" signal cluster having receive contacts 130 or isolation contacts 120 formed in a vertically offset 7-row deep die-bump pattern 455. In some cases, pattern 455 includes only contacts 130 and contacts 120, but no other contacts (e.g., none of contacts 140). Pattern 455 is shown having 20 vertical data signal interconnect stacks and 15 vertical ground isolation signal interconnect stacks, each with exposed data signal upper contact 130 and 120 that may be formed over or onto a data signal via contact and a ground signal vial contact, respectively, of level L1. It can be appreciated that there may be more or fewer of stacks and contacts 130 and 120. In some cases there may be 18 stacks and contacts 130; and 13 stacks and contacts 120 in pattern 455. In some cases there may be 8, 10, 12, 16, 32 or 64 stacks and contacts 130; and 4, 5, 6, 8, 16 or 32 stacks and contacts 120 in pattern 405.

Next, along the direction of width WE3, rows 481 and 482 include pattern 460 having contacts 120 along length LE1. Pattern 460 is discussed further below with respect to zones 102 and 104.

Next, along the direction of width WE1, transmit signal contacts 140 and contacts 120 are shown having pattern 458 in zone 104. Pattern 458 may include having transmit signal contacts 140 or ground contacts 120 in tenth row 483, eleventh row 484, twelfth row 485, thirteenth row 486, fourteenth row 487, fifteenth row 488, and sixteenth row 489 in zone 104. Pattern 458 may include having ground contacts 120 (e.g., only contacts 120, but no other contacts (e.g., none of contacts 130 or 140)) in twelfth row 485, thirteenth row 486 and sixteenth row 489; and having receive signal contacts 130 (e.g., only contacts 140, but no other contacts (e.g., none of contacts 120 or 130)) in tenth row 483, eleventh row 484, fourteenth row 487, and fifteenth row 488. Pattern 458 may include having the transmit signal contacts 140 or contacts 120 in rows 484, 486 and 488 lengthwise offset (e.g., along LE1) below contacts of rows 483, 485, 487 and 489 by one half pitch length PL. In some cases, pattern 458 may include having contacts 140 or contacts 120 in rows 484, 486 and 488 lengthwise offset (e.g., along LE1) to be lengthwise between those of rows 483, 485, 487 and 489 along pitch length PL.

In some cases, zone 104 may be described as a transmit or "TX" signal cluster having transmit contacts 140 or isolation contacts 120 formed in a vertically offset 7-row deep die-bump pattern 458. In some cases, pattern 458 includes only contacts 140 and contacts 120, but no other contacts (e.g., none of contacts 130). Pattern 458 is shown having 20 vertical data signal interconnect stacks and 15 vertical ground isolation signal interconnect stacks, each with exposed data signal upper contact 140 and 120 that may be formed over or onto a data signal via contact and a ground signal vial contact, respectively, of level L1. It can be appreciated that there may be more or fewer of stacks and contacts 140 and 120. In some cases there may be 18 stacks and contacts 140; and 13 stacks and contacts 120 in pattern 458. In some cases there may be 8, 10, 12, 16, 32 or 64 stacks and contacts 140; and 4, 5, 6, 8, 16 or 32 stacks and contacts 120 in pattern 405.

Ground signal contacts 120 are shown having pattern 460 in zone 107. Zone 107 has width WE3 and length LE1. Pattern 460 may include having ground signal contacts 120 in eighth row 481 and ninth row 482 in zone 107. In some cases, zone 107 may be described as a ground signal cluster formed in a vertically offset 2-row deep die-bump pattern 460. In some cases, pattern 460 includes only contacts 120, but no other contacts (e.g., none of contacts 130 or 140).

In some cases, as shown, pattern 460 may include having one of contacts 120 of a first horizontally adjacent row (one contact of row 481) located horizontally equidistant directly between and lengthwise offset (e.g., along LE1) above, immediately widthwise adjacent contacts of adjacent rows (e.g., of rows 480 and 482) by one half pitch length PL; and having a one of contacts 120 of a second horizontally adjacent row (one contact of row 482) located horizontally equidistant directly between and lengthwise offset (e.g., along LE1) below, immediately widthwise adjacent contacts of adjacent rows (e.g., of rows 481 and 483) by one half pitch length PL. In some cases, as shown, pattern 460 may include having one of contacts 120 of two widthwise adjacent rows (one contact of row 481 and of row 482) located horizontally equidistant directly between and lengthwise located horizontally adjacent (e.g., side by side, or widthwise adjacent with respect to width WE3 of FIG. 3B) every second widthwise adjacent pair of (e.g., every other) of contacts (e.g., side by side, or widthwise adjacent with respect to width WE3 of FIG. 3B) of zones 102 and 104 (e.g., of rows 479 and 483; and rows 480 and 484, respectively). Pattern 460 may have 10 vertical ground isolation interconnect stacks, each with an ground isolation upper contact 120 that may be formed over or onto a ground isolation via contact of level L1. It can be appreciated that there may be more or fewer than 10 of stacks and contacts 120 in pattern 410. In some cases there may be 9 stacks and contacts 120. In some cases 4, 5, 6, 8, 16 or 32.

Pattern 455 may be described as a vertically offset seven row wide zone of receive contacts and isolation contacts. Pattern 458 may be described as a vertically offset seven row wide zone of transmit contacts and isolation contacts. Pattern 460 may be described as a vertically offset two row wide ground isolation zone 107 located or formed between zone 102 and zone 104. Pattern 460 may have side 181 widthwise adjacent to (e.g., along width WE3) or facing zone 102 and opposite side 183 (e.g., opposite from side 181) widthwise adjacent to (e.g., along width WE3) or facing zone 104. It can be appreciated that although patterns 455 and 458 are shown with the same width and length, they may have different widths and/or lengths.

In some cases, each of rows 474-489 may be horizontally (e.g., widthwise) equidistant from each other along the direction of width WE1, and each of the contacts in each row may be vertically (e.g., lengthwise) equidistant from each other along length LE1.

Similar to descriptions for FIG. 2A solder bumps may be formed on upper (e.g., top or first) layer ground isolation contacts 120 of patterns 410 and 460; upper layer receive data signal contacts 130 and isolation contacts 120 of patterns 405 and 455; and upper layer transmit data signal contacts 140 and isolation contacts 120 of patterns 408 and 458. In level L1 (and similarly for some other levels) devices 400 and 401 may have contacts 130 formed onto or physically attached to a top surface of via contacts 132, ground isolation contacts 120 formed onto or physically attached to a top surface of via contacts 122, and contacts 140 formed onto or physically attached to a top surface of via contacts 142, similar to descriptions for FIG. 2A.

Some embodiments of devices 400 and 401 may have top or topmost (e.g., first level) interconnect level L1 having top layer 210 formed over or onto second level interconnect level L2. Devices 400 and 401 layer 210 has dielectric 103 surrounding ground isolation contacts 120, contacts 130 and contacts 140, similar to descriptions for FIG. 2A.

Some embodiments of devices 400 or 401 (e.g., FIG. 3A or 3B) may have solder bumps 134 formed onto or physically attached to a top surface of contacts 130, solder bump 124 formed onto or physically attached to a top surface of contacts 120, and solder bumps 144 formed onto or physically attached to a top surface of contacts 140 of layer 210 (e.g., similar to descriptions for FIGS. 2A and 2B). Some embodiments of devices 400 and 401 may not have (e.g., not yet have) solder bumps 134 formed onto or physically attached to a top surface of contacts 130, solder bump 124 formed onto or physically attached to a top surface of contacts 120, or solder bumps 144 formed onto or physically attached to a top surface of contacts 140 of layer 210.

In some cases, solder bumps 124, 134 and 144 (e.g., herein) may be described as "physical attachments" or "solid conductive material ground isolation shielding attachments" attached to contacts 120, 130 and 140. They may also be describe as "physical attachments" or "solid conductive material ground isolation shielding attachments" attaching (e.g., physically and electrically attaching) contacts 120, 130 and 140; or device 100, 101, 400 or 401 to another package device or next level component.

In some cases, solder bumps 124, 134 and 144 are shot onto a surface of the substrate and a solder reflow process is performed on solder bumps 124, 134 and 144 to cause the solder to attach the next level component to layer 210 using solder bumps 124, 134 and 144.

Top or topmost (e.g., first level) interconnect level L1 of devices 100, 101, 400 and 401 may be formed over a second level interconnect level L2, which is formed over other interconnect levels. In FIGS. 1A-3B data signal interconnect contacts 130 and 140 of rows 174-190, and 474-489 may represent vertical data signal interconnects of the package device (e.g., upper surface contacts of multiple levels of levels). In FIGS. 1A-3B, ground interconnect contacts 120 may represent solid conductive material ground isolation shielding surface contacts of the package device (e.g., upper surface contacts of multiple levels of levels).

Below level L1, package devices 100, 101, 400 and 401 may include various interconnect layers, packaging layers, conductive features (e.g., electronic devices, interconnects, layers having conductive traces, layers having conductive vias), layers having dielectric material and other layers as known in the industry for a semiconductor device package. In some cases, the package may be cored or coreless. In some cases, the package includes features formed according to a standard package substrate formation processes and tools such as those that include or use: lamination of dielectric layers such as ajinomoto build up films (ABF), laser or mechanical drilling to form vias in the dielectric films, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peel able core panel. The substrate may be a substrate used in an electronic device package or a microprocessor package. In some cases, level L1 may also include such structures noted above for package device 100, thought not shown in FIG. 2A. In some cases, the contacts and/or traces of level L1 are electrically connected to (e.g., physically attached to or formed onto) the conductive structures noted above for package device 100.

Contacts 120, 130 and 140 of devices 100, 101, 400 and 401 may be areas of an upper (e.g., top or first) layer of conductive material that is formed as part of upper layer 210 of level L1. In some cases, contacts 120, 130 and 140 are part of an upper layer of conductive material that is formed during the same deposition or plating used to form other conductive material of level L1. In some cases, contacts 120, 130 and 140 are each a layer of solid electrical conductor material extending width W5 and between which is disposed dielectric portions 103 surrounding upper contacts 120, 130 and 140 of layer 210.

According to some embodiments, one, two or three of contacts 120 (e.g., and solder bumps 124) of row 182, 185, 481 or 482 may be replaced by power contacts, such as contacts used to transmit or provide power signals to an IC chip or other package device attached to the power contacts of Level L1. In some cases the power contacts are used to provide an alternating current (AC) or a direct current (DC) power signal (e.g., Vdd). In some cases the signal has a voltage of between 0.5 and 2.0 volts. In some cases it is between 0.4 and 7.0 volts. In some cases it is between 0.5 and 5.0 volts. In some cases it is a different voltage level. In some cases, between one and 3 of contacts 120 (e.g., and solder bumps 124) in the middle of row 182, 185, 481 or 482 (e.g., not on the lengthwise end of LE1) may be replaced by power contacts. In some cases, two of contacts 120 (e.g., and solder bumps 124) in the middle of row 182, 185, 481 or 482 may be replaced by power contacts. In some cases, two of contacts 120 (e.g., and solder bumps 124) in the middle of row 182 or 481 are replaced by power contacts.

Zones 102, 104 and 107 (or 109) (and level L1) may have features having standard package pitch as known for a semiconductor die package, chip package; or for another device (e.g., interface, PCB, or interposer) typically connecting a die (e.g., IC, chip, processor, or central processing unit) to a socket, a motherboard, or another next-level component. The pitch width (PW) of adjacent contacts is shown as the width distance between the center point of two adjacent contacts. FIGS. 1A-B and 3A-B show pitch width (PW), pitch diagonal (PD) and pitch length (PL) (or PL/2) for rows 174-190 and 474-489. It can be appreciated that the same pitch width may apply to each of adjacent rows of rows 174-190 and 474-489. In some cases, pitch PW is approximately 153 micrometers (153×E-6 meter—"um"). In some cases, pitch PW is approximately 160 micrometers. In some cases, it is between 140 and 175 micrometers. The diagonal pitch (PD) of adjacent contacts is the diagonal distance between the center of two adjacent contacts. In some cases, pitch PD is approximately 110 micrometers (110×E-6 meter—"um"). In some cases, pitch PD is approximately 130 micrometers. In some cases, it is between 100 and 140 micrometers (um). In some cases, it is between 60 and 200 micrometers. The pitch length (PL) (or PL/2) of two adjacent contacts is the length distance between the center point of two adjacent contacts. In some cases, pitch PL is approximately 158 micrometers. In some cases, pitch PL is approximately 206 micrometers. In some cases, it is between 130 and 240 micrometers (um). In some cases, pitch PD is approximately 110 micrometers, PL is approximately 158 micrometers and PW is approximately 153 micrometers. In some cases, pitch PD is approximately 130 micrometers, PL is approximately 206 micrometers and PW is approximately 160 micrometers. In the cases above, "approximately" may represent a difference of within plus or minus 5 percent of the number stated. In other cases, it may represent a difference of within plus or minus 10 percent of the number stated.

According to some embodiments, the pitches above are for (e.g., apply to) PD, PL and PW between contacts 120, 130 and/or 140 (and optionally solder bumps 124, 134 and 144) for BGA 812, 818 and/or 819. It can be appreciated that different pitches PD, PL and PW may exist between contacts 120, 130 and/or 140 (and optionally solder bumps 124, 134 and 144) for BGA 814, 816, 916 or contacts 965 as described below after FIG. 9.

In some cases, "widthwise adjacent" may refer to attachments or contacts that are side by side with respect to direction of width WE3. In some cases, it may also include attachments or contacts that are lengthwise above or below (e.g., in a different column of rows 174-190 with respect to length LE1 of FIG. 1A-B) those that are widthwise adjacent or side by side with respect to direction of width WE3 or WE4.

In some cases, contacts 120 (e.g., and bumps 124) are used to transmit or provide grounding (e.g., isolation) signals to an IC chip or other package device attached to contacts 120 of Level L1. In some cases they are used to provide a zero voltage direct current (DC) grounding signal (e.g., GND). In some cases the signal has a voltage of between 0.0 and 0.2 volts. In some cases it is a different but grounding voltage level.

In some cases, contacts 130 and 140 (e.g., and bumps 134 and 144) are used to transmit or provide a receive data signal or transmit data signal, respectively, from an IC chip or other package device attached to contacts 130 and 140 of Level L1. In some cases they are used to provide an alternating current (AC) or high frequency (HF) receive data signal (e.g., RX and TX). In some cases the signal has a speed (e.g., frequency) of between 7 and 25 GT/s; and a voltage of between 0.5 and 2.0 volts. In some cases the signal has a speed of between 6 and 15 GT/s. In some cases the signal has a voltage of between 0.4 and 5.0 volts. In some cases it is a different speed and/or voltage level.

In some cases, solid conductive material ground isolation shielding attachments such as solder balls or ball grid arrays (BGA) are physically attached to (e.g., soldered to or touching) the first level ground contacts 120. In some cases, solid conductive material data signal attachments such as solder balls or ball grid arrays (BGA) are physically attached to (e.g., soldered to or touching) the first level data signal contacts 130 and 140.

In some cases, solder bumps (or balls) 124, 134 and 144 are formed onto contacts 120, 130 and 140 (e.g., see FIGS. 1A-3B). They may be formed after forming openings in a layer of solder resist formed on layer 210 as noted herein. They may be formed in the openings through the solder resist (not shown in FIGS. 1A-3B). They may be formed by an appropriate process for forming such bumps. In this case, the ground shielding attachment structures may include solid conductive material ground isolation shielding attachments such as the solder bumps or a ball grid arrays (BGA) of the bumps 124, 134 and 144 physically attached to the solid conductive material ground isolation shielding surface contacts 120 for forming the isolation attachments onto (e.g., see FIGS. 1A-3B).

In some cases, layer 210 is a "top" layer such as a top or exposed layer (e.g., a final build-up (BU) layer, BGA layer, LGA layer, or die-backend-like layer) to which an IC chip, a socket, an interposer, a motherboard, or another next-level component will be mounted or directly attached using solder bumps 124, 134 and 144. In some cases, solder bumps 124, 134 and 144 have width W6 and height H6. In some cases, width W6 of solder bumps 124, 134 and 144 may be between 100 and 600 micrometers. In some cases, it is between 300 and 400 micrometers. In some cases, height H6 of solder bumps 124, 134 and 144 may be between 100 and 400 micrometers. In some cases, it is between 200 and 300 micrometers.

In some cases, a solder resist layer (not shown in FIGS. 1A-4) is formed over level L1. Such a resist may be a height (e.g., thickness) of solid non-conductive or electrical insulator solder resist material. Such material may be or include an epoxy, an ink, a resin material, a dry resist material, a fiber base material, a glass fiber base material, a cyanate resin and/or a prepolymer thereof; an epoxy resin, a phenoxy resin, an imidazole compound, an arylalkylene type epoxy resin or the like as known for such a solder resist. In some cases it is an epoxy or a resin. In some cases it is an insulating organic material, laminated material, photosensitive material, or other known solder resist material.

The resist may be a blanket layer that is masked and etched (e.g., by patterning and developing as known in the art) to form openings where solder can be formed on and attached to the upper contacts (e.g., contacts 120, 130 and 140), or where contacts of anther device (e.g., a chip) can be soldered to the upper contacts. Alternatively, the resist may be a layer that is formed on a mask, and the mask then removed to form the openings. In some cases, the resist may be a material (e.g., epoxy) liquid that is silkscreened through or sprayed onto a pattern (e.g., mask) formed on the package; and the mask then removed (e.g., dissolved or burned) to form the openings. In some cases, the resist may be a liquid photoimageable solder mask (LPSM) ink or a dry film photoimageable solder mask (DFSM) blanket layer sprayed onto the package; and then masked and exposed to a pattern and developed to form the openings. This developing process may be selective to remove the resist in the solder bump designated locations (e.g., openings) which were exposed or masked from exposure to light via a lithography process, depending on whether a positive or negative tone resist is used, while keeping the solde resist layer intact in the remaining locations. Furthermore the developing process may be chosen to be selective so as not to remove dielectric 103 or contacts 120, 130 and 140. In some cases, the solder resist may have a height that may be between 5 and 50 micrometers. In some cases, the resist goes through a thermal cure of some type after the openings (e.g., pattern) are defined. In some cases the resist is laser scribed to form the openings. In some cases, the resist may be formed by a process known to form such a resist of a package.

In some cases, solder bumps (or balls) 124, 134 and 144 are formed onto contacts 120, 130 and 140 (e.g., see FIGS. 1A-2B). They may be formed after forming openings in a layer of solder resist formed on layer 210 as noted above. They may be formed in the openings through the solder resist (not shown in FIGS. 1A-2B). They may be formed by an appropriate process for forming such bumps. In this case, the ground shielding attachment structures may include solid conductive material ground isolation shielding attachments such as the solder bumps or a ball grid arrays (BGA) of the bumps 124, 134 and 144 physically attached to the solid conductive material ground isolation shielding surface contacts 120 for forming the isolation attachments onto (e.g., see FIGS. 1A-2B).

As note for FIGS. 1A-4, ground shielding attachment structures may include solid conductive material ground isolation shielding attachments 124 such as solder balls or ball grid arrays (BGA); and/or solid conductive material ground isolation shielding surface contacts 120 for the isolation attachments.

In some cases, the solid conductive material ground shielding attachment structures of zones 107 and 109 (e.g., surface contacts 120 and/or bumps 124 of zone 107, zone 109, pattern 410 and pattern 460) provide an electrical ground isolation shield between zones 102 and 104 of level L1 that reduces "die bump field" crosstalk between all widthwise adjacent ones of different types (e.g., RX and TX) of data signal surface contacts (e.g., contacts 130 and 140) and solder bumps (e.g., bumps 134 and 144) of or on a top level L1 or layer 210 of a package device (e.g., device 100, 101, 400 and 401) by being between zones (e.g., fields or clusters) 102 and 104 of level L1. In some cases, "die bump field" crosstalk may be "die bump zone" crosstalk, "die bump cluster" crosstalk, or crosstalk between zones 102 and 104. Here "widthwise adjacent" may be along width WE3 or WE4 with respect to FIGS. 1A-B and 3A-B, and may also be described as "horizontally adjacent" such as with respect to FIGS. 2A-B and 4.

In some cases, the solid conductive material ground isolation shielding attachments 124 of zones 107 and 109 (e.g., of the ground shielding attachment structures) (such as of zone 107, zone 109, pattern 410 and pattern 460) provide an electrical ground isolation shield between two fields (e.g., zones) of different types (e.g., RX and TX) of data signal attachment structures (e.g., bumps 134 and 144) formed onto or physically attached to data signal surface contacts (e.g., contacts 130 and 140) of a top level L1 or top layer 210 of a package device (e.g., device 100, 101, 400 and 401).

In some cases, the ground shielding attachment structures 124 of zone 107, zone 109, pattern 410 and pattern 460 provide electrical ground isolation shielding between zones 102 and 104 of level L1 that reduces "die bump field" crosstalk between all widthwise adjacent ones of bumps 134 and 144 by being between zones 102 and 104 above level L1.

In some cases, attachments 124 (e.g., of zone 107, zone 109, pattern 410 and pattern 460) between data signal attachment structures 134 of zone 102 and 144 of zone 104 may each provide an electrical ground isolation shield between structures 134 and 144 of zones 102 and 104 above level L1 that reduces "die bump field" crosstalk between all widthwise or otherwise adjacent ones of (e.g., above layer 210) structures 134 and 144 that attachments 124 are between (e.g., by those attachments 124 being in zone 107 or 109 and over level L1).

In some cases, the solid conductive material ground shielding attachment structures 120 of zones 107 and 109 (e.g., of the ground shielding attachment structures) (such as of zone 107, zone 109, pattern 410 and pattern 460) provide an electrical ground isolation shield between two fields (e.g., zones) of different types (e.g., RX and TX) of data signal surface contacts (e.g., contacts 130 and 140) of a top level L1 or top layer 210 of a package device (e.g., device 100, 101, 400 and 401).

In some cases, the ground shielding attachment contacts 120 of zone 107, zone 109, pattern 410 and pattern 460 provide electrical ground isolation shielding between zones 102 and 104 of level L1 that reduces "die contact field" crosstalk between all widthwise adjacent ones of (e.g., of layer 210) contacts 130 and 140 by being between zones 102 and 104 of level L1.

In some cases, structures 120 (e.g., of zone 107, zone 109, pattern 410 and pattern 460) between data signal contacts 130 of zone 102 and 140 of zone 104 may each provide an electrical ground isolation shield between contacts 130 and 140 of zones 102 and 104 of level L1 that reduces "die contact field" crosstalk between all widthwise or otherwise adjacent ones of (e.g., of layer 210) contacts 130 and 140 that contacts 120 are between (e.g., by those attachments 120 being in zone 107 or 109 of level L1).

In some cases, the solid conductive material ground shielding attachment structures within zones 102 and 104 (e.g., surface contacts 120 and/or bumps 124 of zone 102, zone 104, pattern 405, pattern 408, pattern 455 and pattern 458) provide an electrical ground isolation shield within zones 102 and 104 of level L1 that reduces "die bump in-field" crosstalk between all adjacent ones of same type (e.g., RX or TX) of data signal surface contacts (e.g., contacts 130 or 140) and solder bumps (e.g., bumps 134 or 144) of or on a top level L1 or layer 210 of a package device (e.g., device 100, 101, 400 and 401) by being between two data signal contacts of zones (e.g., fields or clusters) 102 and 104 of level L1. In some cases, "die bump in-field" crosstalk may be "die bump in-zone" crosstalk, "die bump in-cluster" crosstalk, or crosstalk within zones 102 and 104. Here "adjacent" may be widthwise adjacent, lengthwise adjacent, diagonalwise adjacent with respect to FIGS. 1A-B and 3A-B, and may also be described as horizontally adjacent or vertically adjacent such as with respect to FIGS. 2A-B and 4.

In some cases, the solid conductive material ground isolation shielding attachments 124 of zones 102 and 104 (e.g., of the ground shielding attachment structures) (such as of pattern 405, pattern 408, pattern 455 and pattern 458) provide an electrical ground isolation shield between two data signal contacts within one field (e.g., zone) of one type (e.g., RX or TX) of data signal attachment structures (e.g., bumps 134 or 144) formed onto or physically attached to data signal surface contacts (e.g., contacts 130 or 140) of a top level L1 or top layer 210 of a package device (e.g., device 100, 101, 400 and 401).

In some cases, the ground shielding attachment structures 124 of zone 102, zone 104, pattern 405, pattern 408, pattern 455 and pattern 458 provide electrical ground isolation shielding between each data signal contact of zones 102 and 104 of level L1 that reduces "die bump in-field" crosstalk between all adjacent ones of bumps 134 or 144 by being between those adjacent ones of bumps 134 or 144 above level L1.

In some cases, attachments 124 (e.g., of zone 102, zone 104, pattern 405, pattern 408, pattern 455 and pattern 458) between data signal attachment structures 134 in zone 102 or 144 in zone 104 may each provide an electrical ground isolation shield between structures 134 or 144 of zones 102 and 104 above level L1 that reduces "die bump in-field" crosstalk between all adjacent ones (e.g., above layer 210) structures 134 or 144 that attachments 124 are between (e.g., by those attachments 124 being in zone 102 or 104 and over level L1).

In some cases, the solid conductive material ground shielding attachment structures 120 of zones 102 and 104 (e.g., of the ground shielding attachment structures) (such as of pattern 405, pattern 408, pattern 455 and pattern 458) provide an electrical ground isolation shield between two data signal contacts within one field (e.g., zone) of one type (e.g., RX or TX) of data signal surface contacts (e.g., contacts 130 or 140) of a top level L1 or top layer 210 of a package device (e.g., device 100, 101, 400 and 401).

In some cases, the ground shielding attachment contacts of zone 102, zone 104, pattern 405, pattern 408, pattern 455 and pattern 458 provide electrical ground isolation shielding between each data signal contact of zones 102 and 104 of level L1 that reduces "die contact in-field" crosstalk between all adjacent ones of (e.g., of layer 210) contacts 130 and 140 by being between those adjacent ones of contacts 130 and 140 of level L1.

In some cases, structures 120 (e.g., of zone 102, zone 104, pattern 405, pattern 408, pattern 455 and pattern 458) between data signal contacts 130 in zone 102 or 144 in zone 104 may each provide an electrical ground isolation shield between contacts 130 or 140 of zones 102 and 104 of level L1 that reduces "die contact in-field" crosstalk between all adjacent ones of (e.g., of layer 210) contacts 130 or 140 that contacts 120 are between (e.g., by those contacts 120 being in zone 102 or 104 of level L1).

For example, by being conductive material electrically connected to the ground, attachments 124 and contacts 120 of zones 107 and 109 may provide electrically grounded structure that absorbs, or shields electromagnetic crosstalk signals produced by one of attachments 134 or contacts 130 (e.g., of zone 102 or beyond side 181) from reaching a widthwise adjacent (e.g., of zone 104 or beyond side 183) one of attachments 144 and contacts 140, due to the amount of grounded conductive material, and location of the conductive grounded material adjacent to (e.g., between) that one of attachments 134 or contacts 130 and the widthwise adjacent one of attachments 144 and contacts 140.

In some cases, attachments 124 and contacts 120 reduce electrical crosstalk caused by undesired capacitive, inductive, or conductive coupling of a first signal received or transmitted through (or existing on) one of attachments 134 or contacts 130 effecting or being mirrored in a second signal received or transmitted through (or existing on) one of attachments 144 or contacts 140. Such electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one of attachments 134 or contacts 130 induces current a second data signal in one of attachments 144 or contacts 140. It can be appreciated that the descriptions above are also true for a first signal through attachments 144 or contacts 140 effecting or being mirrored in a second signal received or transmitted through (or existing on) one of attachments 134 or contacts 130.

In some embodiments, any or each of attachments 124 and contacts 120 reduce electrical crosstalk as noted above (1) without increasing the horizontal distance or spacing between any of (a) adjacent contacts 130 or attachments 134 of zone 102; or (b) contacts 140 or attachments 144 of zone 104, (2) without increasing the distance or spacing between the any of Levels L1-L3, (3) without re-ordering any of the contacts (or traces) noted above or Levels L1-L3.

In some cases, device 100, 101, 400 or 401 includes a solid conductive material ground plane located vertically below contacts 120, 130 and 140. The plane has openings vertically below and horizontally surrounding (surrounding a vertical "shadow" of): (1) the first level first type of data signal contacts 130, and (2) the first level second type of data signal contacts 140 by a width W4 which may be at least as large as a width of the data signal attachments 134 or 144. The openings may reduce parasitic capacitance caused by a vertical overlap of the grounding plane and the attachments 134 and 144, such as where a capacitance is formed between attachments 134 and 144 and the ground plane. The openings may also minimize data signal reflection and crosstalk caused by a vertical overlap of the grounding plane and the attachments 134 and 144, such as where the reflection and crosstalk is formed between attachments 134 and 144 and the ground plane.

For example, as noted herein, FIG. 2A is a schematic cross-sectional side view of package device 100 showing top or upper layer contacts of a top interconnect level; and a typical layer of ground isolation plane structure 160 of the package below level L1. FIG. 2A shows layer 210 having bumps 124, 134 and 144 physically attached to contacts 120, 130 and 140 of top interconnect level L1; and plane 160 representing one typical layer of ground isolation plane of level L3 below level L1.

Figure 4:
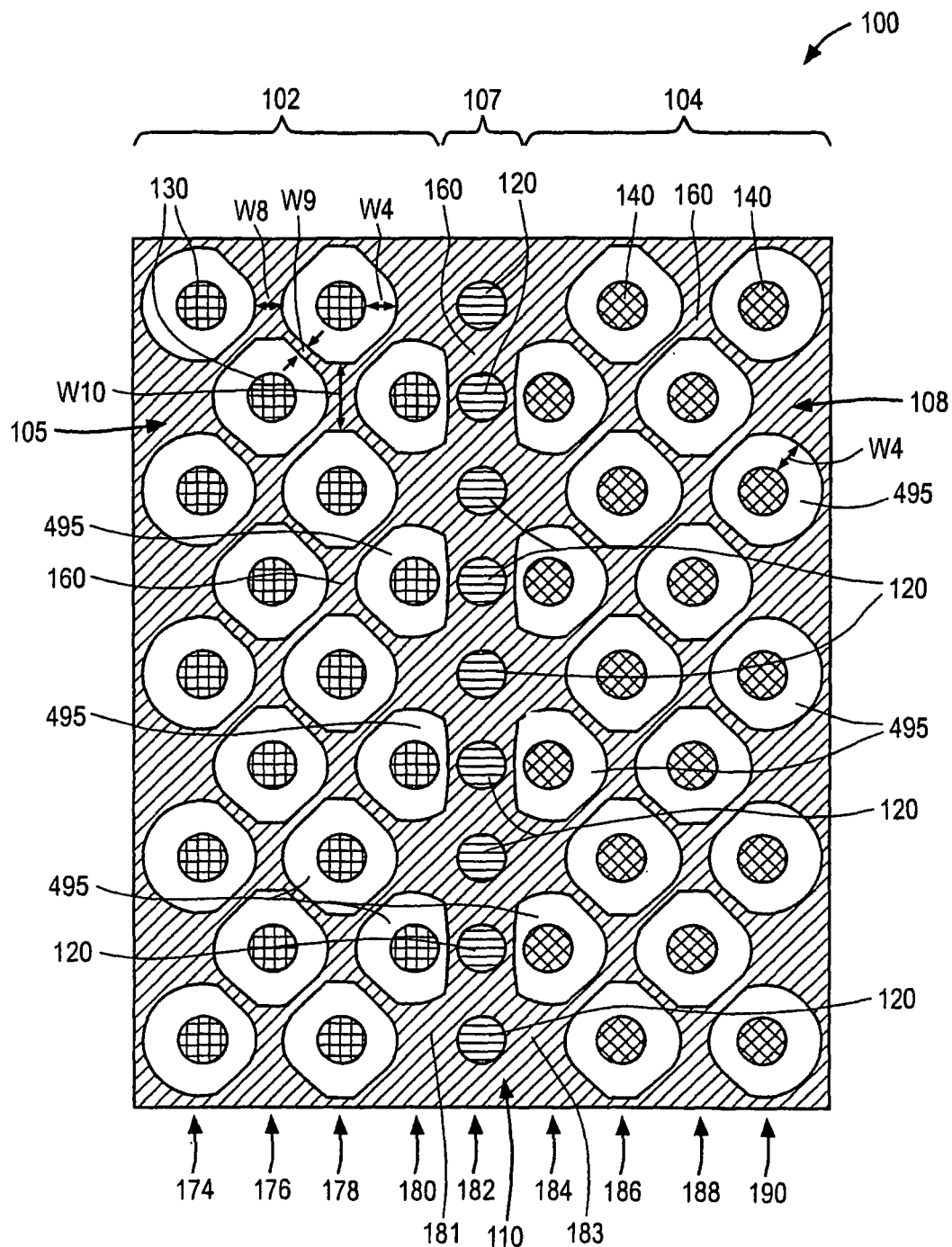
FIG. 4 is a schematic cross-sectional top view of the package device of FIGS. 1A and 2A showing top or upper layer contacts of a top or typical interconnect level; and shading representing one typical layer of ground isolation plane structure of the package below level L1.

FIG. 4 is a schematic cross-sectional top view of the package of FIGS. 1A and 2A showing top or upper layer contacts of a top or typical interconnect level; and shading representing one typical layer of ground isolation plane structure of the package below level L1. FIG. 4 shows layer 210 having (not shown, bumps 124, 134 and 144 physically attached to) contacts 120, 130 and 140 of top interconnect level L1; and shading 160 representing one layer of ground isolation plane structure 160 of the package below level L1. FIG. 4 shows package device 100 having zone 102 with contacts 130 in rows 174-180. It shows zone 104 having contacts 140 in rows 184-190. It shows zone 107 having contacts 120 having pattern 110 in row 182.

In some cases, level L2 is or includes dielectric material 103. In some cases, it also include top layer contacts, via contacts, traces or other components that are physically attached to via contacts 132, 122 and/or 142.

Plane 160 may be a solid conductive material ground plane (e.g., a portion of a layer of device 100 that is a ground plane) located on level L3, vertically below (e.g., vertically adjacent to and directly below, such as by being in a level below) layer 210. Plane 160 has openings 495 vertically below and horizontally surrounding (e.g., formed from a vertical "shadow" of): (1) the first level first type of data signal contacts 130, and (2) the first level second type of data signal contacts 140 by a width W4 at least as large as a width of attachments 124, 134 and 144. In some cases, width W4 is between zero and 20% larger than width W6.

In some cases, ground plane 160 is connected to electrical grounding to reduce crosstalk between horizontal levels (e.g., level L2 and L4) of device 100 and openings 495 reduce parasitic capacitance between (1) the first level first type of data signal attachments 134 (and optionally also between contacts 130) and grounding plane 160, and (2) the first level second type of data signal attachments 144 (and optionally also between contacts 140) and the grounding plane 160. Openings 495 may reduce the parasitic capacitance by causing attachments 134 and 144 (and optionally also contacts 130 and 140) to not vertically overlap grounding plane 160.

In some cases, ground plane 160 is connected to electrical grounding to reduce crosstalk between horizontal levels (e.g., level L2 and L4) of device 100 and openings 495 reduce data signal reflection and crosstalk between (1) the first level first type of data signal attachments 134 (and optionally also between contacts 130) and grounding plane 160, and (2) the first level second type of data signal attachments 144 (and optionally also between contacts 140) and the grounding plane 160. Openings 495 may reduce the reflection and crosstalk by causing attachments 134 and 144 (and optionally also contacts 130 and 140) to not vertically overlap grounding plane 160.

It can be appreciated that in other embodiments, plane 160 may be located on a level other than level L3, such as level L2, L4 or L5. In can be appreciated that the descriptions for plane 160 may apply to embodiments having multiple ground planes similar to plane 160, such as where the multiple planes are on two or more of levels L2-L5.

It can be appreciated that the concepts described above for embodiments of FIGS. 1A, 2A and 4 can also be applied to embodiments of FIGS. 1B and 2B; and FIGS. 3A-B, such as by applying the descriptions for single wide ground contact and solder bump zone 107 to double wide ground contact and solder bump zone 109.

More specifically, plane 160 having openings 495 vertically below and horizontally surrounding (e.g., formed from a vertical "shadow" of): (1) the first level first type of data signal contacts 130, and (2) the first level second type of data signal contacts 140 by a width W4 at least as large as a width of attachments 124, 134 and 144, may also exist in embodiments devices 101, 400 and 401.

In some cases, zones 102, 107 (or 109) and 104 of FIGS. 1A-2B and 4 are extended lengthwise along LE1 so that another one of upper contacts 120; 130 of rows 176 and 180; and contacts 140 of rows 186 and 190 are formed lengthwise below those shown. In this case there are 20 of each of contacts 130 and 140, and 10 of contacts 120 of zone 107 (or 20 of zone 109).

It can be appreciated that the concepts described above for embodiments of FIGS. 1A-4 shown with level L1 as a top or exposed level, layer 210 as a top or exposed layer and surface 103 as a top or exposed surface can also be applied to embodiments where devices 100, 101, 400 and 401 are inverted (e.g., upside down with respect to cross-sectional side view of FIGS. 1A-4, such as where L1 is a lowest level or bottom level; layer 210 is a lowest layer or layer; and surface 106 is a bottom surface of the device. According to these embodiments, device 100, 101, 400 or 401 may be attached to another package device dispose below surface 106 (e.g., using solder bumps 134, 124 and 144).

In some embodiments, the vertical ground isolation structures may include vertical ground shielding structures for different types of vertical data signal interconnects (e.g., see vertical data interconnect stacks of FIGS. 1A-4) of package devices. The vertical ground shielding structures may include solid conductive material vertical ground shield interconnects (e.g., see vertical ground isolation signal interconnect stacks of FIGS. 1A-3B), and solid conductive material vertical ground shield fencing structures such as ground plated through hole (PTH) and micro-vias (uVia) (see FIGS. 5-7) that are physically attached to the ground shielding attachment structures as described herein (see FIGS. 1-4). The vertical data signal interconnects may be located or disposed beside and between the different types of vertical data signal interconnects that are spread over an area of and extend through vertical interconnect levels of a package device. The different types of vertical data signal interconnects may include vertically extending transmit and receive data signal interconnects; and the vertical ground shielding structures may reduce signal type (e.g., same or single signal type RX or TX) inter-cluster crosstalk by being between and electrically shielding separate single ones of the vertically extending transmit and receive vertical data signal interconnects.

In some cases, the vertical ground shielding structures may extend through package micro-via interconnect levels and PTH interconnect levels with upper layer ground contacts, upper layer data signal contacts formed over and connected to via contacts or traces of a lower layer of the same micro-via interconnect levels and PTH interconnect levels.

In some cases, the vertical ground shielding structures may provide a better component for the physical and electrical connections between an IC chip or other package device which is mounted upon or to the vertically ground isolated package device. In some cases, it may increase in the stability and cleanliness of ground, and high frequency transmit and receive data signals transmitted between the micro-via interconnect levels and PTH interconnect levels of the package and other components of or attached to the package that are electrically connected to the micro-via interconnect levels and PTH interconnect levels through data signal contacts on the top surface of the package.

In some cases, the micro-via interconnect levels and PTH interconnect levels are part of the vertical data signal interconnects of the package device. In some cases, the vertical ground shielding structures may increase the usable frequency of transmit and receive data signals transmitted through the micro-via interconnect levels and PTH interconnect levels of the package and other components of or attached to the package, as compared to a package not having the structures. Such an increased frequency may include data signals having a speed of between 7 and 25 gigatransfers per second (GT/s). In some cases, GT/s may refer to a number of operations (e.g., transmission of digital data such as the data signal herein) transferring data that occur in each second in some given data transfer channel such as a channel provided by zone 102 or 104; or may refer to a sample rate, i.e. the number of data samples captured per second, each sample normally occurring at the clock edge. 1 GT/s is $10^9$ or one billion transfers per second.

In some cases, the vertical ground shielding structures improve (e.g., reduce) crosstalk (e.g., as compared to the same package but without any of the structures) from very low frequency transfer such as from 50 megatransfers per second (MT/s) to greater than 40 GT/s (or up to between 40 and 50 GT/s).

Figure 5A:
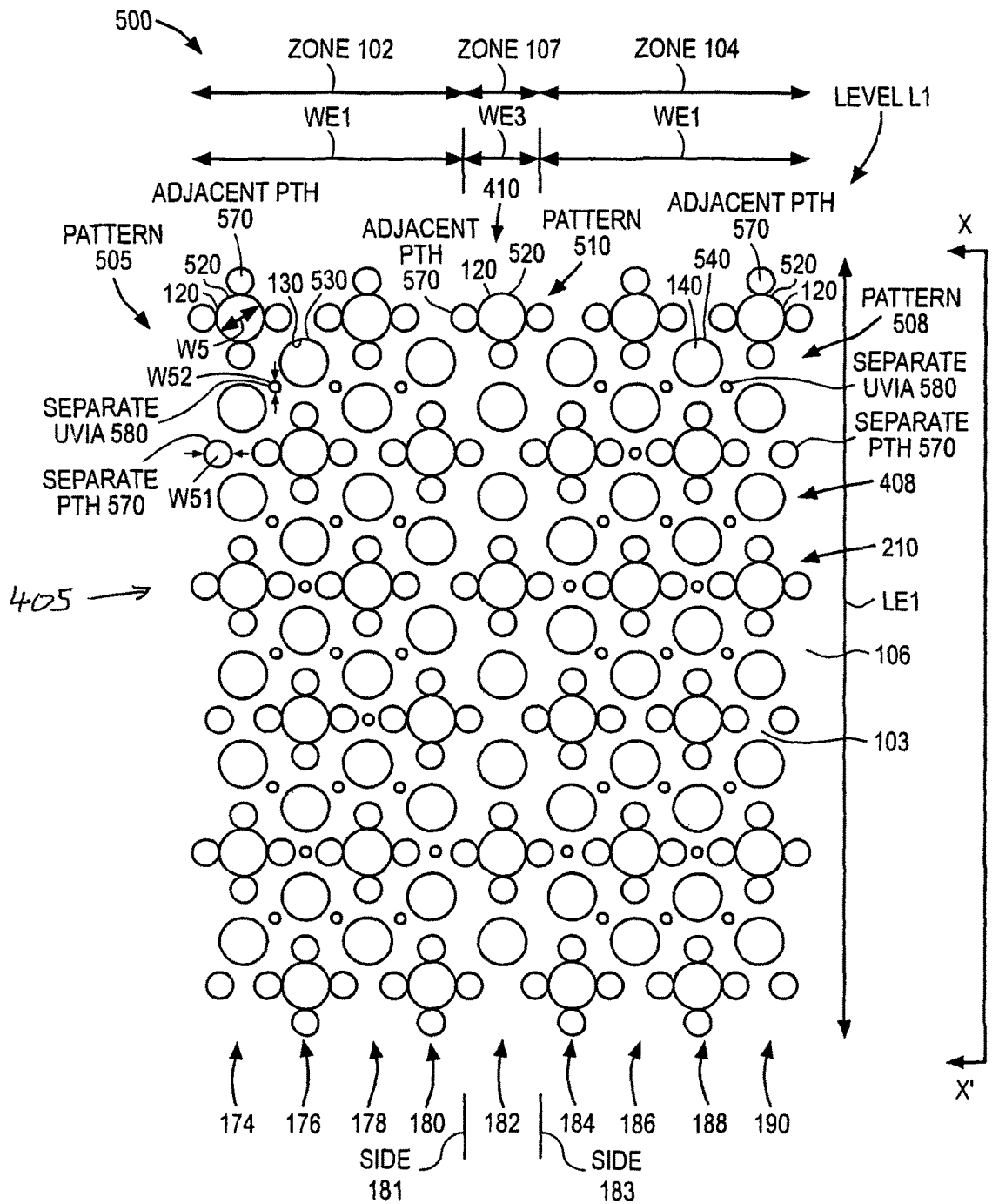
FIG. 5A is a schematic cross-sectional top view of the semiconductor package device of FIG. 3A showing interconnect levels below level L1 with isolation interconnects and adjacent isolation plated through holes (PTH) forming shielding patterns in different zones.

FIG. 5A is a schematic cross-sectional top view of the semiconductor package device of FIG. 3A showing interconnect levels below level L1 with isolation interconnects and adjacent isolation plated through holes (PTH) forming shielding patterns in different zones. FIG. 5A shows package device 500 as a cross-sectional view from above first interconnect level L1 with upper layer 210 having upper (e.g., top or first) layer ground isolation contacts 120, having upper layer receive data signal contacts 130 and having upper layer transmit data signal contacts 140. Contacts 120, 130 and 140 are shown surrounded by dielectric layer 103 such as an electrically non-conductive or insulating material.

Device 500 has top surface 106, such as a surface of dielectric 103, upon or in which are formed (e.g., disposed) grounding contacts 120, receive signal contacts 130 and transmit contacts 140.

In some cases, device 500 is package device 400 of FIG. 3A. In other cases, device 400 has layers under level L1 or L2 that are different than those of device 500, such as by not having structures 570 and 580.

In some cases, grounding contacts 120, receive signal contacts 130 and transmit contacts 140 of device 500 or 501 may represent grounding contacts 120, receive signal contacts 130 and transmit contacts 140 of any one of device 100, 101, 400 or 401. In these cases, contacts 120 of any one of device 100, 101, 400 or 401 may have layers under level L1 or L2 include structures 570 and 580 as described for device 500 (e.g., in a pattern and physically attached to contacts 120 or via contacts thereof).

FIG. 5A shows package device 500 having a first interconnect level L1 with upper layer 210 having one row of upper (e.g., top or first) layer ground isolation contacts 120 forming pattern 410 in zone 107; having upper layer receive data signal contacts 130 and additional isolation contacts 120 forming a shielding pattern 405 in zone 102; and having upper layer transmit data signal contacts 140 and additional isolation contacts 120 forming a shielding pattern 408 in zone 104, such as described for device 400 of FIG. 3A.

Solder bumps may be formed on upper (e.g., top or first) layer ground isolation contacts 120 of pattern 410; upper layer receive data signal contacts 130 and isolation contacts 120 of pattern 405; and upper layer transmit data signal contacts 140 and isolation contacts 120 of pattern 408, of device 500 such as described for device 400 of FIG. 3A.

In some cases, instead of pattern 410, device 500 may have a double wide pattern of contacts 120 such as described for zone 109 of device 400 of FIG. 3A.

Device 500 may have contacts 130 formed onto or physically attached to a top surface of via contacts 132, ground isolation contacts 120 formed onto or physically attached to a top surface of via contacts 122, and contacts 140 formed onto or physically attached to a top surface of via contacts 142, such as described for device 400 of FIG. 3A.

FIG. 5A also shows device 500 having solid conductive material vertical (e.g., vertically extending through levels of device 500 below level L1) receive data signal interconnects 530, solid conductive material vertical transmit data signal interconnects 540, solid conductive material vertical ground signal interconnects 520, solid conductive material vertical ground plated through holes (PTH) 570, and solid conductive material vertical ground micro-vias (uVia) 580.

In some cases, interconnects 530 are a vertical extension of interconnect conductive material formed in levels below level L1, that extend below contacts 130 (and via contacts 132). For example, Level L1 may be formed on (e.g., physically connected to) a second, lower level L2 having a top layer interconnect contact (that may be less wide than top surface contact width W5) and a lower layer via contact as described for contacts 130 and 132. In some cases, interconnects 530 include contacts 130 and 132 as well as the vertical extension of interconnect conductive material formed in levels below level L1.

Such via contact of level L1 may be formed on the top interconnect contact of level L2. Level L2 may be formed on another lower level L3 of device 500 similar to level L1 being formed on level L2. Level L3 may be formed on a number of additional interconnect levels of device 500. There may be between 5 and 50 levels in device 500. In some case there are between 3 and 100 levels.

In some cases, interconnects 540 are a vertical extension of interconnect conductive material formed in levels below level L1, that extend below contacts 140 (and via contacts 142) such as described above for interconnects 530. In some cases, interconnects 540 include contacts 140 and 142 as well as the vertical extension of interconnect conductive material formed in levels below level L1.

In some cases, interconnects 520 are a vertical extension of interconnect conductive material formed in levels below level L1, that extend below contacts 120 (and via contacts 122). For example, Level L1 may be formed on (e.g., physically connected to) a second, lower level L2 having a top layer interconnect contact (that may be less wide than top surface contact width W5) and a lower layer via contact as described for contacts 120 and 122. In some cases, interconnects 520 include contacts 120 and 122 as well as the vertical extension of interconnect conductive material formed in levels below level L1. Such via contacts of level L1 may be formed on the top interconnect contact of level L2, which may be formed on another lower level L3 of device 500 such as described above for interconnects 530.

In some cases, PTH 570 are a vertical extension of interconnect conductive material formed in levels below level L1. For example, Level L1 may be formed on (e.g., physically connected to) a second, lower level L2 having a top layer PTH contact (that may have width W51 that is less wide than top surface contact width W5) and a lower layer PTH via contact as described for contacts 120 and 122. In some cases, PTH 570 do not include any contact on or at level L1, but are only the vertical extension of interconnect conductive material formed in levels below level L1. In some cases, PTHs 570 are physically and electrically connected to interconnects 520 through horizontal ground planes disposed in levels below level L1.

In some cases, PTH 570 begins with a PTH via contact of level L2 formed on the top interconnect PTH contact of level L3. PTH contacts of Level L3 may be formed on PTH contacts of another lower level L4 of device 500 similar to level L2 being formed on level L3. Level L4 may be formed on a number of additional interconnect levels of device 500.

In some cases, uVia 580 are a vertical extension of interconnect conductive material formed in levels below level L1. For example, Level L1 may be formed on (e.g., physically connected to) a second, lower level L2 having a top layer uVia contact (that may have width W52 that is less wide than width W51 and less than top surface contact width W5) and a lower layer uVia via contact as described for contacts 120 and 122. In some cases, uVia 580 do not include any contact on or at level L1, but are only the vertical extension of interconnect conductive material formed in levels below level L1. In some cases, uVias 580 are physically and electrically connected to interconnects 520 through horizontal ground planes disposed in levels below level L1.

In some cases, uVia 580 begins with a uVia via contact of level L2 formed on the top interconnect uVia contact of level L3. uVia contacts of Level L3 may be formed on uVia contacts of another lower level L4 of device 500 similar to level L2 being formed on level L3. Level L4 may be formed on a number of additional interconnect levels of device 500.

Each of interconnects 520 also has at least one widthwise adjacent (but not touching) and/or lengthwise adjacent (but not touching) solid conductive material vertical ground plated through hole (PTH) 570. Each PTH 570 may be widthwise adjacent (e.g., above or below in the top view)

interconnect 520; or lengthwise adjacent (e.g., left or right in the top view) of interconnect 520. For example, in some cases there is only one adjacent PTH 570, widthwise adjacent, above or below interconnect 520; or two lengthwise adjacent, left or right of interconnect 520. In some cases there are two or three adjacent as described for the one. In some cases there are four adjacent PTH 570, two widthwise adjacent, above and below interconnect 520; and two lengthwise adjacent, left and right of interconnect 520.

In addition, FIG. 5A shows separate (e.g., not adjacent to any of interconnects 520) solid conductive material vertical ground PTHs 570, and separate (e.g., not adjacent to any of interconnects 520) solid conductive material vertical ground uVias 580. The separate PTHs 570 and uVias 580 may be not widthwise adjacent (but not touching) or lengthwise adjacent (but not touching) any of interconnects 520.

PTHs 570 are shown having width (e.g., diameter) W51 which may be between 60 and 400 um. In some cases it may be between 180 and 270 um. PTHs 570 may have height (e.g., thickness) which may be between 50 and 800 um. In some cases it may be between 300 and 500 um. UVias 580 are shown having width (e.g., diameter) W52 which may be between 60 and 100 um. In some cases it may be between 70 and 90 um. UVias 580 may have height (e.g., thickness) which may be between 10 and 45 um. In some cases it may be between 25 and 30 um.

FIG. 5A shows package device 500 having interconnect levels below level L1 (and including level L1) with interconnects 530, interconnects 520 (including adjacent PTH 570), separate PTHs 570 and separate uVias 580 forming shielding pattern 505 in zone 102. It also shows device 500 having interconnect levels below level L1 (and including level L1) with interconnects 540, interconnects 520 (including adjacent PTHs 570), separate PTHs 570 and separate uVias 580 forming shielding pattern 508 in zone 104. It also shows device 500 having interconnect levels below level L1 (and including level L1) with interconnects 520 (including adjacent PTHs 570) forming shielding pattern 510 in zone 107. Interconnects 520, 530, and 540; PTH 570 and uVias 580 may be surrounded by dielectric layer 103 such as an electrically non-conductive or insulating material, except where they are physically attached to a ground plane, trace, signal line or other contact.

In some cases, shielding pattern 505 includes having each of interconnects 520 (including adjacent PTHs 570) (1) surrounded in a "first" hexagonal shape (with one corner to tip pointing lengthwise upwards along length LE1) by six of interconnects 530, or by as many of interconnects 530, as there are (e.g., as fit into) zone 102. This may include each of the six interconnects 530 disposed at a corner to tip of the hexagonal shape. In this case, pattern 505 may also include each of interconnects 520 (including adjacent PTHs 570) (2) surrounded in a "second" hexagonal shape (with one corner to tip pointing widthwise sideways along width WE1) by six of separate uVias 580 (or six of separate PTHs 570 and separate uVias 580), or by as many of separate PTHs 570 and separate uVias 580, as there are (e.g., as fit into) zone 102. This may include each of the separate PTHs 570 and/or separate uVias 580 disposed along a length or line of the hexagonal shape. In addition, in some cases, shielding pattern 505 includes having each of interconnects 520 (including adjacent PTHs 570) and each of interconnects 530 in pattern 405.

In some cases, shielding pattern 505 includes having each of interconnects 520 of zone 102 having two adjacent PTH widthwise adjacent (e.g., above and below in the top view) interconnect 520; two adjacent PTH lengthwise adjacent (e.g., left and right in the top view) of interconnect 520; six interconnects 530 (or as many as there are in zone 102) surrounding interconnect 520 at the corners of a hexagonal shape (with one corner to tip pointing lengthwise upwards along length LE1); and six separate PTHs 570 and/or separate uVias 580 (or as many as there are in zone 102) surrounding interconnect 520 at the sides of the hexagonal shape. Here also, in addition, in some cases, shielding pattern 505 includes having each of interconnects 520 (including adjacent PTHs 570) and each of interconnects 530 in pattern 405.

In some cases, pattern 505 includes only interconnects 530, interconnects 520 (including adjacent PTH 570), separate PTHs 570 and separate uVias 580; but no other interconnects (e.g., none of interconnects 540). Pattern 505 is shown having 20 interconnects 530, 12 interconnects 520 (including 48 adjacent PTH 570), 3 separate PTHs 570 and 21 separate uVias 580 forming shielding pattern 505 in zone 102. It can be appreciated that there may be more or fewer of these, such as by using separate PTHs 570 in place of the separate uVias 580; or vice versa.

Next, along the direction of width WE1, zone 107 includes pattern 510 having interconnects 520 along length LE1. Pattern 510 is discussed further below with respect to zones 102 and 104.

In some cases, shielding pattern 508 includes having each of interconnects 520 (including adjacent PTHs 570) (1) surrounded in a "first" hexagonal shape (with one corner to tip pointing lengthwise upwards along length LE1) by six of interconnects 540 (in place of 530), etc., as described for pattern 505 but have interconnects 540 in place of interconnects 530. In some cases, shielding pattern 508 includes having each of interconnects 520 (including adjacent PTHs 570) (1) surrounded in a "second" hexagonal shape, as described for pattern 505 but have interconnects 540 in place of interconnects 530. In addition, in some cases, shielding pattern 508 includes having each of interconnects 520 (including adjacent PTHs 570) and each of interconnects 540 in pattern 408.

In some cases, shielding pattern 508 includes having each of interconnects 520 of zone 104 having two adjacent PTH widthwise adjacent (e.g., above and below in the top view) interconnect 520; two adjacent PTH lengthwise adjacent (e.g., left and right in the top view) of interconnect 520; six interconnects 540 (in place of 530), etc., as described for pattern 505 but have interconnects 540 in place of interconnects 530. Here also, in addition, in some cases, shielding pattern 508 includes having each of interconnects 520 (including adjacent PTHs 570) and each of interconnects 540 in pattern 408.

In some cases, pattern 508 includes only interconnects 540, interconnects 520 (including adjacent PTH 570), separate PTHs 570 and separate uVias 580; but no other interconnects (e.g., none of interconnects 530). Pattern 508 is shown having 20 interconnects 540, 12 interconnects 520 (including 48 adjacent PTH 570), 3 separate PTHs 570 and 21 separate uVias 580 forming shielding pattern 508 in zone 104. It can be appreciated that there may be more or fewer of these, such as by using separate PTHs 570 in place of the separate uVias 580; or vice versa.

In some cases, any of interconnects 520, adjacent PTHs 570, separate PTHs 570, or separate uVias 580 may each be described as "vertically extending grounding structures" that are horizontally adjacent to (side by side, and surrounding on at least 4 sides of a hexagon shape) vertically extending data signal interconnects (e.g., interconnects 530 and 540). Here, the vertically extending grounding structures and the vertically extending data signal interconnects and are vertically extending along interconnect levels of device 500. In some cases, shielding pattern 505 includes having each of interconnects 530 of zone 102 having at least four of adjacent PTHs 570, separate PTHs 570, or separate uVias 580 surrounding interconnect 530 at the corners and along one length of a pentagonal shape. In some cases, shielding pattern 508 includes having each of interconnects 540 of zone 104 having at least four of adjacent PTHs 570, separate PTHs 570, or separate uVias 580 surrounding interconnect 540 at the corners and along one length of a pentagonal shape.

Ground signal interconnects 520 are shown having pattern 510 in zone 107. Pattern 510 may include having ground signal interconnects 520 in fifth row 182 in zone 107. In some cases, shielding pattern 510 includes having each of interconnects 520 including between one and three adjacent PTHs 570.

In some cases, shielding pattern 510 includes having a lengthwise first (e.g., topmost) interconnect 520 having two widthwise adjacent PTHs 570, one to the left and one to the right; a lengthwise second (e.g., below the topmost) interconnect 520 having one lengthwise adjacent PTHs 570 above the interconnect (e.g., between the second and first interconnects); a lengthwise third (e.g., below the second) interconnect 520 having one lengthwise adjacent PTHs 570 below the interconnect (e.g., between the third and a fourth interconnects) and having no adjacent PTHs 570 between the second and third interconnects; a lengthwise fourth (e.g., below the third) interconnect 520 having having two widthwise adjacent PTHs 570, one to the left and one to the right; a lengthwise fifth (e.g., below the fourth) interconnect 520 having one lengthwise adjacent PTHs 570 above the interconnect (e.g., between the fifth and fourth interconnects); a lengthwise sixth (e.g., below the fifth) interconnect 520 having one lengthwise adjacent PTHs 570 below the interconnect (e.g., between the sixth and seventh interconnects) and having no adjacent PTHs 570 between the fifth and sixth interconnects; a lengthwise seventh (e.g., below the sixth) interconnect 520 having having two widthwise adjacent PTHs 570, one to the left and one to the right; a lengthwise eighth (e.g., below the seventh) interconnect 520 having one lengthwise adjacent PTHs 570 above the interconnect (e.g., between the seventh and eighth interconnects). In addition, in some cases, shielding pattern 510 includes having each of interconnects 520 (including adjacent PTHs 570) in pattern 410.

In some cases, shielding pattern 510 includes having a lengthwise first (e.g., topmist) interconnect 520 having one lengthwise adjacent PTHs 570 below the interconnect (e.g., between the first and a second interconnects); a lengthwise second (e.g., below the first) interconnect 520 having having two widthwise adjacent PTHs 570, one to the left and one to the right; a lengthwise third (e.g., below the second) interconnect 520 having one lengthwise adjacent PTHs 570 above the interconnect (e.g., between the second and third interconnects); and then repeating this sequence until length LE1 of zone 107 is full of interconnects 520. Here also, in addition, in some cases, shielding pattern 510 includes having each of interconnects 520 (including adjacent PTHs 570) in pattern 410.

In some cases, pattern 510 includes only interconnects 520 (including adjacent PTH 570); but no other interconnects (e.g., none of interconnects 530 or 140), and no separate PTHs 570 or separate uVias 580. Pattern 510 is shown having 8 interconnects 520 (including 11 adjacent PTH 570) in zone 107. It can be appreciated that there may be more or fewer of these, such as by adding adjacent PTHs 570 lengthwise between all of interconnects 520.

In some cases, any of interconnects 520, and adjacent PTHs 570 may each be described as "vertically extending grounding structures" that are horizontally adjacent to (side by side, and surrounding on 1 to 3 sides of a hexagon shape) vertically extending data signal interconnects (e.g., interconnects 530 and 540 of zones 102 and 104). Here, the vertically extending grounding structures and the vertically extending data signal interconnects and are vertically extending along interconnect levels of device 500. In some cases, shielding pattern 510 includes having each of interconnects 520 of zone 107 having one to two of adjacent PTHs 570, no separate PTHs 570, and no separate uVias 580 widthwise between all of interconnect 530 of zone 102 and widthwise adjacent ones of interconnects 540 of zone 104.

In some cases, instead of pattern 510, device 500 may have a double wide pattern of interconnects 520 such as described for zone 109 of FIGS. 1B and 2B. In this case, the pattern may include having two widthwise adjacent ones of interconnects 520, each including between one and three adjacent PTHs 570 as noted above. Here also, in addition, in some cases, this pattern includes having each of interconnects 520 (including adjacent PTHs 570) in a double wide pattern of interconnects 520 such as described for zone 109 of FIGS. 1B and 2B.

Figure 5B:
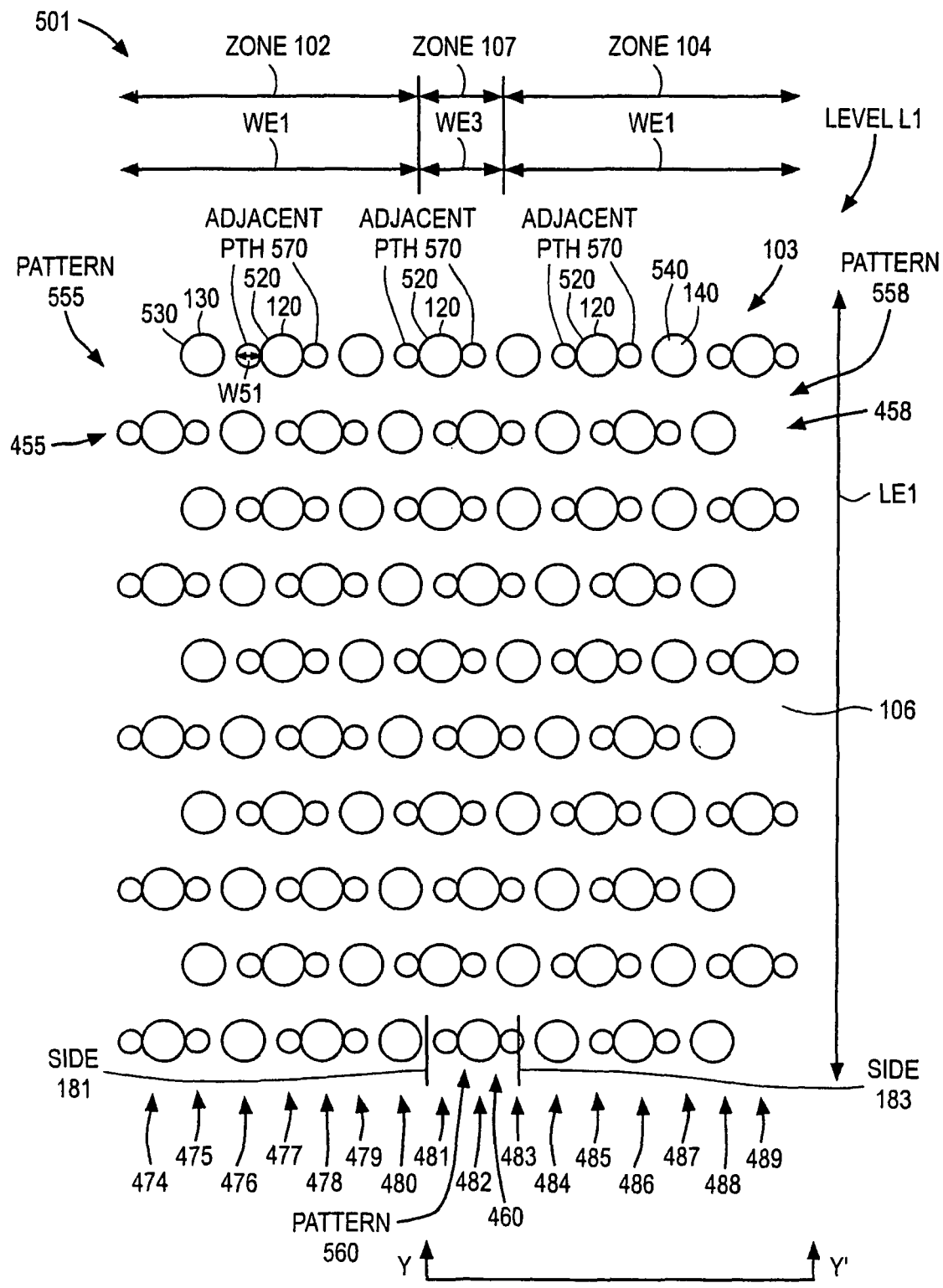
FIG. 5B is a schematic cross-sectional top view of the semiconductor package device of FIG. 3B showing interconnect levels below level L1 with isolation interconnects and adjacent isolation plated through holes (PTH) forming shielding patterns in different zones.

FIG. 5B is a schematic cross-sectional top view of the semiconductor package device of FIG. 3B showing interconnect levels below level L1 with isolation interconnects and adjacent isolation plated through holes (PTH) forming shielding patterns in different zones. FIG. 5B shows package device 501 having interconnect levels below level L1 (and including level L1) with interconnects 530, interconnects 520 (including adjacent PTH 570) forming shielding pattern 555 in zone 102. It also shows device 501 having interconnect levels below level L1 (and including level L1) with interconnects 540, interconnects 520 (including adjacent PTHs 570) forming shielding pattern 558 in zone 104. It also shows device 500 having interconnect levels below level L1 (and including level L1) with interconnects 520 (including adjacent PTHs 570) forming shielding pattern 560 in zone 107. Interconnects 520, 530, and 540; PTH 570 and uVias 580 may be surrounded by dielectric layer 103 such as an electrically non-conductive or insulating material, except where they are physically attached to a ground plane, trace, signal line or other contact.

In some cases, shielding pattern 555 includes having each of interconnects 520 (including two widthwise adjacent PTHs 570) widthwise adjacent and between two of interconnects 530. This may include each of interconnects 520 having as many of the two widthwise adjacent PTHs 570 (e.g., one to the left and one to the right), as there are (e.g., as fit into) zone 102. This may include no separate PTHs 570 or separate uVias in pattern 555; and interconnects 520 of pattern 555 not having any lengthwise adjacent PTHs 570. In addition, in some cases, shielding pattern 555 includes having each of interconnects 520 (including adjacent PTHs 570) and each of interconnects 530 in pattern 455.

In some cases, shielding pattern 555 includes each of interconnects 530 surrounded by four of adjacent PTHs 570 in a diamond shape (with one corner to tip pointing lengthwise upwards along length LE1), or by as many of adjacent PTHs 570, as there are (e.g., as fit into) zone 102. This may include each of the four adjacent PTHs 570 disposed at a corner to tip of the diamond shape. In addition, in some cases, shielding pattern 555 includes having each of interconnects 520 (including adjacent PTHs 570) and each of interconnects 530 in pattern 455.

In some cases, pattern 555 includes only interconnects 530, and interconnects 520 (including adjacent PTH 570); but no other interconnects (e.g., none of interconnects 540), no separate PTHs 570 and no separate uVias 580. Pattern 555 is shown having 20 interconnects 530, and 15 interconnects 520 (including 30 adjacent PTH 570) forming shielding pattern 555 in zone 102. It can be appreciated that there may be more or fewer of these, such as by excluding or not having the left widthwise adjacent PTHs 570 of interconnects 520 in row 474. In this case there are only 25 adjacent PTHs 570.

Next, along the direction of width WE1, zone 107 includes pattern 560 having interconnects 520 along length LE1. Pattern 560 is discussed further below with respect to zones 102 and 104.

In some cases, shielding pattern 558 includes having each of interconnects 520 (including two widthwise adjacent PTHs 570) widthwise adjacent and between two of interconnects 540 (in place of 530), etc., as described for pattern 555 but having interconnects 540 in place of interconnects 530. In addition, in some cases, shielding pattern 558 includes having each of interconnects 520 (including adjacent PTHs 570) and each of interconnects 540 in pattern 458.

In some cases, shielding pattern 558 includes each of interconnects 540 surrounded by four of adjacent PTHs 570 in a diamond shape (with one corner to tip pointing lengthwise upwards along length LE1), or by as many of adjacent PTHs 570, as there are (e.g., as fit into) zone 104. This may include each of the four adjacent PTHs 570 disposed at a corner to tip of the diamond shape. In addition, in some cases, shielding pattern 558 includes having each of interconnects 520 (including adjacent PTHs 570) and each of interconnects 540 in pattern 458.

In some cases, pattern 558 includes only interconnects 540, and interconnects 520 (including adjacent PTH 570); but no other interconnects (e.g., none of interconnects 530), no separate PTHs 570 and no separate uVias 580. Pattern 558 is shown having 20 interconnects 540, and 15 interconnects 520 (including 30 adjacent PTH 570) forming shielding pattern 558 in zone 102. It can be appreciated that there may be more or fewer of these, such as by excluding or not having the right widthwise adjacent PTHs 570 of interconnects 520 in row 489. In this case there are only 25 adjacent PTHs 570.

In some cases, any of interconnects 520, adjacent PTHs 570 may each be described as "vertically extending grounding structures" that are horizontally adjacent to (side by side, and surrounding on at least 3 sides of a diamond shape) vertically extending data signal interconnects (e.g., interconnects 530 and 540). Here, the vertically extending grounding structures and the vertically extending data signal interconnects and are vertically extending along interconnect levels of device 501. In some cases, shielding pattern 555 includes having each of interconnects 530 of zone 102 having at least three of adjacent PTHs 570 surrounding interconnect 530 at the corners of a diamond shape (e.g., having a point or corner lengthwise upwards). In some cases, shielding pattern 558 includes having each of interconnects 540 of zone 102 having at least three of adjacent PTHs 570 surrounding interconnect 540 at the corners of a diamond shape (e.g., having a point or corner lengthwise upwards).

Ground signal interconnects 520 are shown having pattern 560 in zone 107. Pattern 560 may include having each of interconnects 520 (including two widthwise adjacent PTHs 570) widthwise adjacent and between one of interconnects 530 of zone 102 and a widthwise adjacent one of interconnects 540 of zone 104. This may include each of interconnects 520 having as many of the two widthwise adjacent PTHs 570 (e.g., one to the left and one to the right), as there are (e.g., as fit into) zone 107. In some cases, this may include each of interconnects 520 of row 481 having a left widthwise adjacent PTHs 570 extending into zone 102 (e.g., optionally into pattern 555). In some cases, this may include each of interconnects 520 of row 482 having a right widthwise adjacent PTHs 570 extending into zone 104 (e.g., optionally into pattern 558). This may include no separate PTHs 570 or separate uVias in pattern 560; and interconnects 520 of pattern 560 not having any lengthwise adjacent PTHs 570. In addition, in some cases, shielding pattern 560 includes having each of interconnects 520 (including adjacent PTHs 570) in pattern 460.

In some cases, pattern 560 includes only interconnects 520 (including adjacent PTH 570); but no other interconnects (e.g., none of interconnects 530 or 140), and no separate PTHs 570 or separate uVias 580. Pattern 560 is shown having 10 interconnects 520 (including 20 adjacent PTH 570) in zone 107. It can be appreciated that there may be more or fewer of these, such as by adding adjacent PTHs 570 lengthwise between all of interconnects 520.

In some cases, any of interconnects 520, and adjacent PTHs 570 may each be described as "vertically extending grounding structures" that are horizontally adjacent to (side by side, and surrounding on 1 to 3 sides of a diamond shape) vertically extending data signal interconnects (e.g.; interconnects 530 and 540 of zones 102 and 104). Here, the vertically extending grounding structures and the vertically extending data signal interconnects and are vertically extending along interconnect levels of device 501. In some cases, shielding pattern 560 includes having each of interconnects 520 of zone 107 having two of adjacent PTHs 570, no separate PTHs 570, and no separate uVias 580 widthwise between all of interconnect 530 of zone 102 and widthwise adjacent ones of interconnects 540 of zone 104.

Figure 6A:
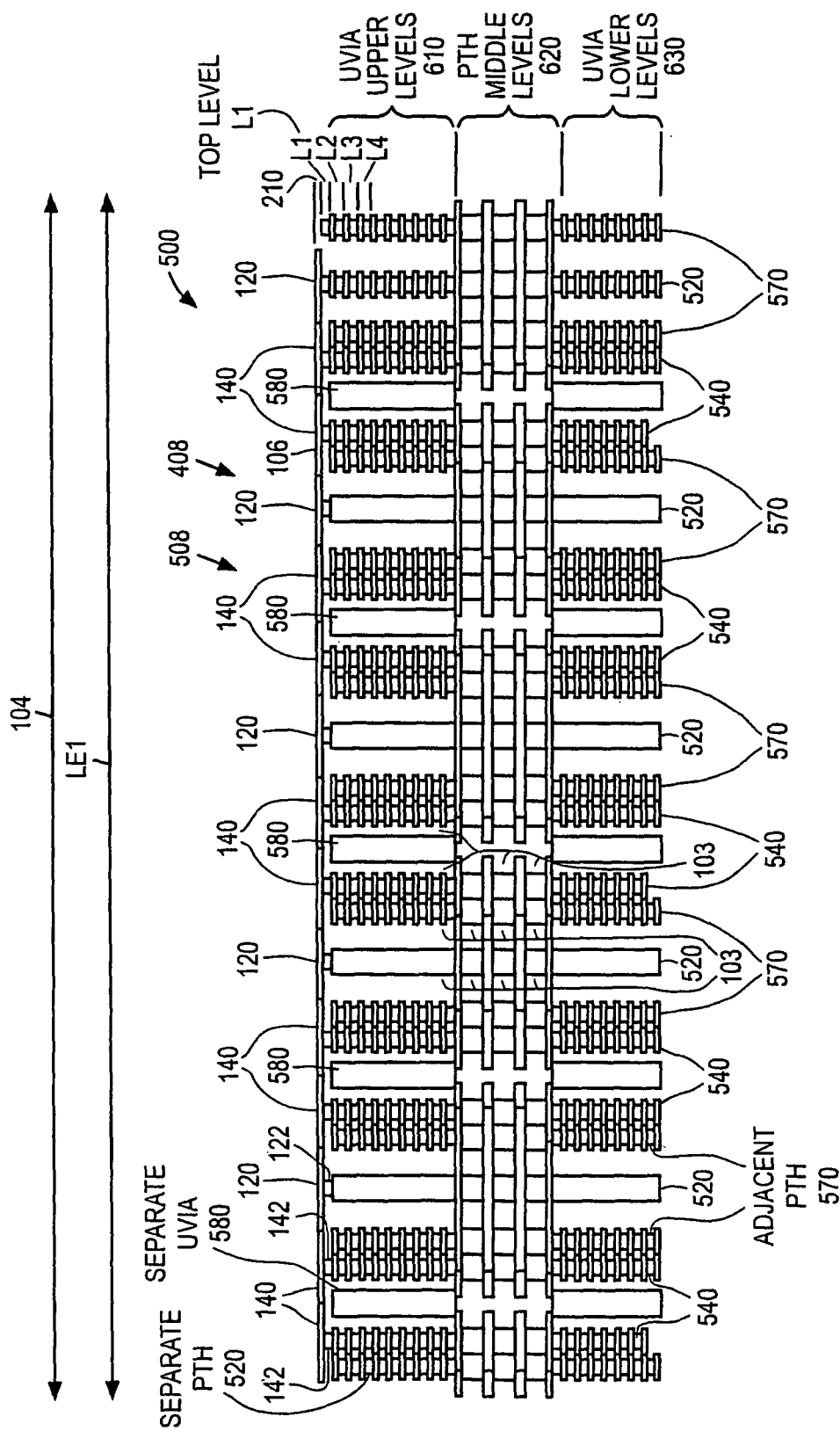
FIG. 6A is a schematic cross-sectional side view of the package of FIG. 5A showing vertically extending ground isolation signal interconnects, vertically extending adjacent plated through holes (PTHs), vertically extending separate PTHs, vertically extending separate micro-vias (uVias), and vertically extending data signal interconnects forming different shielding patterns in different zones.

FIG. 6A is a schematic cross-sectional side view of the package of FIG. 5A showing vertically extending ground isolation signal interconnects, vertically extending adjacent PTHs, vertically extending separate PTHs, vertically extending separate uVias 580, and vertically extending data signal interconnects forming different shielding patterns in different zones. FIG. 6A shows package device 500 as a cross-sectional view from perspective X-X' of FIG. 5A. FIG. 6A shows package device 500 (e.g., a vertically shielded vertical data signal interconnect package device) having a multiple vertical interconnect levels (e.g., level L1, levels 610, levels 620 and levels 630) having vertically extending ground isolation signal interconnects 520 (e.g., including contacts 120) each including a plurality of vertically extending adjacent PTHs 570, vertically extending separate PTHs 570, vertically extending separate uVias 580, and vertically extending transmit data signal interconnects 540 (e.g., including contacts 140) forming shielding pattern 508 in zone 104. It can be appreciated that the descriptions for multiple vertical interconnect levels (e.g., level L1, levels 610, levels 620 and levels 630) having pattern 508 in zone 104 also apply to multiple vertical interconnect levels (e.g., level L1, levels 610, levels 620 and levels 630) having the vertically extending ground isolation signal interconnects 520 (e.g., including contacts 120) each including a plurality of vertically extending adjacent PTHs 570, vertically extending separate PTHs 570, vertically extending separate uVias 580, and vertically extending transmit data signal interconnects 530 (e.g., including contacts 130) forming a shielding pattern 505 in zone 102. Similarly, it can be appreciated that the descriptions for multiple vertical interconnect levels (e.g., level L1, levels 610, levels 620 and levels 630) having pattern 508 in zone 104 also apply to multiple vertical interconnect levels (e.g., level L1, levels 610, levels 620 and levels 630) having the vertically extending ground isolation signal interconnects 520 (e.g., including contacts 120) each including at least one vertically extending adjacent PTH 570 forming shielding pattern 510 in zone 107 located beside and between the zone 102 and zone 104.

FIG. 6A shows package device 500 top or topmost (e.g., first level) interconnect level L1 is formed over (e.g., onto and physically connected to) second level interconnect level L2, which is formed over third interconnect level L3, which is formed over fourth interconnect level L4, which is formed over uVia upper levels 610, which is formed over PTH middle levels 620, which is formed over uVia lower levels 630.

In some cases, adjacent and separate PTHs 570 and separate uVias 580 are a vertical interconnects of interconnect conductive material formed in (e.g., that extend) levels below level L1, and that horizontally surround interconnects 520 on at least one side (or two or three or four), as interconnects 520 (e.g., extending below contacts 120 and via contacts 122). For example, Level L2 (and level L3) may include (a top or first level of) uVias 580 (or optionally PTH 570) formed on (e.g., physically connected to) lower levels (e.g., level L3 plus) having a top layer uVia (or optionally PTH 570) interconnect contact and a lower layer uVia (or optionally PTH 570) interconnect contact (e.g., as described for contacts 120 and 122).

Such via contacts of level L2 may be formed on the top layer uVia (or optionally PTH 570) interconnect contact of level L3, which may be formed on another lower level L4 of device 500 such as described above for interconnects 520. Below or at level L2, PTHs 570 and uVias 580 may be physically connected to interconnects 520 (and contacts 120 and optionally bumps 124) through or by one or more of solid conductive material horizontal ground planes (e.g., not shown but such as described for plane 160). It can be appreciated that such planes may include plane 160, and planes located on levels other than level L3, such as level L4, levels 610, levels 620 and levels 630. In can be appreciated that the planes may exist on only some of such as level L4, levels 610, levels 620 and levels 630.

In some cases, FIG. 6A shows package device 500 having vertical top level L1 (e.g., layer 210) including surface contacts 120 of the ground isolation signal interconnects 520, and surface contacts 140 of the transmit data signal interconnects 540 (which in some cases can represent surface contacts 130 of the receive data signal interconnect 530). FIG. 6A shows level L1 physically attached to (formed over and conductively electrically attached to such as with zero resistance) lower vertically extending (disposed) micro via upper levels 610 (e.g., including levels L2-L4).

FIG. 6A shows micro via upper levels 610 including uVia upper levels of the ground isolation signal interconnects 520, uVia upper levels of the transmit data signal interconnects 540 (which in some cases can represent uVia upper levels of the receive data signal interconnects 530), uVia upper levels of the adjacent PTHs 570, uVia upper levels of the separate PTHs 570, and uVia upper levels of the separate uVias 580.

FIG. 6A shows micro via upper levels 610 physically attached to lower vertically extending plated through hole (PTH) middle levels 620. FIG. 6A shows PTH middle levels 620 including PTH middle levels of the ground isolation signal interconnects 520, PTH middle levels of the transmit data signal interconnects (which in some cases can represent PTH middle levels of the receive data signal interconnects 530), PTH middle levels of the adjacent PTHs 570, and PTH middle levels of the separate PTHs 570, but not PTH middle levels of the separate uVias 580.

FIG. 6A shows PTH middle levels 620 is physically attached to lower vertically extending micro via lower levels 630. FIG. 6A shows micro via lower levels 630 including uVia lower levels of the ground isolation signal interconnects 520, uVia lower levels of the transmit data signal interconnects (which in some cases can represent uVia lower levels of the receive data signal interconnects), uVia lower levels of the adjacent PTHs 570, uVia lower levels of the separate PTHs 570, and uVia lower levels of the separate uVias 580.

Although not shown in FIG. 6A, in some cases, the upper, middle and lower level adjacent PTHs 570, separate PTHs 570, and separate uVias 580 are physically attached to (formed with or on the same layer; and conductively electrically attached to such as with zero resistance) the ground isolation signal interconnects 520 by horizontally adjacent ground isolation planes of the upper, middle and lower levels (e.g., such as described for layer 160). Such ground planes may extend horizontally through and form such physically connections at 2 or more levels of device 500 that are below level L1. In some cases they extend through and form such physically connections at between 10 and 30 levels of device 500 that are below level L1. In some cases they extend through and form such physically connections at between 15 and 25 levels of device 500 that are below level L1.

Figure 6B:
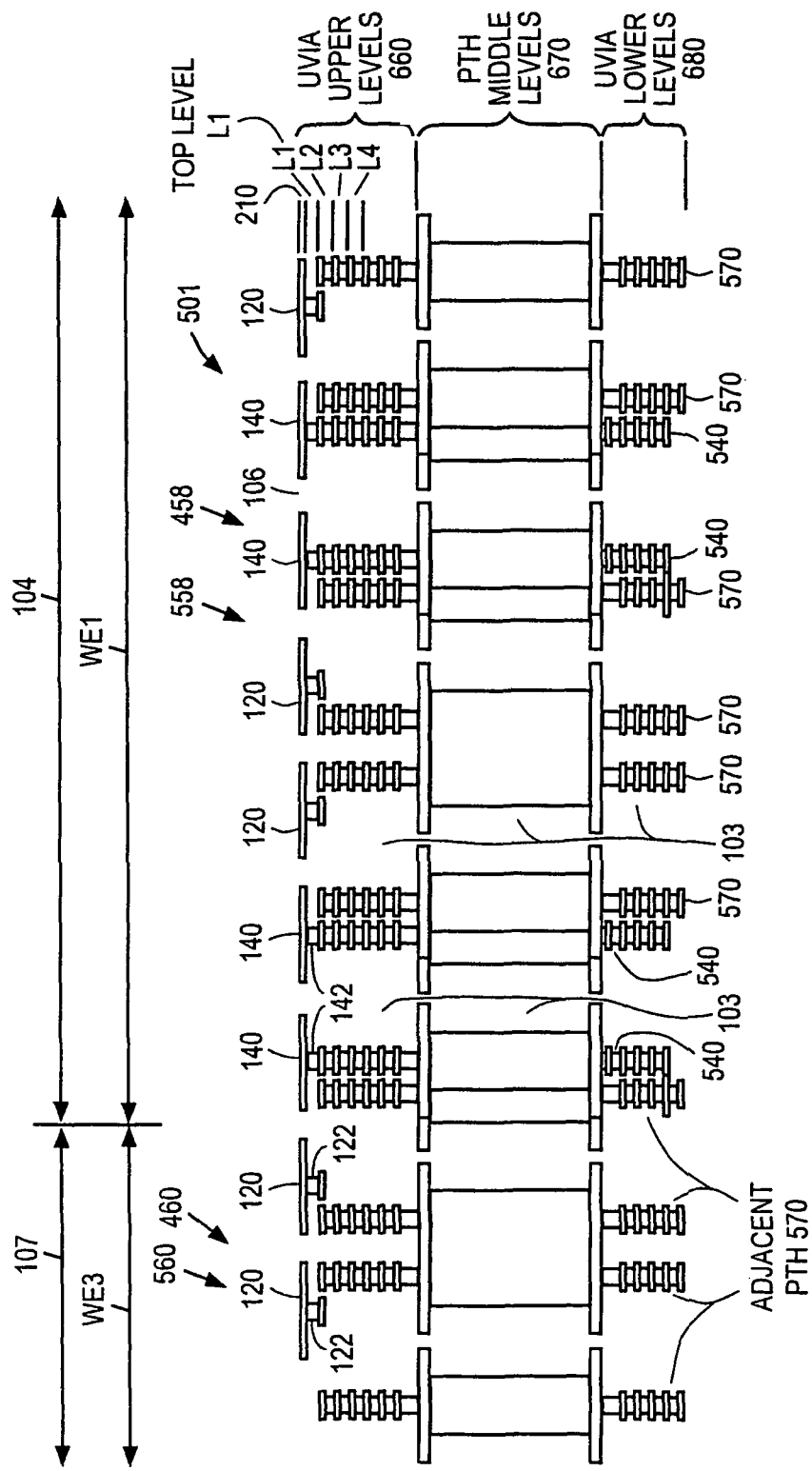
FIG. 6B is a schematic cross-sectional side view of the package of FIG. 5B showing vertically extending ground isolation signal interconnects, vertically extending adjacent PTHs, and vertically extending data signal interconnects forming different shielding patterns in different zones.

FIG. 6B is a schematic cross-sectional side view of the package of FIG. 5B showing vertically extending ground isolation signal interconnects, vertically extending adjacent PTHs, and vertically extending data signal interconnects forming different shielding patterns in different zones. FIG. 6B shows package device 501 as a cross-sectional view from perspective Y-Y' of FIG. 5B. FIG. 6B shows package device 501 (e.g.; a vertically shielded vertical data signal interconnect package device) having a multiple vertical interconnect levels (e.g., level L1, levels 660, levels 670 and levels 680) having vertically extending ground isolation signal interconnects 520 (e.g., not shown but formed below and including contacts 120) each including vertically extending adjacent PTHs 570, and vertically extending transmit data signal interconnects 540 (e.g., including contacts 140) forming shielding pattern 558 in zone 104. It can be appreciated that the descriptions for multiple vertical interconnect levels (e.g., level L1, levels 660, levels 670 and levels 680) having pattern 558 in zone 104 also apply to multiple vertical interconnect levels (e.g., level L1, levels 660, levels 670 and levels 680) having the vertically extending ground isolation signal interconnects 520 (e.g., not shown but formed below and including contacts 120) each including vertically extending adjacent PTHs 570, and vertically extending transmit data signal interconnects 530 (e.g., including contacts 130) forming a shielding pattern 555 in zone 102. FIG. 6B also shows package device 501 having multiple vertical interconnect levels (e.g., level L1, levels 660, levels 670 and levels 680) having the vertically extending ground isolation signal interconnects 520 (e.g., not shown but formed below and including contacts 120) each including at least, one vertically extending adjacent PTH 570 forming shielding pattern 560 in zone 107 located beside and between the zone 102 and zone 104.

FIG. 6B shows package device 501 top or topmost (e.g., first level) interconnect level L1 is formed over second level interconnect level L2, which is formed over third interconnect level L3, which is formed over fourth interconnect level L4, which is formed over uVia upper levels 660, which is formed over PTH middle levels 670, which is formed over uVia lower levels 680. In some cases, adjacent and separate PTHs 570 and separate uVias 580 are a vertical interconnects of interconnect conductive material formed in (e.g., that extend) levels L2, L3, L4 as described for FIG. 6A.

Below or at level L2, PTHs 570 and uVias 580 may be physically connected to interconnects 520 (and contacts 120 and optionally bumps 124) through or by one or more of solid conductive material horizontal ground planes (e.g., not shown but such as described for plane 160) as described for FIG. 6A.

In some cases, FIG. 6B shows package device 501 having vertical top level L1 (e.g., layer 210) including surface contacts 120, 130 and 140 of signal interconnects 520, 530 and 540 as described for FIG. 6A. Level L1 may be physically attached to micro via upper levels 660 as described for Level L1 attached to levels 610 of FIG. 6A.

FIG. 6B shows micro via upper levels 660 including uVia upper levels of the ground isolation signal interconnects 520 (not shown but formed below contacts 120, such as shown for FIG. 6A), uVia upper levels of the transmit data signal interconnects 540 (which in some cases can represent uVia upper levels of the receive data signal interconnects 530), and uVia upper levels of the adjacent PTHs 570.

FIG. 6B shows micro via upper levels 660 physically attached to lower vertically extending plated through hole (PTH) middle levels 670. FIG. 6B shows PTH middle levels 620 including PTH middle levels of the ground isolation signal interconnects 520 (not shown but formed below contacts 120, such as shown for FIG. 6A), PTH middle levels of the transmit data signal interconnects (which in some cases can represent PTH middle levels of the receive data signal interconnects 530), and PTH middle levels of the adjacent PTHs 570.

FIG. 6B shows PTH middle levels 670 is physically attached to lower vertically extending micro via lower levels 680. FIG. 6B shows micro via lower levels 680 including uVia lower levels of the ground isolation signal interconnects 520 (not shown but formed below contacts 120, such as shown for FIG. 6A), uVia lower levels of the transmit data signal interconnects (which in some cases can represent uVia lower levels of the receive data signal interconnects), and uVia lower levels of the adjacent PTHs 570.

Although not shown in FIG. 6B, in some cases, the upper, middle and lower level adjacent PTHs 570, separate PTHs 570, and separate uVias 580 are physically attached to (formed with or on the same layer; and conductively electrically attached to such as with zero resistance) the ground isolation signal interconnects 520 by horizontally adjacent ground isolation planes of the upper, middle and lower levels (e.g., such as described for layer 160). Such ground planes may extend horizontally through and form such physically connections at 2 or more levels of device 501 that are below level L1. In some cases they extend through and form such physically connections at between 8 and 28 levels of device 501 that are below level L1. In some cases they extend through and form such physically connections at between 12 and 20 levels of device 501 that are below level L1.

It can be appreciated that although FIG. 6B shows a left one of each pair of horizontally adjacent transmit data signal interconnects 540 (which in some cases can represent PTH middle levels of the receive data signal interconnects 530) proximal to the right one of the pair (which is distal), in an actual view from perspective Y-Y', the right one of the pair would be proximal and the left one distal. However, both patterns, as well as other patterns as noted for FIG. 5B are considered.

In some cases (thought not shown in FIGS. 6A-B), similar to descriptions for FIGS. 2A and 3A (and 2B and 3B) solder bumps 124 may be formed on (e.g., physically attached to) upper (e.g., top or first) layer ground isolation contacts 120 of patterns 510 (and 560); bumps 134 may be formed on upper layer receive data signal contacts 130 and isolation contacts 120 of patterns 505 (and 555); and bumps 144 and 124 may be formed on upper layer transmit data signal contacts 140 and isolation contacts 120 of patterns 508 (and 558).

In some cases (thought not shown in FIG. 6A), solder bumps 124, 134 and 144 of FIG. 6A, are attached to contacts 120, 130 and 140 of another vertically shielded vertical data signal interconnect package device (e.g., interposer 806 at location 807) having vertically extending ground isolation signal interconnects, vertically extending adjacent PTHs, vertically extending separate PTHs (but not vertically extending separate uVias 580), and vertically extending data signal interconnects forming different shielding patterns 505, 508 and 510 in zones 102, 104 and 107. The other package device may have multiple vertical interconnect levels (e.g., level L1, and levels 620; but not levels 610 or levels 630) having vertically extending ground isolation signal interconnects 520 (e.g., including contacts 120) each including a plurality of vertically extending adjacent PTHs 570, vertically extending separate PTHs 570 (but not vertically extending separate uVias 580), and vertically extending transmit data signal interconnects 540 (e.g., including contacts 140) forming shielding pattern 508 in zone 104. It can be appreciated that the descriptions for multiple vertical interconnect levels (e.g., level L1, and levels 620; but not levels 610 or levels 630) having pattern 508 in zone 104 also apply to multiple vertical interconnect (e.g., level L1, and levels 620; but not levels 610 or levels 630) having the vertically extending ground isolation signal interconnects 520 (e.g., including contacts 120) each including a plurality of vertically extending adjacent PTHs 570, vertically extending separate PTHs 570 (but not vertically extending separate uVias 580), and vertically extending transmit data signal interconnects 530 (e.g., including contacts 130) forming a shielding pattern 505 in zone 102. Similarly, it can be appreciated that the descriptions for multiple vertical interconnect levels (e.g., level L1, and levels 620; but not levels 610 or levels 630) having pattern 508 in zone 104 also apply to multiple vertical interconnect (e.g., level L1, and levels 620; but not levels 610 or levels 630) having the vertically extending ground isolation signal interconnects 520 (e.g., including contacts 120) each including at least one vertically extending adjacent PTH 570 forming shielding pattern 510 in zone 107 located beside and between the zone 102 and zone 104.

In some cases (thought not shown in FIG. 6B), solder bumps 124, 134 and 144 of FIG. 6B, are attached to contacts 120, 130 and 140 of another vertically shielded vertical data signal interconnect package device (e.g., interposer 806 at location 813) having vertically extending ground isolation signal interconnects, vertically extending adjacent PTHs, and vertically extending data signal interconnects forming different shielding patterns 555, 558 and 560 in zones 102, 104 and 107. The other package device may have multiple vertical interconnect levels (e.g., level L1, and levels 670; but not levels 660 or levels 680) having vertically extending ground isolation signal interconnects 520 (e.g., including contacts 120) each including two vertically extending adjacent PTHs 570, and vertically extending transmit data signal interconnects 540 (e.g., including contacts 140) forming shielding pattern 558 in zone 104. It can be appreciated that the descriptions for multiple vertical interconnect levels (e.g., level L1, and levels 670; but not levels 660 or levels 680) having pattern 558 in zone 104 also apply to multiple vertical interconnect (e.g., level L1, and levels 670; but not levels 660 or levels 680) having the vertically extending ground isolation signal interconnects 520 (e.g., including contacts 120) each including tow of vertically extending adjacent PTHs 570, and vertically extending transmit data signal interconnects 530 (e.g., including contacts 130) forming a shielding pattern 555 in zone 102. Similarly, it can be appreciated that the descriptions for multiple vertical interconnect levels (e.g., level L1, and levels 670; but not levels 660 or levels 680) having pattern 558 in zone 104 also apply to multiple vertical interconnect (e.g., level L1, and levels 670; but not levels 660 or levels 680) having the vertically extending ground isolation signal interconnects 520 (e.g., including contacts 120) each including two vertically extending adjacent PTH 570 forming shielding pattern 560 in zone 107 located beside and between the zone 102 and zone 104.

It can be appreciated that the concepts described above for vertically extending ground isolation signal interconnects 520, vertically extending adjacent PTHs 570, vertically extending separate PTHs 570, vertically extending separate uVias 580, and vertically extending data signal interconnects 530 and 540 forming different shielding patterns in different zones of FIGS. 6A-B, can also be applied to interconnects or interconnect stacks of devices 100, 101, 400, and 401. In some cases, grounding contacts 120, receive signal contacts 130 and transmit contacts 140 of devices 500 may represent vertically extending ground isolation signal interconnects 520 (having vertically extending adjacent PTHs 570), vertically extending receive data signal interconnects 530, and vertically extending transmit data signal interconnects 530 and 540 of any one of device 100, 101, 400 or 401.

In some cases, the solid conductive material vertical ground signal interconnects 520, (adjacent and/or separate) solid conductive material vertical ground plated through holes (PTH) 570, and separate solid conductive material vertical ground micro-vias (uVia) 580 provide an electrical ground isolation shields between zones 102 and 104 of levels L1, 610, 620, 630, 660, 670 and 680 that reduces "die bump field" crosstalk between solid conductive material vertical receive data signal interconnects 530 and solid conductive material vertical transmit data signal interconnects 540 zones 102 and 104 of levels L1, 610, 620, 630, 660, 670 and 680. In some cases, they reduce "die bump in-field" crosstalk between all (e.g., each pair of) adjacent ones of same type (e.g., RX or TX) of solid conductive material vertical receive data signal interconnects 530 or solid conductive material vertical transmit data signal interconnects 540 of levels L1, 610, 620, 630, 660, 670 and 680 by being between, surrounding or being surrounded by a type of data signal contacts of a zone (e.g., fields or clusters) 102 or 104 of levels L1, 610, 620, 630, 660, 670 and 680 (or as many of those levels as they exist in). Here "adjacent" may be horizontally adjacent (or widthwise adjacent) with respect to WE1, or lengthwise adjacent with respect to LE1 of FIGS. 5A-B and 6A-B.

In some cases, they reduce "die bump field" crosstalk as described for contacts 130 of zone 102 and contacts 140 of zone 104 for FIGS. 1A-B and 2A-B, but between interconnects 530 of zone 102 and interconnects 540 of zone 104 (e.g., of levels L1, 610, 620, 630, 660, 670 and 680). In some cases, they reduce "die bump in-field" crosstalk as described for contacts 130 of zone 102 or contacts 140 of zone 104 for FIGS. 3A-B and 5A-B, but between interconnects 530 of zone 102 or interconnects 540 of zone 104 (e.g., of levels L1, 610, 620, 630, 660, 670 and 680).

For example, by being conductive material electrically connected to the ground, solid conductive material vertical ground signal interconnects 520, (adjacent and/or separate) solid conductive material vertical ground plated through holes (PTH) 570, and separate solid conductive material vertical ground micro-vias (uVia) 580 may provide electrically grounded structure that absorbs, or shields electromagnetic crosstalk signals produced by one of solid conductive material vertical receive data signal interconnects 530 (e.g., of zone 102 or beyond side 181) from reaching a (horizontally, lengthwise, or widthwise) adjacent one of interconnects 530 or interconnects 540 (e.g., of zone 102 or zone 104), due to the amount of grounded conductive material, and location of the conductive grounded material adjacent to (e.g., between) that one of interconnects 530 and interconnects 530 or 540.

In some cases, solid conductive material vertical ground signal interconnects 520, (adjacent and/or separate) solid conductive material vertical ground plated through holes (PTH) 570, and separate solid conductive material vertical ground micro-vias (uVia) 580 reduce electrical crosstalk caused by undesired capacitive, inductive, or conductive coupling of a first signal received or transmitted through (or existing on) one of interconnects 530 effecting or being mirrored in a second signal received or transmitted through (or existing on) one of interconnects 540. Such electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one of interconnects 530 induces current a second data signal in one of interconnects 540. It can be appreciated that the descriptions above are also true for a first signal through interconnects effecting or being mirrored in a second signal received or transmitted through (or existing on) one of interconnects 530.

In some embodiments, any or each of solid conductive material vertical ground signal interconnects 520, (adjacent and/or separate) solid conductive material vertical ground plated through holes (PTH) 570, and separate solid conductive material vertical ground micro-vias (uVia) 580 reduce electrical crosstalk as noted above (1) without increasing the horizontal distance or spacing between any of (a) adjacent interconnects 530 or of zone 102; or (b) interconnects 540 of zone 104, (2) without increasing the distance or spacing between the any of levels L1, 610, 620, 630, 660, 670 and 680, (3) without re-ordering any of the contacts (or traces) noted above or levels L1, 610, 620, 630, 660, 670 and 680.

Figure 7A:
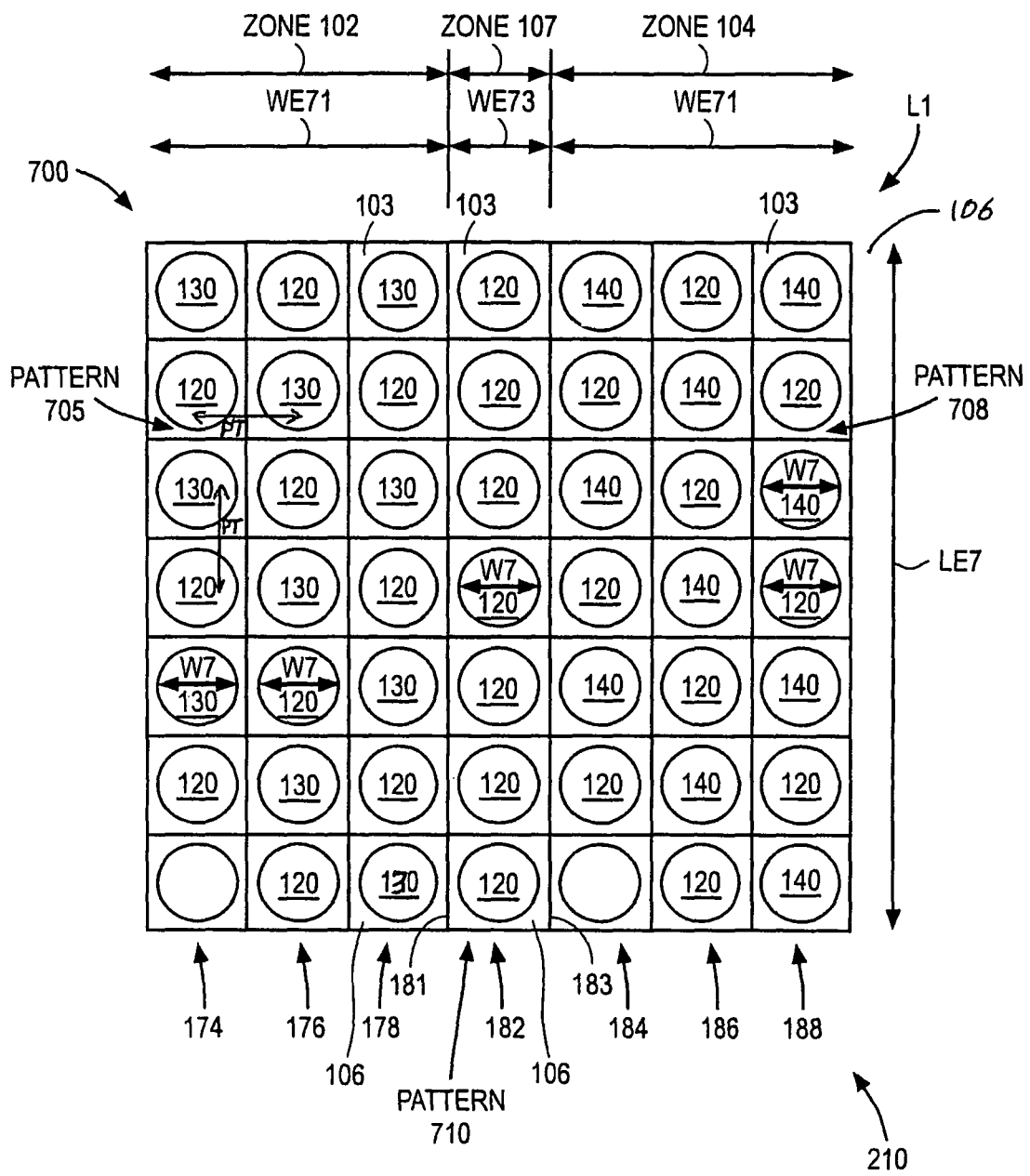
FIG. 7A is a schematic top perspective view of a semiconductor package device upon which at least one integrated circuit (IC) chip (e.g., "die") or other package device may be attached.

FIG. 7A is a schematic top perspective view of a semiconductor package device upon which at least one integrated circuit (IC) chip (e.g., "die") or other package device may be attached. FIG. 7A shows package device 700 having top surface 106, such as a surface of dielectric 103, upon or in which are formed (e.g., disposed) the grounding contacts 120, receive signal contacts 130 and transmit contacts 140. FIG. 7A shows package device 700 having a first interconnect level L1 with upper layer 210 having one row of upper (e.g., top or first) layer ground isolation contacts 120 forming shielding pattern 710 in zone 107; having upper layer receive data signal contacts 130 and additional isolation contacts 120 forming a shielding pattern 705 in zone 102; and having upper layer transmit data signal contacts 140 and additional isolation contacts 120 forming a shielding pattern 705 in zone 104. Contacts 120, 130 and 140 are surrounded by dielectric layer 103 such as an electrically non-conductive or insulating material. In some embodiments, device 700 may be a package device, may be used and may include contacts as described for device 100, except device 700 has contact (e.g., shielding) patterns 705, 708 and 710 instead of patterns 105, 108 and 110.

Receive signal contacts 130 and contacts 120 are shown having pattern 705 in zone 102. Pattern 705 may include having receive signal contacts 130 and contacts 120 in first row 174, second row 176, and third row 178. Pattern 705 may include having a 1:1 ratio of the receive signal contacts 130 and contacts 120 in rows 174-178. It may include having non-widthwise (e.g., along WE71) and non-lengthwise offset (e.g., along LE71) offset contacts in zone 102, such as to have the contacts in those zones arranged widthwise adjacent (e.g., along WE71) and lengthwise adjacent to each other (e.g., as shown).

In some cases, shielding pattern 705 includes the following patterns of contacts lengthwise adjacent along length LE1: first row 174 having contacts 130, 120, 130, 120, 130, 120, and no contact (or optionally, contact 130); second row 176 having contacts 120, 130, 120, 130, 120, 130, 120; and third row 178 having contacts 130, 120, 130, 120, 130, 120, and contact 130 (or optionally, no contact).

In some cases, zone 102 may be described as a receive or "RX" signal cluster having alternating receive contacts 130 and isolation contacts 120 formed in a lengthwise and widthwise grid pattern (e.g., with square grids of alternating contacts) of a 3-row deep die-bump pattern 705. In some cases, pattern 705 includes only contacts 130 and contacts 120, but no other contacts (e.g., none of contacts 140). Pattern 705 is shown having 10 vertical data signal interconnect stacks and 10 vertical ground isolation signal interconnect stacks, each with exposed data signal upper contact 130 and 120 that may be formed over or onto a data signal via contact and a ground signal vial contact, respectively, of level L1. It can be appreciated that there may be more or fewer of stacks and contacts 130 and 120. In some cases there may be 20 stacks and contacts 130; and 20 stacks and contacts 120 in pattern 705. In some cases there may be 8, 10, 12, 16, 32 or 64 stacks and contacts 130; and 4, 5, 6, 8, 16 or 32 stacks and contacts 120 in pattern 705.

Next, along the direction of width WE73, row 182 includes pattern 710 having contacts 120 along length LE71. Pattern 710 is discussed further below with respect to zones 102 and 104.

Next, along the direction of width WE71, transmit signal contacts 140 and contacts 120 are shown having pattern 708 in zone 104. Pattern 708 may include having transmit signal contacts 140 and contacts 120 in fifth row 184, sixth row 186 and seventh row 188. Pattern 708 may include having a 1:1 ratio of the transmit signal contacts 140 and contacts 120 in rows 184-178. Pattern 708 include having non-widthwise (e.g., along WE71) and non-lengthwise offset (e.g., along LE71) offset contacts in zone 104, such as to have the contacts in those zones arranged widthwise adjacent (e.g., along WE71) and lengthwise adjacent to each other (e.g., as shown).

In some cases, shielding pattern 708 includes the following patterns of contacts lengthwise adjacent along length LE1: fifth 184 having contacts 140, 120, 140, 120, 140, 120, and no contact (or optionally, contact 140); sixth row 186 having contacts 120, 140, 120, 140, 120, 140, 120; and seventh row 188 having contacts 140, 120, 140, 120, 140, 120, and contact 140 (or optionally, no contact).

In some cases, zone 104 may be described as a transmit or "TX" signal cluster having alternating receive contacts 140 and isolation contacts 120 formed in a lengthwise and widthwise grid pattern (e.g., with square grids of alternating contacts) of a 3-row deep die-bump pattern 708. In some cases, pattern 708 includes only contacts 140 and contacts 120, but no other contacts (e.g., none of contacts 130). Pattern 708 is shown having 10 vertical data signal interconnect stacks and 10 vertical ground isolation signal interconnect stacks, each with exposed data signal upper contact 140 and 120 that may be formed over or onto a data signal via contact and a ground signal vial contact, respectively, of level L1. It can be appreciated that there may be more or fewer of stacks and contacts 140 and 120. In some cases there may be 20 stacks and contacts 140; and 20 stacks and contacts 120 in pattern 708. In some cases there may be 8, 10, 12, 16, 32 or 64 stacks and contacts 140; and 4, 5, 6, 8, 16 or 32 stacks and contacts 120 in pattern 705.

Ground signal contacts 120 are shown having pattern 710 in zone 107. Zone 107 has width WE73 and length LE71. Pattern 710 may include having ground signal contacts 120 in fourth row 182 in zone 107. In some cases, zone 107 may be described as a ground signal cluster formed in a vertically offset 1-row deep die-bump pattern 710. In some cases, pattern 710 includes only contacts 120, but no other contacts (e.g., none of contacts 130 or 140).

In some cases, as shown, pattern 710 may include having one of contacts 120 of a first horizontally adjacent row (one of row 182) located widthwise equidistant directly between and not lengthwise offset (e.g., along LE71), immediately widthwise adjacent contacts of adjacent rows (e.g., of rows 178 and 184).

Pattern 710 may have 7 vertical ground isolation interconnect stacks, each with an ground isolation upper contact 120 that may be formed over or onto a ground isolation via contact of level L1. It can be appreciated that there may be more or fewer than 7 of stacks and contacts 120 in pattern 410. In some cases there may be 14 stacks and contacts 120. In some cases 4, 5, 6, 8, 16 or 32.

Pattern 705 may be described as a three row wide zone of widthwise and lengthwise alternating receive contacts and isolation contacts. Pattern 708 may be described as a three row wide zone of widthwise and lengthwise alternating transmit contacts and isolation contacts. Pattern 710 may be described as a one row wide ground isolation zone 107 located or formed between zone 102 and zone 104. Pattern 710 may have side 181 widthwise adjacent to (e.g., along width WE73) or facing zone 102 and opposite side 183 (e.g., opposite from side 181) widthwise adjacent to (e.g., along width WE73) or facing zone 104. It can be appreciated that although patterns 705 and 708 are shown with the same width and length, they may have different widths and/or lengths.

Patterns 705, 708 and 710 may include having non-widthwise (e.g., along WE71) and non-lengthwise offset (e.g., along LE71) offset contacts in zones 102, 107 and 104, such as to have the contacts in those zones arranged widthwise adjacent (e.g., along WE71) and lengthwise adjacent to each other (e.g., as shown). In some cases, each of rows 174-188 may be horizontally (e.g., widthwise) equidistant from each other along the direction of width WE71, and each of the contacts in each row may be vertically (e.g., lengthwise) equidistant from each other along length LE71.

In some cases, instead of pattern 710, device 700 may have a double wide pattern of contacts 120 such as described for zone 109 of FIGS. 1B and 2B.

Package device 700 may represent any of patch 804 or interposer 806. Device 700 may be part of an interposer or package device upon which an electro-optical connector will be physically attached (e.g., directly mounted, such as using solder bumps.

Figure 7B:
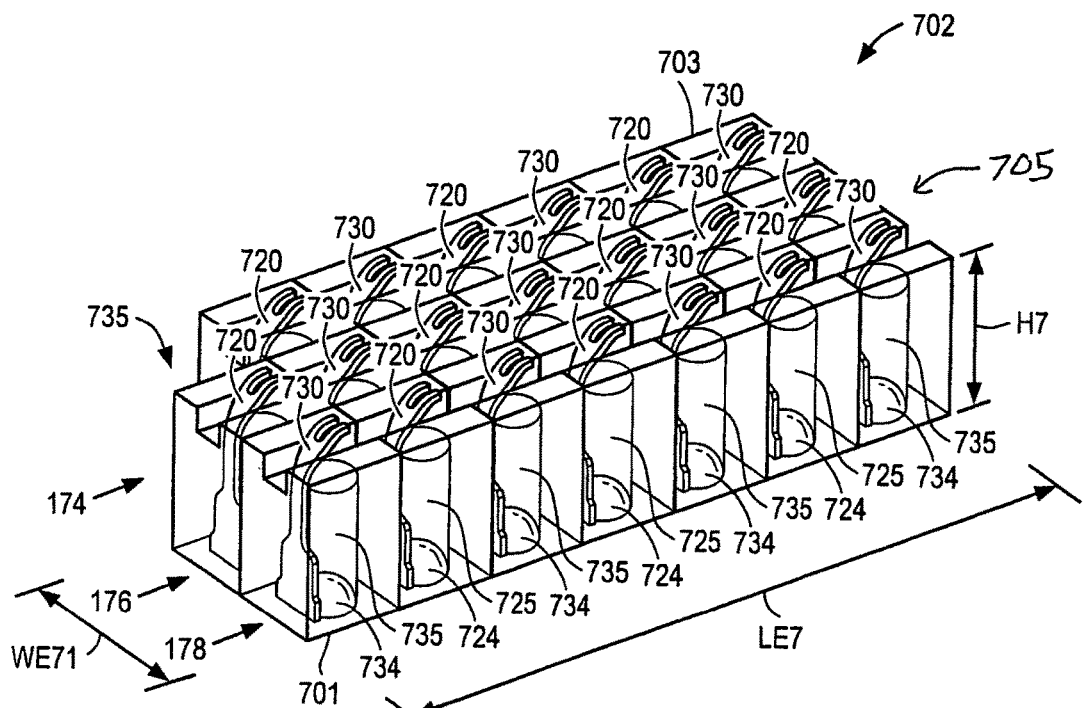
FIG. 7B is a schematic three dimensional cross-sectional perspective view of an electro-optical (EO) connector upon which at least one package device may be mounted.

FIG. 7B is a schematic three dimensional cross-sectional perspective view of an electro-optical (EO) connector 702 upon which at least one package device may be mounted (e.g., physically attached to a top surface of). In some cases, an integrated circuit (IC) chip (e.g., "die") or electro-optical (EO) module or device (e.g., EU module 908) may be mounted (e.g., physically attached to a top surface of) the package device (e.g., package 910 of FIG. 9) that is mounted on connector 702. In some cases, connector 702 may be mounted on (e.g., physically attached to a top surface of) another package device (e.g., interposer 806).

FIG. 7B shows connector 702 having width WE71, length LE7, and height H7. It shows connector 702 having three alternating lengthwise rows 174, 176 and 178, each having alternating ground isolation contact pins 720 and receive data signal contact pins 730 (e.g., forming shielding pattern 705 in zone 102). Each pin (e.g., pin 720 or 730) is within a housing (e.g., see housing 701, such as representing a connector unit or cell) of dielectric material 703 (e.g., such as material 103 shaped as a housing as shown) and is physically attached to or mounted onto a solder bump (e.g., 724 or 734). The pin and solder bump may be disposed within an open space (e.g., cylindrical opening 725 or 735) formed in the dielectric material.

It shows housings (e.g., see housing 701) having solder bumps 734 at the bottom of open spaces 735 within dielectric 703. Also in open space 735 is flexible contact 730. It shows housings (e.g., see housing 701) having solder bumps 724 at the bottom of open spaces 725 within dielectric 703. Also in open space 725 is flexible contact 720. Similar to contacts 120 and 130 of zones 102 of device 700, contact pins 720 and 730 of connector 702 have pattern 705.

Figure 7C:
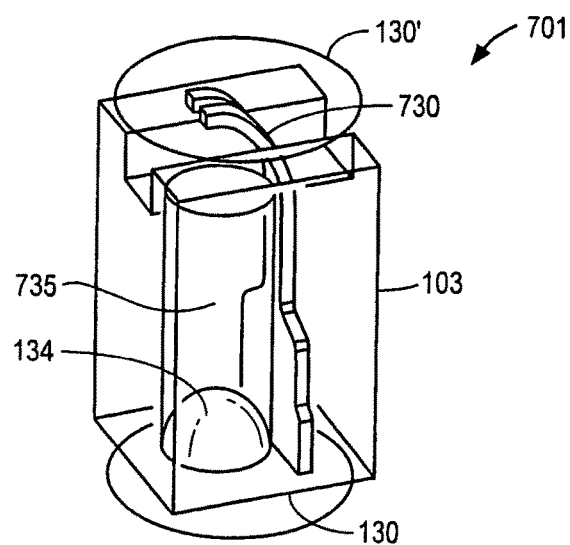
FIG. 7C is a schematic three dimensional cross-sectional perspective view of a housing or cell of the electro-optical (EO) connector of FIG. 7B.

FIG. 7C is a schematic three dimensional cross-sectional perspective view of a housing or cell of the electro-optical (EO) connector of FIG. 7B. FIG. 7C shows housing (e.g., cell) 701 of device 702. Housing 701 (e.g., and connector 702) may be used to or may be physically and electrically connected between two surface contacts 730 of different package devices (e.g., as described herein). Housing 701, is shown for signal pin 730 but may represent a cell for any of pins 720, 730 or 740.

Cell 701 is shown having solder bump 134 physically attached to or formed over contact 130 (e.g., of a top surface) of a package device (e.g., interposer 806). FIG. 7C also shows contact pin 730 physically touching or contacting surface contact 130' (e.g., of a bottom surface) of a package device (e.g., package 910). In some cases, an integrated circuit (IC) chip (e.g., "die") or electro-optical (EO) module or device (e.g., EO module 908) may be mounted (e.g., physically attached to a top surface of) the top surface of the package device (e.g., package 910) that is mounted on connector housing 701 (e.g., and connector 702).

Pins 720 and 730 may be conductor material pins, such as of a metal. They may be formed of a material as noted for contacts 120. They may be flexible contact pins. They may bend within openings 725 and 735. Housing 701 may provide mechanical support for pins 720 and 730, and for bumps 123 and 134 of each housing. Housing 701 may provide electrical separation of pins 720 and 730 (and bumps 123 and 134) of each housing, such as to electrically isolate the pin and bump of that housing from those of adjacent housings.

Although FIGS. 7B-C show connector 702 having rows 174-178 and connector pins 730 (e.g., RX) and 720 for zone 102 of device 700, the concepts shown and described for those figures can be applied to a version of connector 702 having rows 184-188 and connector pins 740 (e.g., TX) and 720 for zone 104 of device 700. Also, although FIGS. 7B-C show connector 702 having rows 174-178 and connector pins 730 (e.g., RX) and 720 for zone 102 of device 700, the concepts shown and described for those figures can be applied to a version of connector 702 having rows 182 and only connector pins 720 (e.g., ground isolation GND) for zone 107 of device 700.

Rows 174, 176 and 178 of connector 702 may be mounted upon rows 174, 176 and 178 of device 700. Connector 702 may be attached to solder bumps formed on contacts 120 and 130 of zone 102, or zone 104 of package device 700. In some cases, one of connector 702 is attached to both zone 102 and zone 104 of package device 700. In addition, in some cases, a part of the connector, such as a single row 178 of ground connector cells is attached to zone 107 of package device 700. In some cases, connector 702 includes (1) a single one of connector 702 as shown attached to contacts 120 and 130 in zone 102 of device 700, (2) a second one of 702 as shown attached to contacts 120 and 140 zone 104 of device 700, and (3) a row of cells such as row 178 as shown but having all and only contact pins 720 attached to contacts 120 zone 107 of device 700.

FIGS. 7A-B show pitch PT as the pitch length between lengthwise adjacent ones of, and as pitch width between widthwise adjacent ones of contacts of device 700 and contact pins of connector 702. Pitch PT may be a distance of between 0.25 and 1.0 millimeters (mm). It can be between 0.4 and 0.6 mm. In some cases, it can be 0.5 mm.

FIGS. 7A-C show connector 702 having width WE71, length LE7, and height H7. In some cases, height H7 is the height between a top surface of a package device upon which connector 702 is mounted (e.g., interposer 806) and the bottom surface of another package device (e.g., package 910) that is mounted on the top of connector 702 and upon which a chip or EP module. Height H7 may be a distance of between 0.5 and 1.5 millimeters (mm). It can be between 0.8 and 1.2 mm. In some cases, it can be 1.0 mm. In some cases, connector 702 is considered a "low profile" connector, such as by having height H7 less than 1.5 mm.

In some cases, width WE71 is the width of 3 rows of contacts or pins (e.g., of zone 102 or 104). Width WE71 may be a distance of between 2.5 and 3.5 millimeters (mm). It can be between 2.8 and 3.2 mm. In some cases, it can be 3.0 mm.

In some cases, width WE73 is the width of 1 row of contacts or pins (e.g., of zone 107). Width WE73 may be a distance of between 0.5 and 1.5 millimeters (mm). It can be between 0.8 and 1.2 mm. In some cases, it can be 1.0 mm.

In some cases, length LE7 is the length of 7 contacts or pins (e.g., of zone 102, 104 and 107). Width LE7 may be a distance of between 6.0 and 8.0 millimeters (mm). It can be between 6.5 and 7.5 mm. In some cases, it can be 7.0 mm.

For FIGS. 7A-C, as note for FIGS. 1A-4, ground shielding attachment structures may include solid conductive material ground isolation shielding attachments 124 such as solder balls or ball grid arrays (BGA); and/or solid conductive material ground isolation shielding surface contacts 120 for the isolation attachments of device 700.

General Benefits of Zone 107 Shielding Between Data Signal Zones/Fields/Clusters In some cases, the solid conductive material ground shielding attachment structures of zone 107 and 109 of device 700 (e.g., surface contacts 120 and/or bumps 124 of zone 107 or pattern 710) provide an electrical ground isolation shield between zones 102 and 104 of level L1 that reduces "die bump field" crosstalk as noted above for device 100 (e.g., for surface contacts 120 and/or bumps 124 of zone 107).

In some cases, the solid conductive material ground isolation shielding attachments 124 of zone 107 of device 700 (e.g., of the ground shielding attachment structures) (such as of zone 107 and pattern 710) provide an electrical ground isolation shield between two fields (e.g., zones) of different types (e.g., RX and TX) of data signal attachment structures (e.g., bumps 134 and 144) formed onto or physically attached to data signal surface contacts (e.g., contacts 130 and 140) of a top level L1 or top layer 210 of device 700 as noted above for device 100 (e.g., for surface contacts 120 and/or bumps 124 of zone 107).

In some cases, the solid conductive material ground shielding attachment structures 120 of zones 107 and 109 (e.g., of the ground shielding attachment structures) (such as of zone 107, zone 109, pattern 410 and pattern 460) provide an electrical ground isolation shield between two fields (e.g., zones) of different types (e.g., RX and TX) of data signal surface contacts (e.g., contacts 130 and 140) of a top level L1 or top layer 210 of package device 700 as noted above for device 100 (e.g., for surface contacts 120 and/or bumps 124 of zone 107).

In some cases, the ground shielding attachment contacts 120 of zone 107 provide electrical ground isolation shielding between zones 102 and 104 of level L1 that reduces "die contact field" crosstalk as noted above for device 100 (e.g., for surface contacts 120 and/or bumps 124 of zone 107).

In some cases, pins 720 are the solid conductive material vertical ground signal contact pins that provide an electrical ground isolation shield between zones 102 and 104 of levels of connector 702 that reduces "die bump field" crosstalk between solid conductive material vertical receive data signal contact pins 730 and solid conductive material vertical transmit data signal contact pins 740 zones 102 and 104 of levels of connector 702. In some cases, they reduce "die bump in-field" crosstalk between all (e.g., each pair of) adjacent ones of same type (e.g., RX or TX) of solid conductive material vertical receive data signal contact pins 730 or solid conductive material vertical transmit data signal contact pins 740 of levels of connector 702 by being between, surrounding or being surrounded by a type of data signal contact pins of a zone (e.g., fields or clusters) 102 or 104 of levels of connector 702. Here "adjacent" may be horizontally adjacent (or widthwise adjacent) with respect to WE71, or lengthwise adjacent with respect to LE71.

In some cases, they reduce "die bump field" crosstalk as described for contacts 130 of zone 102 and contacts 140 of zone 104 for FIGS. 1A-B and 2A-B, but between contact pins 730 of zone 102 and contact pins 740 of zone 104. In some cases, they reduce "die bump in-field" crosstalk as described for contacts 130 of zone 102 or contacts 140 of zone 104 for FIGS. 3A-B and 5A-B, but between contact pins 730 of zone 102 or contact pins 740 of zone 104.

For example, by being conductive material electrically connected to the ground, solid conductive material vertical ground signal contact pins 720 may provide electrically grounded structure that absorbs, or shields electromagnetic crosstalk signals produced by one of solid conductive material vertical receive data signal contact pins 730 (e.g., of zone 102 or beyond side 181) from reaching a (horizontally, lengthwise, or widthwise) adjacent one of contact pins 730 or contact pins 740 (e.g., of zone 102 or zone 104), due to the amount of grounded conductive material, and location of the conductive grounded material adjacent to (e.g., between) that one of contact pins 730 and contact pins 730 or 740.

In some cases, solid conductive material vertical ground signal contact pins 720 reduce electrical crosstalk caused by undesired capacitive, inductive, or conductive coupling of a first signal received or transmitted through (or existing on) one of contact pins 730 effecting or being mirrored in a second signal received or transmitted through (or existing on) one of contact pins 740. Such electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one of contact pins 730 induces current a second data signal in one of contact pins 740. It can be appreciated that the descriptions above are also true for a first signal through interconnects effecting or being mirrored in a second signal received or transmitted through (or existing on) one of contact pins 730.

In some embodiments, any or each of solid conductive material vertical ground signal contact pins 720 reduce electrical crosstalk as noted above (1) without increasing the horizontal distance or spacing between any of (a) adjacent contact pins 730 or of zone 102; or (b) contact pins 740 of zone 104, and/or (2) without increasing the distance or spacing between the any of the levels of device 700.

In some embodiments, contacts 120, 130, and 140; via contacts 122, 132 and 142; bumps 124, 134 and 144; interconnects 520, 530 and 540; plated through holes (PTH) 570; micro-vias (uVia) 580; and pins 720, 730 and 740 are formed of a solid conductive (e.g., pure conductor) material. In some cases, they may each be a height (e.g., a thickness), width and length of solid conductor material.

In some embodiments, plated through holes (PTH) 570 may be a vertical cylinder (e.g., along height of levels 620 and 670) of outer width W51 of solid conductor surrounding a hollow shaft (e.g., of air or a vacuum). In some embodiments, plated through holes micro-vias (uVia) 580 may be a vertical cylinder (e.g., along height of levels 610 and 630; or 660 and 680) of width W52 of solid conductor surrounding a hollow shaft (e.g., of air or a vacuum).

The conductive (e.g., conductor) material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all copper.

In some cases, the formation of contacts 120, 130, and 140; via contacts 122, 132 and 142; bumps 124, 134 and 144; interconnects 520, 530 and 540; plated through holes (PTH) 570; micro-vias (uVia) 580; and pins 720, 730 and 740 of a level or layer (all of which, together, may be described as "conductor material features") may be by processes know for typical chip package manufacturing processes (e.g., known in the industry for a semiconductor package device). In some cases, these conductor material features are formed according to a standard package substrate formation processes and tools such as those that include or use: lamination of dielectric layers such as ajinomoto build up films (ABF), curing, laser or mechanical drilling to form vias in the dielectric films, desmear of seed conductor material, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

In some cases, these conductor material features are formed as a blanket layer or plating of conductor material (e.g., a pure conductive material) that is masked (e.g., ABF and/or dry film resist) and etched to form openings where dielectric material will be deposited, grown or formed (and leave portions of the conductor material where the contacts 120, 130, and 140; via contacts 122, 132 and 142; bumps 124, 134 and 144; interconnects 520, 530 and 540; plated through holes (PTH) 570; micro-vias (uVia) 580; and pins 720, 730 and 740 are now formed). Alternatively, the conductor material may be a layer that is formed or plated in openings existing through a patterned mask, and the mask then removed (e.g., dissolved or burned) to form the contacts 120, 130, and 140; via contacts 122, 132 and 142; bumps 124, 134 and 144; interconnects 520, 530 and 540; plated through holes (PTH) 570; micro-vias (uVia) 580; and pins 720, 730 and 740. Such forming may include or be plating or growing the conductor material such as by plating an electrolytic layer of metal or conductor grown from a seed layer of electroless metal or conductor to form the contacts 120, 130, and 140; via contacts 122, 132 and 142; bumps 124, 134 and 144; interconnects 520, 530 and 540; plated through holes (PTH) 570; micro-vias (uVia) 580; and pins 720, 730 and 740.

In some cases, the contacts 120, 130, and 140; via contacts 122, 132 and 142; bumps 124, 134 and 144; interconnects 520, 530 and 540; plated through holes (PTH) 570; micro-vias (uVia) 580; and pins 720, 730 and 740 may be formed by a process known to form such devices or features of a package or chip package device.

Layers of dielectric 103 (e.g., and material 703) may each be a height (e.g., a thickness), width and length of solid non-conductive material. The dielectric material may be a pure non-conductor (e.g., a pure non-conductive material). Such material may be or include ajinomoto build up films (ABF), cured resin, dry film lamination, porcelain, glass, plastic, or the like as known for such a dielectric. In some cases it is ajinomoto build up films (ABF) and/or dry film lamination.

In some cases, the dielectric may be a blanket layer of dielectric material (e.g., a non-conductive insulator material) that is drilled, or masked and etched to form openings where the contacts 120, 130, and 140; via contacts 122, 132 and 142; bumps 124, 134 and 144; interconnects 520, 530 and 540; plated through holes (PTH) 570; micro-vias (uVia) 580; and pins 720, 730 and 740 are deposited, grown or formed (e.g., the remaining material is "non-conductor material features") by processes know for typical chip package manufacturing processes (e.g., known in the industry for a semiconductor package device). In some cases, these non-conductor material features are formed according to a standard package substrate formation processes and tools such as those that include or use: lamination of dielectric layers such as ajinomoto build up films (ABF), curing, laser or mechanical drilling to form vias in the dielectric films, desmear of seed conductor material, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

Alternatively, the dielectric may be a layer that is formed on a patterned mask, and the mask then removed (e.g., dissolved or burned) to form openings where the contacts 120, 130, and 140; via contacts 122, 132 and 142; bumps 124, 134 and 144; interconnects 520, 530 and 540; plated through holes (PTH) 570; micro-vias (uVia) 580; and pins 720, 730 and 740 are deposited, grown or formed. Such forming of the dielectric layer, or portions may include or be depositing the dielectric material such as by vacuum lamination of ABF, or dry film lamination such as from or on a lower surface of a dielectric material (e.g., that may be the same type of material or a different type of dielectric material) to form the layer or portions. In some cases, the dielectric layer, portions of dielectric structure, or openings in dielectric layer may be formed by a process known to form such dielectric of a package or chip package device.

In some cases, the mask used may be a material formed on a surface (e.g., of a layer); and then having a pattern of the mask removed (e.g., dissolved, developed or burned) to form the openings where the conductor material (or dielectric) are to be formed. In some cases, the mask may be patterned using photolithography. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form the openings. Depending on the mask type, the exposed or unexposed areas are removed. In some cases, the mask goes through a thermal cure of some type after the openings (e.g., pattern) are defined. In some cases, the mask may be formed by a process known to form such a mask of a chip package, or device formed using a chip package device POR.

In some cases, a "package device" may be defined as two physically attached (e.g., the one and other) package devices. In some cases, such data signals (e.g., from an IC chip or other package device) may be received from or transmitted to (or exist on) contacts on the top or bottom surfaces of the package device (e.g., 100, 101, 400, 401, 500, 501 and 700) that will be electrically connected to vertical data signal transmission interconnects of the package device. According to embodiments, the vertical data signal transmission interconnects of may be or include vertical stacks of or vertically adjacent (e.g., vertically aligned) contacts and via contacts of one package device. In some cases the vertical data signal transmission interconnects may also include (1) vertically adjacent surface contacts on opposing surfaces of two package devices and (2) physical attachments (e.g., solder balls) between the vertically adjacent surface contacts of the two package devices. In some cases the vertical data signal transmission interconnects may also include vertical data signal transmission interconnects of the second package device that is attached to the first package device. In these cases, the "package device" may include the vertical data signal transmission interconnects described above, and thus may be or include the vertically adjacent contacts, via contacts, surface contacts, physical attachments, of one or both of the first and second package devices.

In some cases, such data signals may be received from or transmitted through (or exist on) (1) vertical data signal transmission interconnects of a first package device, (2) a physical connection between (e.g., surface contacts on and solder bumps between) the first package and a second package device, and (3) vertical data signal transmission interconnects of the second package device that is attached to the first package device.

In some cases, the first package device (e.g., a patch, socket or package upon which at least one IC chip is mounted) may be mounted on or to one location of the second package device (e.g., interposer), and a third package device (e.g., a patch, socket or package upon which at least one other IC chip is mounted) may be mounted on or to another location of the second package device, so that the second package device can provide data signal transfer between first and third package devices. In some cases, the vertical data signal transmission interconnects may extend through (e.g., and include) solder bumps or ball grid array (BGA) contacts attached between the top and bottom surfaces of the two (e.g., first and second; or second and third) attached package devices.

Figure 8:
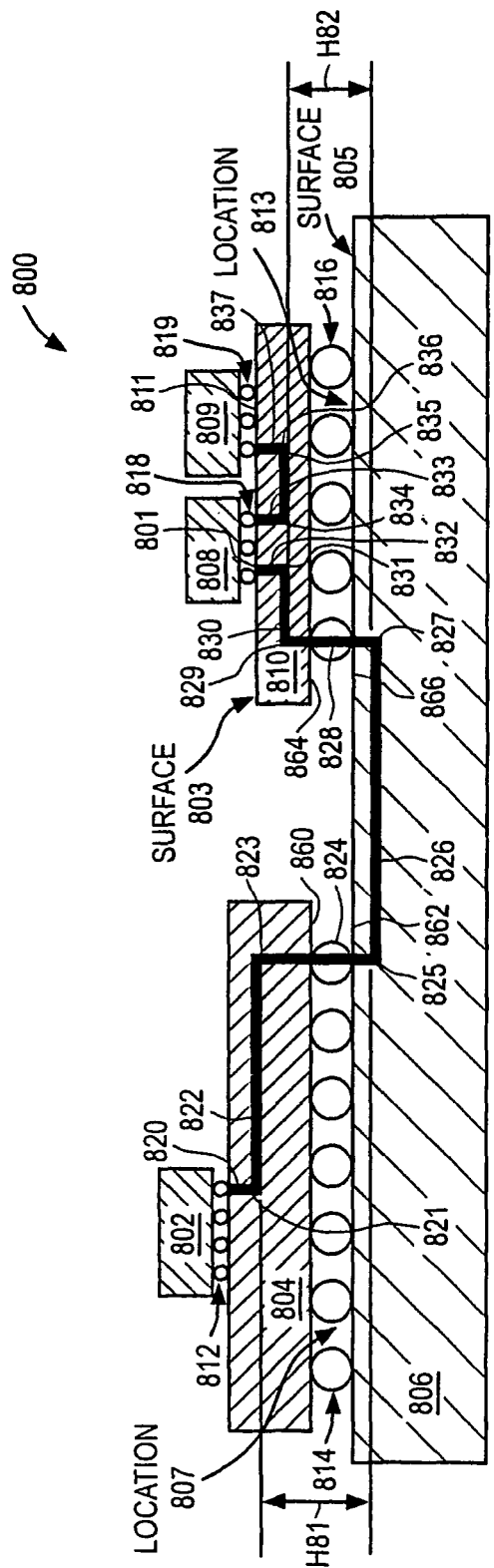
FIG. 8 is schematic cross-sectional side and length views of a computing system, including vertically ground isolated package devices.

FIG. 8 is schematic cross-sectional side and length views of a computing system, including vertically ground isolated package devices. FIG. 8 shows a schematic cross-sectional side view of computing system 800 (e.g., a system routing signals from a computer processor or chip such as chip 802 to another device such as chip 808, or chip 809, including vertically ground isolated package devices, such as patch 804, interposer 806 and package 810. In some cases, system 800 has CPU chip 802 mounted on patch 804, which is mounted on interposer 806 at first location 807. It also shows CLR chip 808 mounted on package 810 at first location 801; and MNH chip 809 mounted on chip 810 at second location 811. Package 810 is mounted on interposer 806 at second location 813.

For example, a bottom surface of chip 802 is mounted on top surface 805 of patch 804 using solder bumps or bump grid array (BGA) 812. A bottom surface of patch 804 is mounted on top surface 805 of interposer 806 at first location 807 using solder bumps or BGA 814. Also, a bottom surface of chip 808 is mounted on top surface 803 of package 810 at first location 801 using solder bumps or BGA 818. A bottom surface of chip 809 is mounted on surface 803 of package 810 at location 811 using solder bumps or BGA 819. A bottom surface of package 810 is mounted on surface 805 of interposer 806 at second location 813 using solder bumps or BGA 816.

In some cases, device 804, 806 or 810 may represent (e.g., a vertically ground isolated package device version of) a substrate package (e.g., 100, 101, 400, 401, 500 and 501), an interposer, a printed circuit board (PCB), a PCB an interposer, a "package", a package device, a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices).

In some cases, chip 802, chip 808 and chip 809 may each represent an integrated circuit (IC) chip or "die" such as a computer processing unit (CPU), microprocessor, coprocessor, graphics processor, memory chip, modem chip, or other microelectronic chip device. In some cases, chip 802 is an integrated circuit (IC) chip computer processing unit (CPU), microprocessor, or coprocessor. In some cases, chip 808 is an integrated circuit (IC) chip that is a coprocessor, graphics processor, memory chip, fabric controller chip, network interface chip, switch chip, accelerator chip, field programmable gate array (FPGA) chip, or application-specific integrated circuit (ASIC) chip device. In some cases, chip 809 is an integrated circuit (IC) chip coprocessor, graphics processor, memory chip, modem chip, communication output signal chip device, fabric controller chip, network interface chip, switch chip, accelerator chip, field programmable gate array (FPGA) chip, or application-specific integrated circuit (ASIC) chip.

FIG. 8 also shows patch vertical "signal" (e.g., here, "signal" including data signal RX and TX lines or traces; power signal lines or traces; and ground signal lines or traces) transmission lines 820 originating in chip 802 and extending vertically downward through bumps 812 and into vertical levels of patch 804. In some case, lines 820 may originate at (e.g., include signal and ground contacts on) the bottom surface of chip 802, extend downward through bumps 812 (e.g., include some of bumps 812), extend downward through (e.g., include signal and ground contacts on) a top surface of patch 804, and extend downward to levels Lj-Ll (with the letter "l" not the number "1") of patch 804 at first horizontal location 821 of patch 804 (e.g., include vertical signal and ground lines within vertical levels Ltop-Ll of patch 804, such as where level Ltop is the topmost or uppermost level of patch 104 and has an exposed top surface 106; and level Ll (with the letter "l" not the number "1") is below level Ltop).

FIG. 8 also shows patch horizontal "signal" transmission lines 822 originating at first horizontal location 821 in levels Lj-Ll of patch 804 and extend horizontally through level Lj-Ll along a length of levels Lj-Ll to second horizontal location 823 in levels Lj-Ll of patch 804. "Signal" lines 822 may be physically attached and/or electrically connected (e.g., with zero electrical resistance) to "signal" lines 820 at location 821 in levels Lj-Ll of patch 804.

Next, FIG. 8 shows vertical "signal" transmission lines 824 originating in patch 804 and extending vertically downward along height H81 through bumps 814 and into vertical levels of interposer 806. Height H81 may be between 0.5 and 2.5 mm. In some cases it may be between 1 and 2 mm. In some cases, it can represent a height equal to between 20 percent and 90 percent of the height of two package devices (e.g., the height of patch 804 plus of interposer 806). In some case, lines 824 may originate at (e.g., from horizontal data signal and ground transmission lines in) levels Lj-Ll at second horizontal location 823 of patch 804, extend downward to surface contacts on bottom surface 860 of patch 804, extend downward through bumps 814 (e.g., include signal and ground contacts on the bottom surface 860 of patch 804 and some of bumps 814 at location 807), extend downward through (e.g., include signal and ground contacts on) top surface 805 of interposer 806, and extend downward to levels Lj-Ll of interposer 806 at first horizontal location 825 of interposer 806 (e.g., include vertical signal lines or interconnects within vertical levels L1-Ll of interposer 806).

In some cases, lines 824 include or are vertical data signal interconnects and vertical ground isolation structures (e.g., as shown in FIGS. 1-6) originating in patch 804 and extending vertically downward to bumps 824, or through bumps 824 and into interposer 806. In some case, bottom surface 860 of patch 804 represents surface 106 (e.g., inverted or upside down to that shown in FIGS. 1-6, such as inverted with respect to height such as height H6 of FIG. 2) of a vertically ground isolated package device version of a substrate package (e.g., device 100, 101, 400, 401, 500 or 501). In some case, top surface 862 or 805 of interposer 806 represents surface 106 of a vertically ground isolated package device version of a substrate package (e.g., device 100, 101, 400, 401, 500 or 501). In some case, bottom surface 860 of patch 804 represents surface 106 (inverted) and top surface 862 of interposer 806 represents surface 106. In some embodiments, lines 824 represent interconnects, PTH, uVia, solder bumps, surface contacts, and levels as described for device 100, 101, 400, 401, 500 or 501.

In some case, levels Lj-L1 at second horizontal location 823 of patch 804 represent levels below level L1 (e.g., such as levels 630 or 680; levels including patterns 505, 508, and 510; or levels including patterns 555, 558, and 560); surface contacts on bottom surface 860 represent contacts 120, 130 and 140 (e.g., such as in patterns 105, 108, and 110; in patterns 105, 108, and 111; in patterns 405, 408, and 410; or in patterns 455, 458, and 460); bumps 814 represent bumps 124, 134 and 144 as described for device 100, 101, 400, 401, 500 or 501.

In some case, bumps 814 represent bumps 124, 134 and 144; surface contacts on top surface 862 (e.g., of surface 805) of interposer 806 represent contacts 120, 130 and 140 (e.g., such as in patterns 105, 108, and 110; in patterns 105, 108, and 111; in patterns 405, 408, and 410; or in patterns 455, 458, and 460); levels Lj-L1 of interposer 806 at first horizontal location 825 of interposer 806 represent levels below level L1 (e.g., such as levels 630 or 680; levels including patterns 505, 508, and 510; or levels including patterns 555, 558, and 560) as described for device 100, 101, 400, 401, 500 or 501.

In some cases (thought not shown), solder bumps 814 are physically attached to contacts 120, 130 and 140 of vertically shielded vertical data signal interconnect interposer 806 at location 807, where interposer 806 has levels L1 and 620 with vertically extending ground isolation signal interconnects, vertically extending adjacent PTHs, and vertically extending data signal interconnects forming different shielding patterns 505, 508 and 510 in zones 102, 104 and 107. "Signal" lines 824 may be physically attached and/or electrically connected (e.g., with zero electrical resistance) to "signal" lines 822 at location 823 in levels Lj-L1 of patch 804.

FIG. 8 also shows interposer horizontal "signal" transmission lines 826 originating at first horizontal location 825 in levels Lj-L1 of interposer 806 and extend horizontally through levels Lj-L1 along a length of levels Lj-L1 to second horizontal location 827 in levels Lj-L1 of interposer 806. "Signal" lines 826 may be physically attached and/or electrically connected (e.g., with zero electrical resistance) to "signal" lines 824 at location 825 in levels Lj-L1 of interposer 806.

Next, FIG. 8 shows vertical "signal" transmission lines 828 originating in interposer 806 and extending vertically upward along height H82 through bumps 816 and into vertical levels of package 810. Height H82 may be between 0.5 and 2.5 mm. In some cases it may be between 1 and 2 mm. In some cases, it can represent a height equal to between 20 percent and 90 percent of the height of two package devices (e.g., the height of package 810 plus of interposer 806). In some case, lines 828 may originate at (e.g., from horizontal data and ground signal transmission lines in) levels Lj-L1 at second horizontal location 827 of interposer 806, extend upward through bumps 816 (e.g., include signal and ground contacts on top surface 805 of interposer 806 and some of bumps 816 at location 813), extend upward through (e.g., include signal and ground contacts on) a bottom surface of package 810, and extend upward to levels Lj-L1 of package 810 at first horizontal location 829 of package 810 (e.g., include vertical signal and ground lines within vertical levels Llast-L1 of package 810).

In some cases, lines 828 include or are vertical data signal interconnects and vertical ground isolation structures (e.g., as shown in FIGS. 1-6) originating in package 810 and extending vertically downward to bumps 816, or through bumps 816 and into interposer 806. In some case, bottom surface 864 of patch 804 represents surface 106 (e.g., inverted or upside down to that shown in FIGS. 1-6, such as inverted with respect to height such as height H6 of FIG. 2) of a vertically ground isolated package device version of a substrate package (e.g., device 100, 101, 400, 401, 500 or 501). In some case, top surface 866 (e.g., of surface 805) of interposer 806 represents surface 106 of a vertically ground isolated package device version of a substrate package (e.g., device 100, 101, 400, 401, 500 or 501). In some case, bottom surface 864 of package 810 represents surface 106 (inverted), and top surface 866 of interposer 806 represents surface 106. In some embodiments, lines 824 represent interconnects, PTH, uVia, solder bumps, surface contacts, and levels as described for device 100, 101, 400, 401, 500 or 501.

In some case, levels Lj-L1 at first horizontal location 830 of package 810 represent levels below level L1 (e.g., such as levels 630 or 680; levels including patterns 505, 508, and 510; or levels including patterns 555, 558, and 560); surface contacts on bottom surface 860 represent contacts 120, 130 and 140 (e.g., such as in patterns 105, 108, and 110; in patterns 105, 108, and 111; in patterns 405, 408, and 410; or in patterns 455, 458, and 460); bumps 814 represent bumps 124, 134 and 144 as described for device 100, 101, 400, 401, 500 or 501.

In some case, bumps 816 represent bumps 124, 134 and 144; contacts on top surface 866 (e.g., of surface 805) of interposer 806 represent contacts 120, 130 and 140 (e.g., such as in patterns 105, 108, and 110; in patterns 105, 108, and 111; in patterns 405, 408, and 410; or in patterns 455, 458, and 460); levels Lj-L1 of interposer 806 at first horizontal location 825 of interposer 806 represent levels below level L1 (e.g., such as levels 630 or 680; levels including patterns 505, 508, and 510; or levels including patterns 555, 558, and 560) as described for device 100, 101, 400, 401, 500 or 501.

In some cases (thought not shown), solder bumps 816 are physically attached to contacts 120, 130 and 140 of vertically shielded vertical data signal interconnect interposer 806 at location 813, where interposer 806 has levels L1 and 620 with vertically extending ground isolation signal interconnects, vertically extending adjacent PTHs, and vertically extending data signal interconnects forming different shielding patterns 555, 558 and 560 in zones 102, 104 and 107. "Signal" lines 828 may be physically attached and/or electrically connected (e.g., with zero electrical resistance) to "signal" lines 826 at location 827 in levels Lj-L1 of interposer 806.

FIG. 8 also shows package device horizontal "signal" transmission lines 830 originating at first horizontal location 825 in levels Lj-L1 of package 810 and extend horizontally through levels Lj-L1 along a length of levels Lj-L1 to second horizontal location 831 in levels Lj-L1 of package 810. "Signal" lines 830 may be physically attached and/or electrically connected (e.g., with zero electrical resistance) to "signal" lines 828 at location 827 in levels Lj-L1 of interposer 806.

Next, FIG. 8 shows vertical "signal" transmission lines 832 originating in package 810 and extending vertically upward through bumps 818 and into chip 808. In some case, lines 832 may originate at (e.g., from horizontal data and ground signal transmission lines in) levels Lj-L1 at second horizontal location 831 of package 810, extend upward through bumps 818 (e.g., include signal and ground contacts on top surface 803 of package 810 and some of bumps 818 at location 801), extend upward through (e.g., include signal and ground contacts on) a bottom surface of chip 808, and extend upward to and terminate at (e.g., include signal and ground contacts on) a bottom surface of chip 808. "Signal" lines 832 may be physically attached and/or electrically connected (e.g., with zero electrical resistance) to "signal" lines 830 at location 831 in levels Lj-L1 of package 810.

In some cases the data transmission signals transmitted and received (or existing on) the data signal transmission lines of lines 820, 822, 824, 828, 830 and 832 originate at (e.g., are generate or are provided by) chip 802 and chip 808. In some cases, these data signal transmission signals may be generated by active circuits, transistors, transmitter circuitry or other components of or attached to chip 802 and 808.

In some cases the ground signals transmitted and received (or existing on) the data signal transmission lines of lines 820, 822, 824, 828, 830 and 832 originate at (e.g., are generate or are provided by) patch 804 or interposer 806. In some cases, these data signal transmission signals may be generated by active circuits, transistors, transmitter circuitry or other components of or attached to patch 804 or interposer 806.

FIG. 8 also show vertical "signal" transmission lines 833 originating in chip 808 and extending vertically downward through bumps 818 and into vertical levels of package 810. In some case, lines 833 may originate at (e.g., include signal and ground contacts on) the bottom surface of chip 808, extend downward through bumps 818 (e.g., include some of bumps 818), extend downward through (e.g., include signal and ground contacts on) a top surface of package 810, and extend downward to levels Lj-L1 of package 810 at first horizontal location 834 of package 810 (e.g., include vertical signal and ground lines within vertical levels L1-L1 of package 810).

FIG. 8 also shows package device horizontal "signal" transmission lines 835 originating at third horizontal location 834 in levels Lj-L1 of package 810 and extend horizontally through levels Lj-L1 along a length of levels Lj-L1 to second horizontal location 836 in levels Lj-L1 of package 810. "Signal" lines 835 may be physically attached and/or electrically connected (e.g., with zero electrical resistance) to "signal" lines 833 at location 834 in levels Lj-L1 of package 810.

Next, FIG. 8 shows vertical "signal" transmission lines 837 originating in package 810 and extending vertically upward through bumps 819 and into chip 809. In some case, lines 837 may originate at (e.g., from horizontal data and ground signal transmission lines in) levels Lj-L1 at fourth horizontal location 836 of package 810, extend upward through bumps 819 (e.g., include signal contacts on top surface 803 of package 810 and some of bumps 819 at location 811), extend upward through (e.g., include signal and ground contacts on) a bottom surface of chip 809, and extend upward to and terminate at (e.g., include signal and ground contacts on) a bottom surface of chip 809. "Signal" lines 837 may be physically attached and/or electrically connected (e.g., with zero electrical resistance) to "signal" lines 835 at location 836 in levels Lj-L1 of package 810.

In some cases the data and ground signal transmission signals transmitted and received (or existing on) the data signal transmission lines of lines 833, 835 and 837 originate at (e.g., are generate or are provided by) chip 808 and chip 809. In some cases, these data signal transmission signals may be generated by active circuits, transistors, transmitter circuitry or other components of or attached to chip 808 and 809.

In some cases the ground signals transmitted and received (or existing on) the data signal transmission lines of lines 833, 835 and 837 originate at (e.g., are generate or are provided by) patch 804 or interposer 806. In some cases, these data signal transmission signals may be generated by active circuits, transistors, transmitter circuitry or other components of or attached to patch 804 or interposer 806.

Figure 9:
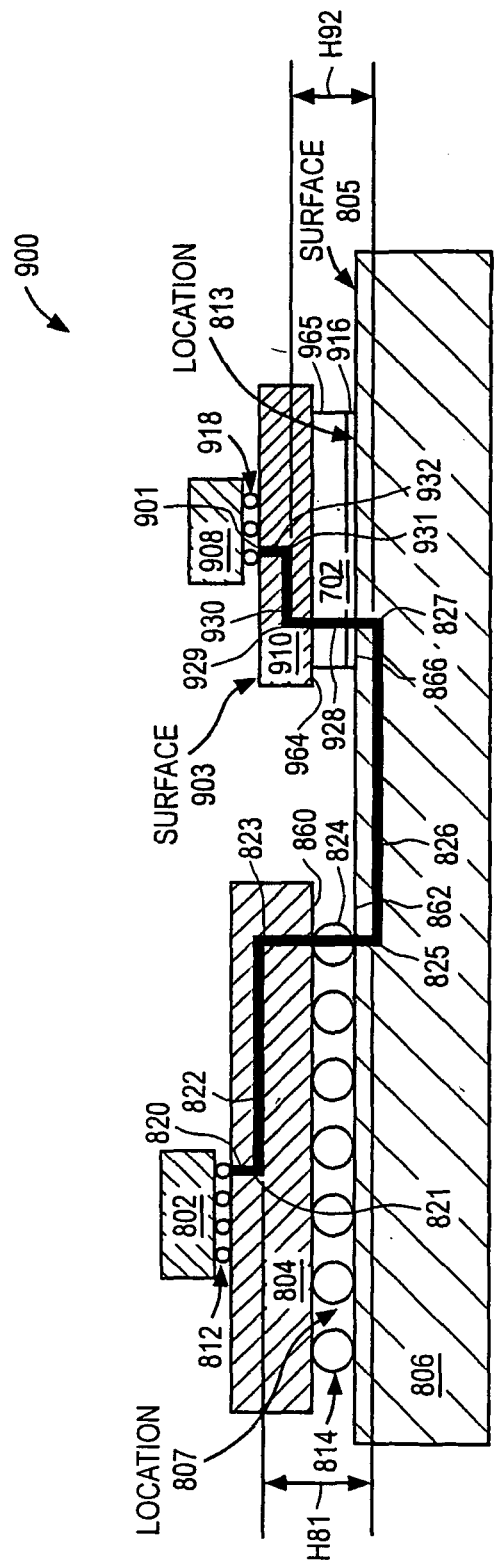
FIG. 9 is schematic cross-sectional side and length views of a computing system, including vertically ground isolated package devices.

FIG. 9 is schematic cross-sectional side and length views of a computing system, including vertically ground isolated package devices. FIG. 9 shows a schematic cross-sectional side view of computing system 900 (e.g., a system routing signals from a computer processor or chip such as chip 802 to another device such as electro optical (EO) module or chip 908 through electro optical (EO) module connector 702 and package 910, including vertically ground isolated package devices, such as patch 804, interposer 806, connector 700 and package 910. In some cases, system 900 has CPU chip 802 mounted on patch 804 (e.g., as noted for FIG. 8), which is mounted on interposer 806 at first location 807 (e.g., as noted for FIG. 8). It also shows electro optical (EO) chip 908 mounted on package 910 at first location 901. Package 910 is mounted on EO module connector 702. EO module connector 702 is mounted on the top of interposer 806 at second location 813 (e.g., such as mounted on device 700). In some cases, EO module 908 converts electronic data communication signals to be sent or for transmission to another device, into optical signals for transmission to the other device. Such optical signals may be sent to an output port which is capable of outputting the optical signals to a connector of a cable which is inserted into the output port.

For example, a bottom surface of chip 908 is mounted on top surface 903 of package 910 at first location 901 using solder bumps or BGA 918. In addition, a bottom surface 964 of package 910 is mounted on a top surface of EO connector 702 using flexible contact pins 965 (e.g., pins 720, 730 and 740) of connector 702 and surface contacts (e.g., see contact 130' as noted for FIG. 7C; the pins contact contacts 120, 130 and 140) of package 910. A bottom surface of connector 702 is mounted on top surface 866 (e.g., of surface 805) of interposer 806 at second location 813 using solder bumps or BGA 916 of interposer 806 (e.g., solder bumps 124, 134 and 144 of device 700 are physically attached to contacts 120, 130 and 140 of connector 702 as noted for FIGS. 7A-C).

In some cases, device 804, 806 or 910 may represent (e.g., a vertically ground isolated package device version of) a substrate package (e.g., 100, 101, 400, 401, 500, 501 and 700), an interposer, a printed circuit board (PCB), a PCB an interposer, a "package", a package device, a socket, an interposer, a motherboard, an EO connector or another substrate upon which integrated circuit (IC) chips or other package devices may be attached (e.g., such as microprocessor, coprocessor, graphics processor, memory chip, modem chip, or other microelectronic chip devices).

FIG. 9 also shows patch vertical and horizontal "signal" (e.g., here, "signal" including data signal RX and TX lines or traces; power signal lines or traces; and ground signal lines or traces) transmission lines 820-826 such as noted for FIG. 8.

Next, FIG. 9 shows vertical "signal" transmission lines 928 originating in interposer 806 and extending vertically upward along height H92 through bumps 916, through connector 702, and through contact pins 965 and into vertical levels of package 910. Height H92 may be between 1.5 and 3.5 mm. In some cases it may be between 2 and 3 mm. In some cases, it can represent a height equal to between 20 percent and 90 percent of the height of two package devices plus the height of connector 702 (e.g., the height of package 910 plus of interposer 806 plus of connector 702). In some case, lines 928 may originate at (e.g., from horizontal data and ground signal transmission lines in) levels Lj-L1 at second horizontal location 827 of interposer 806, extend upward through bumps 916 (e.g., include signal and ground contacts on top surface 866 (of surface 805) of interposer 806 at location 913, extend upward through (e.g., through solder bumps and contact pints of) connector 702, extend upward through pins 965 of connector 702, extend upward through (e.g., include signal and ground contacts on) bottom surface 964 of package 910, and extend upward to levels Lj-L1 of package 910 (e.g., include vertical signal and ground lines within vertical levels Llast-L1 of package 910).

In some cases, lines 928 include or are vertical data signal interconnects and vertical ground isolation structures (e.g., as shown in FIGS. 7A-C) originating in package 910 and extending vertically downward to pins 965 and into interposer 806. In some case, bottom surface 964 of package 910 represents surface 106 (e.g., inverted or upside down to that shown in FIGS. 7A-C, such as inverted with respect to height such as height H7) of a vertically ground isolated package device version of a substrate package (e.g., device 700). In some case, top surface 866 (e.g., of surface 805) of interposer 806 represents surface 106 of a vertically ground isolated package device version of a substrate package (e.g., device 700). In some case, bottom surface 964 of package 910 represents surface 106 (inverted) of device 700, and top surface 866 of interposer 806 represents surface 106 of device 700. In some embodiments, lines 924 represent interconnects, contact pins, solder bumps, surface contacts, and levels as described for device 700 and connector 702.

In some case, levels Lj-L1 at first horizontal location 929 of package 910 represent levels below level L1 (e.g., such as levels including patterns 705, 708, and 710); surface contacts on bottom surface 964 represent contacts 120, 130 and 140 (e.g., such as in patterns 705, 708, and 710); and bumps 916 represent bumps 124, 134 and 144 (e.g., such as in patterns 705, 708, and 710) as described for device 700.

In some case, bumps 916 represent bumps 124, 134 and 144 of connector 702 (e.g., such as in patterns 705, 708, and 710) and pins 965 represent pins 720, 730 and 740 of connector 702 (e.g., such as in patterns 705, 708, and 710).

In some cases (thought not shown), solder bumps 916 are physically attached to contacts 120, 130 and 140 of vertically shielded vertical data signal interconnect interposer 806 at location 813, where interposer 806 has levels L1 and 620 with vertically extending ground isolation signal interconnects, vertically extending adjacent PTHs, and vertically extending data signal interconnects forming different shielding patterns 705, 708 and 710 in zones 102, 104 and 107. "Signal" lines 928 may be physically attached and/or electrically connected (e.g., with zero electrical resistance) to "signal" lines 826 at location 827 in levels Lj-L1 of interposer 806.

FIG. 9 also shows package horizontal "signal" transmission lines 930 originating at first horizontal location 929 in levels Lj-L1 of package 910 and extend horizontally through level Lj-L1 along a length of levels Lj-L1 to second horizontal location 931 in levels Lj-L1 of package 910. "Signal" lines 930 may be physically attached and/or electrically connected (e.g., with zero electrical resistance) to "signal" lines 928 at location 929 in levels Lj-L1 of package 910.

Next, FIG. 9 shows vertical "signal" transmission lines 932 originating in package 910 and extending vertically upward through bumps 918 and into chip 908. In some case, lines 932 may originate at (e.g., from horizontal data and ground signal transmission lines in) levels Lj-L1 at second horizontal location 931 of package 910, extend upward through bumps 918 (e.g., include signal and ground contacts on top surface 903 of package 910 and some of bumps 918 at location 901), extend upward through (e.g., include signal and ground contacts on) a bottom surface of chip 908, and extend upward to and terminate at (e.g., include signal and ground contacts on) a bottom surface of chip 908. "Signal" lines 932 may be physically attached and/or electrically connected (e.g., with zero electrical resistance) to "signal" lines 930 at location 931 in levels Lj-L1 of package 910.

In some cases the data transmission signals transmitted and received (or existing on) the data signal transmission lines of lines 820, 822, 824, 928, 930 and 932 originate at (e.g., are generate or are provided by) chip 802 and chip 908. In some cases, these data signal transmission signals may be generated by active circuits, transistors, transmitter circuitry or other components of or attached to chip 802 and 908.

In some cases the ground signals transmitted and received (or existing on) the data signal transmission lines of lines 820, 822, 824, 928, 930 and 932 originate at (e.g., are generate or are provided by) patch 804 or interposer 806. In some cases, these data signal transmission signals may be generated by active circuits, transistors, transmitter circuitry or other components of or attached to patch 804 or interposer 806.

In some cases the data signal transmission signals of lines 820, 822, 824, 826, 828, 830, 832, 833, 835, 837, 928, 930 and/or 932 are or include data signal transmission signals to an IC chip (e.g., chip 802, 808, 809 or 908), patch 804, interposer 806, package 810, EO connector 702, package 910, EO module 910; or another device attached to thereto. In some cases the data signal transmission signals of lines 820, 822, 824, 826, 828, 830, 832, 833, 835, 837, 928, 930 and/or 932 are or include data signal transmission signals from or generated by chip 802, chip 808, chip 809, chip 908, EO module 908; or another device attached to thereto.

In some cases the data signal transmission signals described herein are high frequency (HF) data signals (e.g., RX and TX data signals). In some cases, the signals are signals to be or for communication to another device that is not part of system 800 or 900; or a system having device 100, device 101, device 400, device 401, device 500, device 501, device 700, chip 802, chip 808, chip 809, patch 804, interposer 806, package 810, EO connector 702, or EO module 910. In this case they may be signal to be or for communication to another device from or by chip 809 or EO module 908, or a wired, wireless or optical connector attached to chip 809 or EO module 908.

In some cases, the signals have a speed of between 4 and 10 Gigabits per second. In some cases, the signals have a speed of between 6 and 8 Gigabits per second. In some cases, the signals have a speed of between 4 and 5 Gigabits per second. In some cases, the signals have a speed of up to 10 Gigabits per second. In some cases, the signals have a speed of between 4 and 12 Giga-Transfers per second (GT/s). In some cases the signals have a speed of between 30 and 50 GT/s, or between 7 and 25 GT/s; and a voltage of between 0.5 and 2.0 volts. In some cases the signal has a speed of between 6 and 15 GT/s. In some cases the signal has a voltage of between 0.4 and 5.0 volts. In some cases it is a different speed and/or voltage level that is appropriate for receiving or transmitting data signals through or within a package device. In some cases, they are in a range between a very low speed transfer such as from 50 Mega-transfers per second (MT/s) to a GT/s transfer level, such as greater than 40 GT/s (or up to between 40 and 50 GT/s).

In some cases, L1 is a top level; layer 210 is a top layer; and surface 106 of device 100, device 101, device 400, or device 500 is top (e.g., exposed) surface 862 of interposer 806. In some cases, L1 is a top level; layer 210 is a top layer; and surface 106 of device 100, device 101, device 401, device 501 or device 700 is top surface 866 of interposer 806.

It can be appreciated that the concepts described above for embodiments of FIGS. 1A-7C shown with level L1 as a top or exposed level, layer 210 as a top or exposed layer and surface 106 as a top or exposed surface can also be applied to embodiments where device 100, device 101, device 400, device 401, device 500, device 501, or device 700 is inverted (e.g., upside down with respect to cross-sectional side view of FIGS. 1A-7C, such as where L1 is a lowest level or bottom level; layer 210 is a lowest layer or layer; and surface 106 is a bottom (e.g., exposed) surface of the device. According to these embodiments, device 100, device 101, device 400, device 401, device 500, device 501, device 700 may be attached to another package device dispose below surface 106 (e.g., using solder bumps 134, 124 and 144). In some of these cases, L1 is a lowest level or bottom level; layer 210 is a lowest layer; and surface 106 of device 100, device 101, device 400, or device 500 is bottom (e.g., exposed) surface 860 of patch 804. In some of these cases, L1 is a lowest level or bottom level; layer 210 is a lowest layer; and surface 106 of device 100, device 101, device 401, or device 501 is bottom surface 864 of package 810.

In some cases, (1) L1 represents a top level; layer 210 represents a top layer; and surface 106 of device 100, device 101, device 400, or device 500 represents top surface 862 of interposer 806; and (2) L1 represents a lowest level or bottom level; layer 210 represents a lowest layer; and surface 106 of device 100, device 101, device 400, or device 500 represents bottom (e.g., exposed) surface 860 of patch 804. In some cases, (1) L1 represents a top level; layer 210 represents a top layer; and surface 106 of device 100, device 101, device 401, device 501 or device 700 represents top surface 866 of interposer 806; and (2) L1 represents a lowest level or bottom level; layer 210 represents a lowest layer; and surface 106 of device 100, device 101, device 401, or device 500 represents bottom (e.g., exposed) surface 864 of package 810. Some embodiments combine the description of the two sentences above.

In some cases, for surface 860 or 862 (e.g., of FIGS. 8 and 9) the diagonal pitch (PD) of adjacent interconnects (e.g., separated in an equally widthwise and lengthwise manner which is the diagonal distance between the center of two diagonally adjacent interconnects) between any of two interconnects (e.g., interconnects 520, 530 and 540 from Level L2 or a level below L1 and extending to level Lj-L1 of a package device) of vertical interconnects of zones 102, 104 and 107 (or 109) is approximately 450 micrometers. In some cases, this pitch PD is between 350 and 550 micrometers (um).

In some cases, the numbers above apply to PD between any of two contacts 120, 130 and 140 in zones 102, 104 and 107 (or 109) of surface 860 or 862. In some cases, the numbers above apply to PD between any of two solder bumps 124, 134 and 144 (e.g., which may be represented by BGA 824) in zones 102, 104 and 107 (or 109) between surface 860 and 862.

In some cases, the corresponding pitch length (e.g., PL) and pitch width (e.g., PW) of the patterns having this PD are calculated on a right triangle basis from this PD, where the right angle is between sides PL and PW and the triangle hypotenuse is 2×PD (e.g., for PD of 450 um; PL and PW may be approximately 636 um if PL=PW).

In some cases, the descriptions above in this paragraph apply to device 100, device 101, device 400 (though note that lengthwise pitch of contacts is actually PL/2) and device 500. In some of these cases, with WE1 is 5×PD+/−40 percent, width WE3 is PD+/−40 percent, and length LE1 is 10×PD+/−40 percent. In some of these cases, with WE1 is 5×PD+/−20 percent, width WE3 is PD+/−20 percent, and length LE1 is 10×PD+/−20 percent. In some of these cases, with WE1 is approximately 2250 um, width WE3 is approximately 450 um, and length LE1 is approximately 4500 um. In some of these cases, with WE1 is between 1350 um and 3150 um; width WE3 is between 300 um and 600 um; and length LE1 is between 3000 um and 6000 um.

In some cases, for surface 864 or 866 (e.g., of FIGS. 8 and 9) the diagonal pitch (PD) of adjacent interconnects (e.g., separated in an equally widthwise and lengthwise manner which is the diagonal distance between the center of two diagonally adjacent interconnects) between any of two interconnects (e.g., interconnects 520, 530 and 540 from Level L2 or a level below L1 and extending to level Lj-L1 of a package device) of vertical interconnects of zones 102, 104 and 107 (or 109) is approximately 650 micrometers. In some cases, this pitch PD is between 550 and 750 micrometers (um).

In some cases, the numbers above apply to PD between any of two contacts 120, 130 and 140 in zones 102, 104 and 107 (or 109) of surface 864 or 866. In some cases, the numbers above apply to PD between any of two solder bumps 124, 134 and 144 (e.g., which may be represented by BGA 824) in zones 102, 104 and 107 (or 109) between surface 864 and 866.

In some cases, the corresponding pitch length (e.g., PL) and pitch width (e.g., PW) of the patterns having this PD are calculated on a right triangle basis from this PD, where the right angle is between sides PL and PW and the triangle hypotenuse is 2×PD (e.g., for PD of 650 um; PL and PW may be approximately 919 um if PL=PW).

In some cases, the descriptions above in this paragraph apply to device 100, device 101, device 401 and device 501. In some of these cases, with WE1 is 5×PD+/−40 percent, width WE3 is PD+/−40 percent, and length LE1 is 10×PD+/−40 percent. In some of these cases, with WE1 is 5×PD+/−20 percent, width WE3 is PD+/−20 percent, and length LE1 is 10×PD+/−20 percent. In some of these cases, with WE1 is approximately 3250 um, width WE3 is approximately 650 um, and length LE1 is approximately 6500 um. In some of these cases, with WE1 is between 1950 um and 4550 um; width WE3 is between 400 um and 900 um; and length LE1 is between 4000 um and 9000 um.

In the cases above, "approximately" may represent a difference of within plus or minus 5 percent of the number stated. In other cases, it may represent a difference of within plus or minus 10 percent of the number stated.

For some embodiments, chips 102, 108 and/or 109 are not included. Some embodiments include only patch 104, interposer 106 and package 110 as described herein. Some embodiments include only patch 504, interposer 506 and package 510 as described herein. Some embodiments include only patch 904, interposer 906 and package 910 as described herein.

For some embodiments, only patch 804 is included (e.g., chip 802 and interposer 806 are not included). For some embodiments, only interposer 806 is included (e.g., patch 804 and package 810 or 910 are not included). For some embodiments, only package 810 or 910 is included (e.g., chips 808, 809 and 909; and interposer 806 are not included). Some embodiments include only one of package device 100, device 101, device 400, device 401, device 500, device 501, or device 700 as described herein. For some embodiments, only two of device 100, device 101, device 400, device 401, device 500, device 501, or device 700 are includes. For some embodiments any 3 of those devices are included. For some embodiments any 4 of those devices are included.

In some cases, descriptions herein for "each" or "each of" of a feature, such as in "each of contacts 120 in zone 107", "each of contacts 120 in zone 102", "each of bumps 124 in zone 107", "each of bumps 124 in zone 102"; the like for contacts 130 or 140 in zones 102 or 104; or the like for bumps 134 or 144 in zones 102 or 104 may be for most of those features or for less than all of those feature in that zone. In some cases they may refer to between 80 and 90 percent of those features existing in that zone.

In some cases, descriptions herein for "each" of a feature, such as in "each of interconnects 520 in zone 107", "each of interconnects 520 in zone 102", "each of adjacent PTH 570" in zone 102, 104 or 107, "each of separate PTH 570" in zone 102 or 104, "each of separate uVia PTH 580" in zone 102 or 104; the like for interconnects 530 or 140 in zones 102 or 104 may be for between most of those features and less than all of those feature in that zone. In some cases they may refer to between 80 and 90 percent of those features existing in that zone.

In some cases, any or all of length LE1 and LE7 may be between 3 and 5 percent less than or greater than that described herein. In some cases, they may be between 5 and 10 percent less than or greater than that described herein.

In some cases, any or all of widths WE1, WE3, WE4, WE71, WE73, W4, W5, W7, W8, W9, W10, W51, and W52 may represent a circular diameter, or the maximum width (maximum distance from one edge to another farthest edge from above) of an oval, a rectangle, a square, a triangle, a rhombus, a trapezoid, or a polygon. In some cases, any or all of widths WE1, WE3, WE4, WE71, WE73, W4, W5, W7, W8, W9, W10, W51, and W52 may be between 3 and 5 percent less than or greater than that described herein. In some cases, they may be between 5 and 10 percent less than or greater than that described herein.

In some cases, any or all of height H5, H6, H7, H81, H82 and H93 may be between 3 and 5 percent less than or greater than that described herein. In some cases, they may be between 5 and 10 percent less than or greater than that described herein.

In some cases, any or all of pitch PL, PH, PW, PT may be between 3 and 5 percent less than or greater than that described herein. In some cases, they may be between 5 and 10 percent less than or greater than that described herein.

In some cases, embodiments of (e.g., packages, systems and processes for forming) a vertical ground isolated package device, such as described for FIGS. 1-9, provide quicker and more accurate data signal transfer between the two IC's attached to a package device by including ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices that reduces bump field signal type cluster-to-cluster crosstalk, reduces bump field in-cluster signal type crosstalk, reduces vertical "signal" line signal type cluster-to-cluster crosstalk, reduces vertical "signal" line in-cluster signal type crosstalk, The ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices (e.g., of the top interconnect level, and other vertical levels) may be formed with or connected to upper grounding contacts to reduce bump field crosstalk, signal type cluster-to-cluster crosstalk and in-cluster signal type crosstalk in the vertical levels by horizontally surrounding each of the transmit and receive data vertical "signal" lines or interconnects.

In some cases, embodiments of processes for forming a vertical ground isolated package device or embodiments of a vertical ground isolated package device provide a package device having better components for providing stable and clean ground (e.g., from contacts 120), and high frequency transmit (e.g., from contacts 130) and receive (e.g., from contacts 140) data signals between its top surface 106 (or layer 210) and (1) other components attached to the package device, such as at other contacts on the top surface of the package where similar ground webbing structure(s) exist, or (2) other components of lower vertical levels of the package that will be electrically connected to the contacts through via contacts, vertical "signal" lines (or interconnects), or horizontal "signal" lines of the package device. The components may be better due to the addition of the conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices which reduce the crosstalk between the data transfer contacts and vertical "signal" lines or interconnects.

In some cases, embodiments of processes for forming a vertical ground isolated package device, or embodiments of a vertical ground isolated package device provide the benefits embodied in computer system architecture features and interfaces made in high volumes. In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIGS. 8-9). In some cases, embodiments of such processes and devices provide the demanded lower cost high frequency data transfer interconnects solution that is needed across the above segments. These benefits may be due to the addition of the conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices, which reduce crosstalk between the data transfer contacts and vertical "signal" lines or interconnects.

In some cases, embodiments of processes for forming a vertical ground isolated package device or embodiments of a vertical ground isolated package device provide ultra-high frequency data transfer interconnect in a standard package, such as a flip-chip x grid array (FCxGA), where 'x' can be ball, pin, or land, or a flip-chip chip scale package (FCCSP, etc) due to the addition of the conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices which reduce crosstalk between the data transfer contacts and vertical "signal" lines or interconnects.

In addition to this, such processes and devices can provide for direct and local ground and data signal delivery to both chips. In some cases, embodiments of such processes and devices provide communication between two IC chips or board ICs including memory, modem, graphics, electro optical module, and other functionality, directly attached to each other (e.g., see FIGS. 8-9). These processes and devices provide increased input/output (IO) frequency data transfer at lower cost. These provisions and increases may be due to the addition of the conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices which reduce crosstalk between the data transfer contacts and vertical "signal" lines or interconnects.

In some cases, due to the ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices, these package devices are able to provide ultra-high frequency data transfer interconnect (e.g., in the herein described package device) of signals having a speed of between 4 and 10 GT/s. In some cases, the signals have a speed of between 6 and 8 GT/s. In some cases, the signals have a speed of between 4 and 5 GT/s. In some cases, the signals have a speed of up to 10 GT/s. In some cases, the signals have a speed of between 4 and 12 Giga-Transfers per second. In some cases the signals have a speed of between 30 and 50 GT/s, or between 7 and 25 GT/s; and a voltage of between 0.5 and 2.0 volts. In some cases the signal has a speed of between 6 and 15 GT/s. In some cases the signal has a voltage of between 0.4 and 5.0 volts. In some cases it is a different speed and/or voltage level that is appropriate for receiving or transmitting data signals through or within a package device. In some cases, they are in a range between a very low speed transfer such as from 50 mega-transfers per second to a GT/s transfer level, such as greater than 40 GT/s (or up to between 40 and 50 GT/s).

According to embodiments, a vertically ground isolated package device can include (1) ground shielding attachment structures and shadow voiding for data signal contacts of the package device; (2) vertical ground shielding structures and shield fencing of vertical data signal interconnects of the package device; and (3) ground shielding for electro-optical module connector data signal contacts and contact pins of the package device. The (1) ground shielding attachment structures may include patterns of solid conductive material ground isolation shielding attachments such as solder balls or ball grid arrays (BGA) and/or patterns of solid conductive material ground isolation shielding surface contacts for the isolation attachments. The shadow voiding may be an area of ground planes of the package device that surrounds and is larger than the solder bumps on the data signal contacts of the package device. The (2) vertical ground shielding structures may include patterns of solid conductive material vertical ground shield interconnects between the vertical data signal interconnects. The shield fencing of vertical data signal interconnects may include patterns of vertical ground plated through holes (PTH) and patterns of vertical microvias (uVia) that are physically attached to the ground shielding attachment structures. The (3) ground shielding for electro-optical module connector data signal contacts and contact pins may include patterns of solid conductive material ground isolation shielding attachments and contacts. The vertically ground isolated package device electrically isolates and reduces cross talk between the signal contacts, attachment structures and vertical "signal" interconnects (e.g., lines), thus providing higher frequency and more accurate data signal transfer between devices such as integrated circuit (IC) chips attached to one or more of such package devices.

Figure 10:
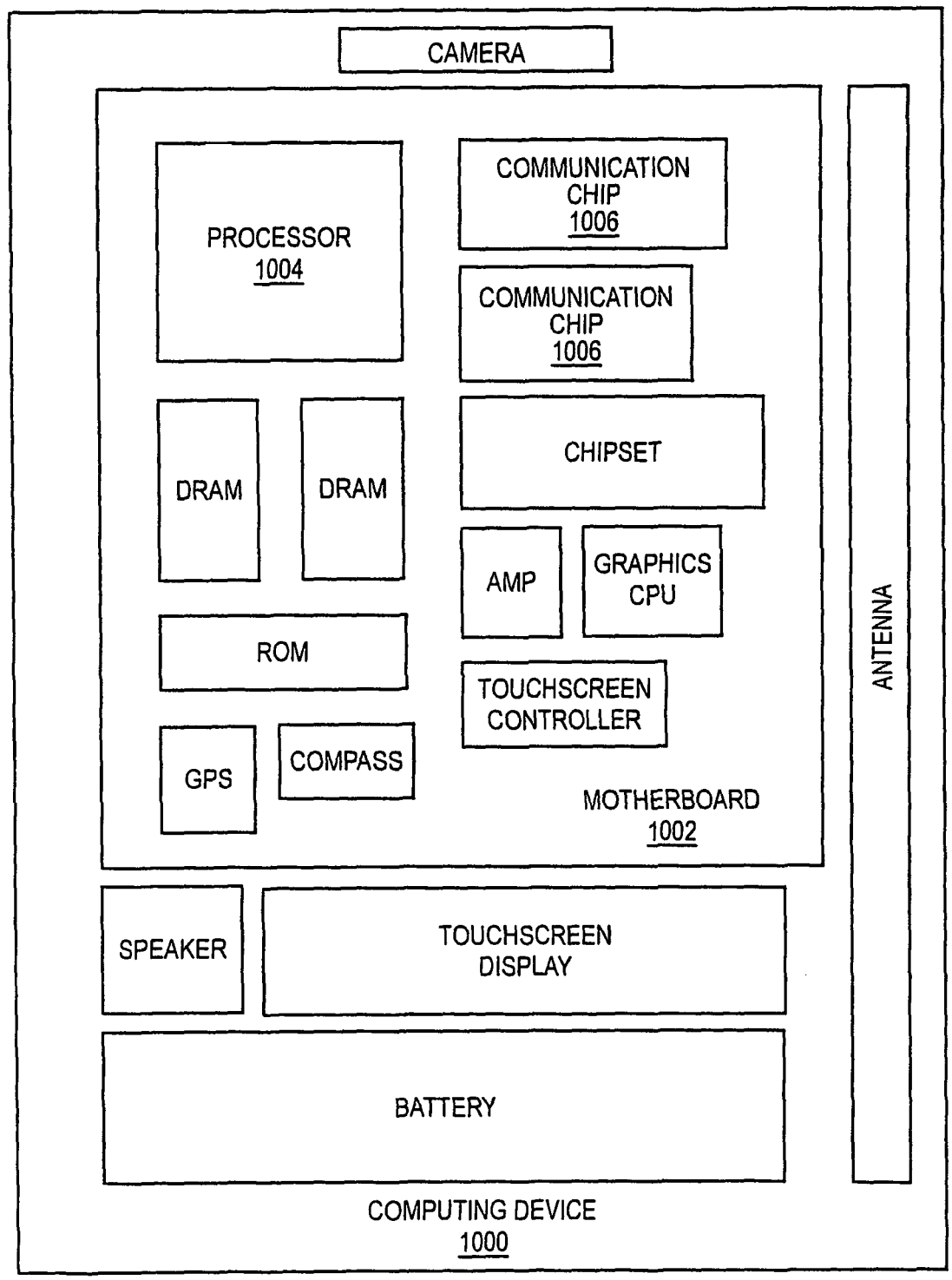
FIG. 10 illustrates a computing device in accordance with one implementation.

FIG. 10 illustrates a computing device in accordance with one implementation. FIG. 10 illustrates computing device 1000 in accordance with one implementation. Computing device 1000 houses board 1002. Board 1002 may include a number of components, including but not limited to processor 1004 and at least one communication chip 1006. Processor 1004 is physically and electrically coupled to board 1002. In some implementations at least one communication chip 1006 is also physically and electrically coupled to board 1002. In further implementations, communication chip 1006 is part of processor 1004.

Depending on its applications, computing device 1000 may include other components that may or may not be physically and electrically coupled to board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1006 enables wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1000 may include a plurality of communication chips' 1006. For instance, first communication chip 1006 may be dedicated to shorter range wireless communications such as Wi-Fi and Bluetooth and second communication chip 1006 may be dedicated to longer range wireless communications such as GPS, EDGE, GPRS, CDMA, WiMAX, LTE, Ev-DO, and others.

Processor 1004 of computing device 1000 includes an integrated circuit die packaged within processor 1004. In some implementations, the integrated circuit die of the processor includes one or more devices, such as transistors or metal interconnects. In some embodiments, the package of the integrated circuit die or processor 1004 includes embodiments of processes for forming a "ground webbing structure package" or embodiments of a "ground webbing structure package" as described herein. The term "processor" may refer to any device or portion of a device that processes electronic data from registers and/or memory to transform that electronic data into other electronic data that may be stored in registers and/or memory.

Communication chip 1006 also includes an integrated circuit die packaged within communication chip 1006. In accordance with another implementation, the integrated circuit die of the communication chip includes one or more devices, such as transistors or metal interconnects. In some embodiments, the package of the integrated circuit die or chip 1006 includes embodiments of processes for forming a "ground webbing structure package" or embodiments of a "ground webbing structure package" as described herein.

In further implementations, another component housed within computing device 1000 may contain an integrated circuit die that includes one or more devices, such as transistors or metal interconnects. In some embodiments, the package of the other integrated circuit die or chip includes embodiments of processes for forming a "ground webbing structure package" or embodiments of a "ground webbing structure package" as described herein.

In various implementations, computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1000 may be any other electronic device that processes data.

EXAMPLES

The following examples pertain to embodiments.

Example 1 is a vertically shielded vertical data signal interconnect package device including a first interconnect level having upper level receive data signal contacts receive contact and ground isolation contacts isolation contact forming a first shielding pattern in a first zone; upper level transmit data signal contacts transmit contact and ground isolation contacts isolation contact forming a second shielding pattern in a second zone; and ground isolation contacts isolation contact forming a third shielding pattern in a third zone, wherein the third zone is located beside and between the first zone and the second zone.

In Example 2, the subject matter can optionally include the device of Example 1, wherein the first pattern includes first and second alternating rows having first and second contact sequences extending lengthwise along a length; wherein the first sequence includes a row of the following contacts: isolation contact, receive contact, receive contact, isolation contact, receive contact, receive contact, isolation contact, receive contact; wherein the second sequence includes a row of the following contacts: receive contact, isolation contact, receive contact, receive contact, isolation contact, receive contact, receive contact, isolation contact; wherein the contacts of the second sequence are disposed one quarter pitch length downwards below the contacts of the first sequence; wherein the second pattern includes third and fourth alternating rows having third and fourth contact sequences extending lengthwise along the length; wherein the third sequence includes a row of the following contacts: transmit contact, isolation contact, transmit contact, transmit contact, isolation contact, transmit contact, transmit contact, isolation contact; wherein the fourth sequence includes a row of the following contacts: isolation contact, transmit contact, transmit contact, isolation contact, transmit contact, transmit contact, isolation contact, transmit contact; and wherein the contacts of the fourth sequence are disposed one quarter pitch length upwards above the contacts of the third sequence; and the third pattern includes each contact of a row of ground isolation contacts located horizontally equidistant directly between and lengthwise offset one quarter pitch length above an immediately widthwise adjacent contact of the first and second shielding patterns.

In Example 3, the subject matter can optionally include the device of Example 1, wherein the first pattern includes (1) ground isolation contacts in a first row, a fourth row, and a fifth row; and (2) receive signal contacts in a second row, a third row, a sixth row, and a seventh row, where the receive contacts or isolation contacts in the second row, fourth row, and sixth row are lengthwise offset above contacts of the first rows, third row, fifth row, and seventh row by one half pitch length; wherein the second pattern includes (1) ground isolation contacts in a thirteenth row, a fourteenth row and a seventeenth row; and (2) receive signal contacts in a tenth row, an eleventh row, a fifteenth row, and a sixteenth row; and the third pattern includes (1) each ground contact of a first row of ground contacts located horizontally equidistant directly between and lengthwise offset above, immediately widthwise adjacent contacts of adjacent rows by one half pitch length; and (2) each ground contact of a second row of ground contacts that is horizontally adjacent to the first row of ground contacts, located horizontally equidistant directly between and lengthwise offset below, immediately widthwise adjacent contacts of adjacent rows by one half pitch length.

In Example 4, the subject matter can optionally include the device of Example 1, wherein the first level ground contacts, receive data signal contacts and the transmit data signal contacts are configured for soldering to another device; and further including solder bumps physically attached to the first level ground contacts, receive data signal contacts and the transmit data signal contacts.

In Example 5, the subject matter can optionally include the device of Example 4, wherein (1) the first level ground contacts of the third pattern are connected to electrical grounding to reduce signal type cluster-to-cluster crosstalk by being between and electrically shielding the first level receive data signal contacts from the first level transmit data signal contacts; and (2) the first level ground contacts of the first and second pattern are connected to electrical grounding to reduce signal within cluster crosstalk by being between and electrically shielding the first level receive data signal contacts from each other and by being between and electrically shielding the first level transmit data signal contacts from each other.

In Example 6, the subject matter can optionally include the device of Example 4, further including a second package device mounted on the vertical data signal interconnect package device; receive and transmit data signal contacts of the second package device attached through the solder bumps to the receive and transmit data signal contacts of the vertical data signal interconnect package device to communicate data at a speed of between 7 and 25 giga-transfers per second.

In Example 7, the subject matter can optionally include the device of Example 1, further including a solid conductive material ground plane located vertically below the isolation shielding surface contacts, the plane having openings vertically below opening horizontally surrounding (1) the first level first type of data signal contacts, and (2) the first level second type of data signal contacts by a width at least as large as a width of the isolation shielding attachments.

In Example 8, the subject matter can optionally include the device of Example 7, wherein the ground plane is connected to electrical grounding to reduce crosstalk between horizontal levels of the device and the openings reduce parasitic capacitance between (1) the first level first type of data signal contacts and the grounding plane, and (2) the first level second type of data signal contacts and the grounding plane.

In Example 9, the subject matter can optionally include the device of Example 1, wherein the first pattern is a three row wide zone of widthwise and lengthwise alternating receive contacts and isolation contacts; wherein the second pattern is a three row wide zone of widthwise and lengthwise alternating transmit contacts and isolation contacts; and wherein the third pattern is a one row wide ground isolation zone located between the first pattern and the second pattern.

Example 10 is a vertically shielded vertical data signal interconnect package device including a plurality of vertical interconnect levels having (1) vertically extending receive data signal interconnects and vertically extending ground isolation signal interconnects forming a first shielding pattern in a first zone, (2) vertically extending transmit data signal interconnects and vertically extending ground isolation signal interconnects forming a second shielding pattern in a second zone, and (3) vertically extending ground isolation signal interconnects forming a third shielding pattern in a third zone located beside and between the first zone and the second zone.

In Example 11, the subject matter can optionally include the device of Example 10, wherein the first pattern includes each of ground isolation signal interconnects including a plurality of adjacent plated through holes (PTHs), (1) surrounded in a first hexagonal shape by between four and six of the receive data signal interconnects; and (2) surrounded in a second hexagonal shape by between two and six of separate micro-vias (uVias) or separate PTHs; wherein the second pattern includes each of ground isolation signal interconnects including a plurality of adjacent PTHs, (1) surrounded in a first hexagonal shape by between four and six of the transmit data signal interconnects; and (2) surrounded in a second hexagonal shape by between two and six of separate uVias or separate PTHs; and the third pattern includes each of interconnects including between one and three adjacent PTHs.

In Example 12, the subject matter can optionally include the device of Example 10, wherein the first pattern includes each of interconnects (1) including two widthwise adjacent PTHs, and (2) located widthwise adjacent and between two of the receive data signal interconnects; wherein the second pattern includes each of interconnects (1) including two widthwise adjacent PTHs, and (2) located widthwise adjacent and between two of the receive data signal interconnects; and the third pattern includes each of interconnects (1) including two widthwise adjacent PTHs, and (2) located widthwise adjacent and between one of the receive data signal interconnects of the first zone and a widthwise adjacent one of the transmit data signal interconnects of the second zone.

In Example 13, the subject matter can optionally include the device of Example 10, wherein (1) the first level ground interconnects of the third pattern are connected to electrical grounding to reduce signal type cluster-to-cluster crosstalk by being between and electrically shielding the first level receive data signal interconnects from the first level transmit data signal interconnects; (2) the first level ground interconnects of the first and second pattern are connected to electrical grounding to reduce signal within cluster crosstalk by being between and electrically shielding the first level receive data signal interconnects from each other and by being between and electrically shielding the first level transmit data signal interconnects from each other; and (3) the first level receive data signal interconnects and first level transmit data signal interconnects are configured to communicate data at a speed of between 7 and 25 giga-transfers per second.

Example 14 is a vertically shielded vertical data signal interconnect package device including a plurality of vertical interconnect levels having (1) vertically extending ground isolation signal interconnects each including a plurality of vertically extending adjacent plated through holes (PTHs), vertically extending separate PTHs, vertically extending separate micro-vias (uVias), and vertically extending receive data signal interconnects forming a first shielding pattern in a first zone, (2) vertically extending ground isolation signal interconnects each including a plurality of vertically extending adjacent PTHs, vertically extending separate PTHs, vertically extending separate uVias, and vertically extending transmit data signal interconnects forming a second shielding pattern in a second zone, and (3) vertically extending ground isolation signal interconnects each including at lease one vertically extending adjacent PTHs forming a third shielding pattern in a third zone located beside and between the first zone and the second zone.

In Example 15, the subject matter can optionally include the device of Example 14, wherein the plurality of vertical interconnect levels include a vertical top level including surface contacts of the ground isolation signal interconnects, surface contacts of the receive data signal interconnects, and surface contacts of the transmit data signal interconnects; wherein the vertical top level is physically attached to a plurality of lower vertically extending micro via upper levels; the plurality of micro via upper levels including micro-via (uVia) levels of the ground isolation signal interconnects, uVia levels of the receive data signal interconnects, uVia levels of the transmit data signal interconnects, uVia levels of the adjacent PTHs, uVia levels of the separate PTHs, and uVia levels of the separate uVias, wherein the micro via upper levels is physically attached to a plurality of lower vertically extending plated through hole (PTH) middle levels; the plurality of PTH middle levels including PTH levels of the ground isolation signal interconnects, PTH levels of the receive data signal interconnects, PTY levels of the transmit data signal interconnects, PTH levels of the adjacent PTHs, and PTH levels of the separate PTHs, but not PTH levels of the separate uVias, wherein the PTH middle levels is physically attached to a plurality of lower vertically extending micro via lower levels; the plurality of micro via lower levels including uVia levels of the ground isolation signal interconnects, uVia levels of the receive data signal interconnects, uVia levels of the transmit data signal interconnects, uVia levels of the adjacent PTHs, uVia levels of the separate PTHs, and uVia levels of the separate uVias;

and wherein the upper, middle and lower level adjacent PTHs, separate PTHs, and separate uVias are physically attached to the ground isolation signal interconnects by horizontally adjacent ground isolation planes of the upper, middle and lower levels.

In Example 16, the subject matter can optionally include the device of Example 14, wherein (1) the first level ground interconnects of the third pattern are connected to electrical grounding to reduce signal type cluster-to-cluster crosstalk by being between and electrically shielding the first level receive data signal interconnects from the first level transmit data signal interconnects; (2) the first level ground interconnects of the first and second pattern are connected to electrical grounding to reduce signal within cluster crosstalk by being between and electrically shielding the first level receive data signal interconnects from each other and by being between and electrically shielding the first level transmit data signal interconnects from each other; and (3) the first level receive data signal interconnects and first level transmit data signal interconnects are configured to communicate data at a speed of between 7 and 25 giga-transfers per second.

Example 17 is a vertically shielded vertical data signal interconnect package device including a plurality of vertical interconnect levels having (1) vertically extending ground isolation signal interconnects each including vertically extending adjacent plated through holes (PTHs), and vertically extending receive data signal interconnects forming a first shielding pattern in a first zone, (2) vertically extending ground isolation signal interconnects each including vertically extending adjacent PTHs, and vertically extending transmit data signal interconnects forming a second shielding pattern in a second zone, and (3) vertically extending ground isolation signal interconnects each including vertically extending adjacent PTHs forming a third shielding pattern in a third zone located beside and between the first zone and the second zone.

In Example 18, the subject matter can optionally include the device of Example 17, wherein the plurality of vertical interconnect levels include a vertical top level including surface contacts of the ground isolation signal interconnects, surface contacts of the receive data signal interconnects, and surface contacts of the transmit data signal interconnects; wherein the vertical top level is physically attached to a plurality of lower vertically extending micro via upper levels; the plurality of micro via upper levels including micro-via (uVia) levels of the ground isolation signal interconnects, uVia levels of the receive data signal interconnects, uVia levels of the transmit data signal interconnects, and uVia levels of the adjacent PTHs, wherein the micro via upper levels is physically attached to a plurality of lower vertically extending plated through hole (PTH) middle levels; the plurality of PTH middle levels including PTH levels of the ground isolation signal interconnects, PTH levels of the receive data signal interconnects, PTH levels of the transmit data signal interconnects, and PTH levels of the adjacent PTHs, wherein the PTH middle levels is physically attached to a plurality of lower vertically extending micro via lower levels; the plurality of micro via lower levels including uVia levels of the ground isolation signal interconnects, uVia levels of the receive data signal interconnects, uVia levels of the transmit data signal interconnects, and uVia levels of the adjacent PTHs; and wherein the upper, middle and lower level adjacent PTHs are physically attached to the ground isolation signal interconnects by horizontally adjacent ground isolation planes of the upper, middle and lower levels.

In Example 19, the subject matter can optionally include the device of Example 17, wherein (1) the first level ground interconnects of the third pattern are connected to electrical grounding to reduce signal type cluster-to-cluster crosstalk by being between and electrically shielding the first level receive data signal interconnects from the first level transmit data signal interconnects; (2) the first level ground interconnects of the first and second pattern are connected to electrical grounding to reduce signal within cluster crosstalk by being between and electrically shielding the first level receive data signal interconnects from each other and by being between and electrically shielding the first level transmit data signal interconnects from each other; and (3) the first level receive data signal interconnects and first level transmit data signal interconnects are configured to communicate data at a speed of between 7 and 25 giga-transfers per second.

In Example 20, the subject matter can optionally include the device of Example 17, wherein the third pattern has a first side widthwise adjacent to the first pattern, and an opposite second side widthwise adjacent to the second pattern.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. For example, although the descriptions above show only zones 102, 104 and 107 (or 109) of package devices (e.g., device 100, 101, 400, 401, 500, 501 and 700), those descriptions can apply to more or different number of zones 102, 104 and 107 (or 109). Embodiments of different of such zones 102, 104 and 107 (or 109) may be such as where any one or two of zones 102, 104, or 107 (or 109) does not exist. Embodiments of more of such zones may be where a first set of zones 102, 104, (and 107 (or 109)) as shown, are connected or electrically coupled to a second set of corresponding zones 102, 104, (and 107 (or 109)) of the same package device (e.g., device 804, 806, 810, 702 or 910), such as through vertical and horizontal "signal" lines. In this case, the first set of zones 102 and 104 may be connected or electrically coupled to a second set of corresponding zones 104 and 102 respectively so that the transmit signal zone 102 of the first set as shown is connected to the receive signal zone 104 of the second set, and vice versa. In this case, the first set of zones may be connected to a first IC chip or device (e.g., at level L1) and the second set of zones may be connected to a second, different IC chip or device (e.g., at level L1) through one or more vertical ground isolated package devices so that the first and second IC chips or devices can exchange data (e.g., using transmit data signals and receive data signals as noted above) using zones 102 and 104 of the one or more vertical ground isolated package devices. This provides a benefit of increased electronic isolation and reduced cross talk as noted herein during such data exchange due to or based on use the one or more vertical ground isolated package devices. In this case, the one or more vertical ground isolated package devices may operate to link the first and second IC chips.

The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. A vertically shielded vertical data signal interconnect package device comprising:
   a first interconnect level having:
      upper level receive data signal contacts receive contact and ground isolation contacts isolation contact forming a first shielding pattern in a first zone;
      upper level transmit data signal contacts transmit contact and ground isolation contacts isolation contact forming a second shielding pattern in a second zone; and
      ground isolation contacts isolation contact forming a third shielding pattern in a third zone, wherein the third zone is located beside and between the first zone and the second zone.

2. The device of claim 1, wherein the first pattern comprises first and second alternating rows having first and second contact sequences extending lengthwise along a length;
   wherein the first sequence comprises a row of the following contacts: isolation contact, receive contact, receive contact, isolation contact, receive contact, receive contact, isolation contact, receive contact;
   wherein the second sequence comprises a row of the following contacts: receive contact, isolation contact, receive contact, receive contact, isolation contact, receive contact, receive contact, isolation contact; and
   wherein the contacts of the second sequence are disposed one quarter pitch length downwards below the contacts of the first sequence;
   wherein the second pattern comprises third and fourth alternating rows having third and fourth contact sequences extending lengthwise along the length;
   wherein the third sequence comprises a row of the following contacts: transmit contact, isolation contact, transmit contact, transmit contact, isolation contact, transmit contact, transmit contact, isolation contact;
   wherein the fourth sequence comprises a row of the following contacts: isolation contact, transmit contact, transmit contact, isolation contact, transmit contact, transmit contact, isolation contact, transmit contact; and
   wherein the contacts of the fourth sequence are disposed one quarter pitch length upwards above the contacts of the third sequence; and
   the third pattern comprises each contact of a row of ground isolation contacts located horizontally equidistant directly between and lengthwise offset one quarter pitch length above an immediately widthwise adjacent contact of the first and second shielding patterns.

3. The device of claim 1, wherein the first pattern comprises (1) ground isolation contacts in a first row, a fourth row, and a fifth row; and (2) receive signal contacts in a second row, a third row, a sixth row, and a seventh row, where the receive contacts or isolation contacts in the second row, fourth row, and sixth row are lengthwise offset above contacts of the first rows, third row, fifth row, and seventh row by one half pitch length;
   wherein the second pattern comprises (1) ground isolation contacts in a thirteenth row, a fourteenth row and a seventeenth row; and (2) receive signal contacts in a tenth row, an eleventh row, a fifteenth row, and a sixteenth row; and
   the third pattern comprises (1) each ground contact of a first row of ground contacts located horizontally equidistant directly between and lengthwise offset above, immediately widthwise adjacent contacts of adjacent rows by one half pitch length; and (2) each ground contact of a second row of ground contacts that is horizontally adjacent to the first row of ground contacts, located horizontally equidistant directly between and lengthwise offset below, immediately widthwise adjacent contacts of adjacent rows by one half pitch length.

4. The device of claim 1, wherein the first level ground contacts, receive data signal contacts and the transmit data signal contacts are configured for soldering to another device; and further comprising solder bumps physically attached to the first level ground contacts, receive data signal contacts and the transmit data signal contacts.

5. The device of claim 4, wherein (1) the first level ground contacts of the third pattern are connected to electrical grounding to reduce signal type cluster-to-cluster crosstalk by being between and electrically shielding the first level receive data signal contacts from the first level transmit data signal contacts; and (2) the first level ground contacts of the first and second pattern are connected to electrical grounding to reduce signal within cluster crosstalk by being between and electrically shielding the first level receive data signal contacts from each other and by being between and electrically shielding the first level transmit data signal contacts from each other.

6. The device of claim 4, further comprising:
   a second package device mounted on the vertical data signal interconnect package device; receive and transmit data signal contacts of the second package device attached through the solder bumps to the receive and transmit data signal contacts of the vertical data signal interconnect package device to communicate data at a speed of between 7 and 25 giga-transfers per second.

7. The device of claim 1, further comprising a solid conductive material ground plane located vertically below the isolation shielding surface contacts, the plane having openings vertically below opening horizontally surrounding (1) the first level first type of data signal contacts, and (2) the first level second type of data signal contacts by a width at least as large as a width of the isolation shielding attachments.

8. The device of claim 7, wherein the ground plane is connected to electrical grounding to reduce crosstalk between horizontal levels of the device and the openings reduce parasitic capacitance between (1) the first level first type of data signal contacts and the grounding plane, and (2) the first level second type of data signal contacts and the grounding plane.

9. The device of claim 1,
   wherein the first pattern is a three row wide zone of widthwise and lengthwise alternating receive contacts and isolation contacts;
   wherein the second pattern is a three row wide zone of widthwise and lengthwise alternating transmit contacts and isolation contacts; and
   wherein the third pattern is a one row wide ground isolation zone located between the first pattern and the second pattern.

10. A vertically shielded vertical data signal interconnect package device comprising:
   a plurality of vertical interconnect levels having (1) vertically extending receive data signal interconnects and vertically extending ground isolation signal interconnects forming a first shielding pattern in a first zone, (2) vertically extending transmit data signal interconnects and vertically extending ground isolation signal interconnects forming a second shielding pattern in a second zone, and (3) vertically extending ground isolation signal interconnects forming a third shielding pattern in a third zone located beside and between the first zone and the second zone.

11. The device of claim 10, wherein the first pattern comprises each of ground isolation signal interconnects including a plurality of adjacent plated through holes (PTHs), (1) surrounded in a first hexagonal shape by between four and six of the receive data signal interconnects; and (2) surrounded in a second hexagonal shape by between two and six of separate micro-vias (uVias) or separate PTHs;
  wherein the second pattern comprises each of ground isolation signal interconnects including a plurality of adjacent PTHs, (1) surrounded in a first hexagonal shape by between four and six of the transmit data signal interconnects; and (2) surrounded in a second hexagonal shape by between two and six of separate uVias or separate PTHs; and
  the third pattern comprises each of interconnects including between one and three adjacent PTHs.

12. The device of claim 10, wherein the first pattern comprises each of interconnects (1) including two widthwise adjacent PTHs, and (2) located widthwise adjacent and between two of the receive data signal interconnects;
  wherein the second pattern comprises each of interconnects (1) including two widthwise adjacent PTHs, and (2) located widthwise adjacent and between two of the receive data signal interconnects; and
  the third pattern comprises each of interconnects (1) including two widthwise adjacent PTHs, and (2) located widthwise adjacent and between one of the receive data signal interconnects of the first zone and a widthwise adjacent one of the transmit data signal interconnects of the second zone.

13. The device of claim 10, wherein (1) the first level ground interconnects of the third pattern are connected to electrical grounding to reduce signal type cluster-to-cluster crosstalk by being between and electrically shielding the first level receive data signal interconnects from the first level transmit data signal interconnects; (2) the first level ground interconnects of the first and second pattern are connected to electrical grounding to reduce signal within cluster crosstalk by being between and electrically shielding the first level receive data signal interconnects from each other and by being between and electrically shielding the first level transmit data signal interconnects from each other; and (3) the first level receive data signal interconnects and first level transmit data signal interconnects are configured to communicate data at a speed of between 7 and 25 giga-transfers per second.

14. A vertically shielded vertical data signal interconnect package device comprising:
  a plurality of vertical interconnect levels having (1) vertically extending ground isolation signal interconnects each including a plurality of vertically extending adjacent plated through holes (PTHs), vertically extending separate PTHs, vertically extending separate micro-vias (uVias), and vertically extending receive data signal interconnects forming a first shielding pattern in a first zone, (2) vertically extending ground isolation signal interconnects each including a plurality of vertically extending adjacent PTHs, vertically extending separate PTHs, vertically extending separate uVias, and vertically extending transmit data signal interconnects forming a second shielding pattern in a second zone, and (3) vertically extending ground isolation signal interconnects each including at lease one vertically extending adjacent PTHs forming a third shielding pattern in a third zone located beside and between the first zone and the second zone.

15. The device of claim 14, wherein the plurality of vertical interconnect levels comprise:
  a vertical top level including surface contacts of the ground isolation signal interconnects, surface contacts of the receive data signal interconnects, and surface contacts of the transmit data signal interconnects;
  wherein the vertical top level is physically attached to a plurality of lower vertically extending micro via upper levels;
  the plurality of micro via upper levels including micro-via (uVia) levels of the ground isolation signal interconnects, uVia levels of the receive data signal interconnects, uVia levels of the transmit data signal interconnects, uVia levels of the adjacent PTHs, uVia levels of the separate PTHs, and uVia levels of the separate uVias,
  wherein the micro via upper levels is physically attached to a plurality of lower vertically extending plated through hole (PTH) middle levels;
  the plurality of PTH middle levels including PTH levels of the ground isolation signal interconnects, PTH levels of the receive data signal interconnects, PTY levels of the transmit data signal interconnects, PTH levels of the adjacent PTHs, and PTH levels of the separate PTHs, but not PTH levels of the separate uVias,
  wherein the PTH middle levels is physically attached to a plurality of lower vertically extending micro via lower levels;
  the plurality of micro via lower levels including uVia levels of the ground isolation signal interconnects, uVia levels of the receive data signal interconnects, uVia levels of the transmit data signal interconnects, uVia levels of the adjacent PTHs, uVia levels of the separate PTHs, and uVia levels of the separate uVias; and
  wherein the upper, middle and lower level adjacent PTHs, separate PTHs; and separate uVias are physically attached to the ground isolation signal interconnects by horizontally adjacent ground isolation planes of the upper, middle and lower levels.

16. The device of claim 14, wherein (1) the first level ground interconnects of the third pattern are connected to electrical grounding to reduce signal type cluster-to-cluster crosstalk by being between and electrically shielding the first level receive data signal interconnects from the first level transmit data signal interconnects; (2) the first level ground interconnects of the first and second pattern are connected to electrical grounding to reduce signal within cluster crosstalk by being between and electrically shielding the first level receive data signal interconnects from each other and by being between and electrically shielding the first level transmit data signal interconnects from each other; and (3) the first level receive data signal interconnects and first level transmit data signal interconnects are configured to communicate data at a speed of between 7 and 25 giga-transfers per second.

17. A vertically shielded vertical data signal interconnect package device comprising:
  a plurality of vertical interconnect levels having (1) vertically extending ground isolation signal interconnects each including vertically extending adjacent plated through holes (PTHs), and vertically extending receive data signal interconnects forming a first shielding pattern in a first zone, (2) vertically extending ground isolation signal interconnects each including vertically extending adjacent PTHs, and vertically extending transmit data signal interconnects forming a second shielding pattern in a second zone, and (3) vertically extending ground isolation signal interconnects each including vertically extending adjacent PTHs forming a third shielding pattern in a third zone located beside and between the first zone and the second zone.

18. The device of claim 17, wherein the plurality of vertical interconnect levels comprise:
a vertical top level including surface contacts of the ground isolation signal interconnects, surface contacts of the receive data signal interconnects, and surface contacts of the transmit data signal interconnects;
wherein the vertical top level is physically attached to a plurality of lower vertically extending micro via upper levels;
the plurality of micro via upper levels including micro-via (uVia) levels of the ground isolation signal interconnects, uVia levels of the receive data signal interconnects, uVia levels of the transmit data signal interconnects, and uVia levels of the adjacent PTHs,
wherein the micro via upper levels is physically attached to a plurality of lower vertically extending plated through hole (PTH) middle levels;
the plurality of PTH middle levels including PTH levels of the ground isolation signal interconnects, PTH levels of the receive data signal interconnects, PTH levels of the transmit data signal interconnects, and PTH levels of the adjacent PTHs,
wherein the PTH middle levels is physically attached to a plurality of lower vertically extending micro via lower levels;
the plurality of micro via lower levels including uVia levels of the ground isolation signal interconnects, uVia levels of the receive data signal interconnects, uVia levels of the transmit data signal interconnects, and uVia levels of the adjacent PTHs; and
wherein the upper, middle and lower level adjacent PTHs are physically attached to the ground isolation signal interconnects by horizontally adjacent ground isolation planes of the upper, middle and lower levels.

19. The device of claim 17, wherein (1) the first level ground interconnects of the third pattern are connected to electrical grounding to reduce signal type cluster-to-cluster crosstalk by being between and electrically shielding the first level receive data signal interconnects from the first level transmit data signal interconnects; (2) the first level ground interconnects of the first and second pattern are connected to electrical grounding to reduce signal within cluster crosstalk by being between and electrically shielding the first level receive data signal interconnects from each other and by being between and electrically shielding the first level transmit data signal interconnects from each other; and (3) the first level receive data signal interconnects and first level transmit data signal interconnects are configured to communicate data at a speed of between 7 and 25 giga-transfers per second.

20. The device of claim 17, wherein the third pattern has a first side widthwise adjacent to the first pattern, and an opposite second side widthwise adjacent to the second pattern.

* * * * *